(12) United States Patent
Inoue et al.

(10) Patent No.: US 7,306,861 B2
(45) Date of Patent: Dec. 11, 2007

(54) SPUTTERING TARGET, SINTERED COMPACT, ELECTRICALLY CONDUCTIVE FILM PRODUCED BY USING THE SAME, AND ORGANIC EL DEVICE AND SUBSTRATE USED FOR THE SAME

(75) Inventors: Kazuyoshi Inoue, Sodegaura (JP);
Hisayuki Kawamura, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 11/454,006

(22) Filed: Jun. 16, 2006

(65) Prior Publication Data

US 2006/0234088 A1 Oct. 19, 2006

Related U.S. Application Data

(62) Division of application No. 10/456,636, filed on Jun. 9, 2003.

(30) Foreign Application Priority Data

| Aug. 2, 2002 | (JP) | ............... 2002-226429 |
| Sep. 27, 2002 | (JP) | ............... 2002-283405 |
| Oct. 16, 2002 | (JP) | ............... 2002-301633 |
| Oct. 23, 2002 | (JP) | ............... 2002-307906 |
| Nov. 7, 2002 | (JP) | ............... 2002-323388 |

(51) Int. Cl.
*B32B 9/00* (2006.01)

(52) U.S. Cl. ............... 428/702; 428/697; 428/699; 428/701; 252/519.51

(58) Field of Classification Search ............... 428/697, 428/699, 701, 702; 252/519.51
See application file for complete search history.

(56) References Cited

U.S. PATENT DOCUMENTS

| 6,249,082 B1 | 6/2001 | Fukuyoshi et al. |
| 6,281,627 B1 * | 8/2001 | Arai et al. ............... 313/506 |

FOREIGN PATENT DOCUMENTS

| EP | 0 733 931 | 9/1996 |
| EP | 1 004 687 | 5/2000 |
| EP | 1 043 606 | 10/2000 |
| EP | 1 081 718 | 3/2001 |
| EP | 1 408 137 | 4/2004 |
| EP | 1 422 312 | 5/2004 |
| EP | 1 422 316 | 5/2004 |
| JP | 09152940 A * | 6/1997 |

* cited by examiner

*Primary Examiner*—John J. Zimmerman
*Assistant Examiner*—Aaron Austin
(74) *Attorney, Agent, or Firm*—Oblon, Spivak, McClelland, Maier & Neustadt, P.C.

(57) ABSTRACT

A sintered article is fabricated which contains one or more of indium oxide, zinc oxide, and tin oxide as a component thereof and contains any one or more types of metal out of hafnium oxide, tantalum oxide, lanthanide oxide, and bismuth oxide. A backing plate is attached to this sintered article to constitute a sputtering target. This sputtering target is used to fabricate a conductive film on a predetermined substrate by sputtering. This conductive film achieves a large work function while maintaining as much transparency as heretofore. This conductive film can be used to achieve an EL device or the like of improved hole injection efficiency.

7 Claims, 19 Drawing Sheets

Fig.1

| Practical example | In/(In+Zn+Sn) | Zn/(In+Zn+Sn) | Sn/(In+Zn+Sn) | Third component element M (whole metal) | Work function of sputtering target material(*) |
|---|---|---|---|---|---|
| 1-1 | 0.93 | 0.17 | 0 | Ce 0.03 | 5.61 |
| 1-2 | 0.93 | 0.17 | 0 | Ce 0.06 | |
| 1-3 | 0.93 | 0.17 | 0 | Sm 0.05 | |
| 1-4 | 0.93 | 0.17 | 0 | Eu 0.10 | |
| 1-5 | 0.93 | 0.17 | 0 | Bi 0.06 | |
| 1-6 | 0.89 | 0.06 | 0.05 | Hf 0.05 | |
| 1-7 | 0.91 | 0 | 0.09 | Ta 0.05 | |
| 1-8 | 0.91 | 0 | 0.09 | Tb 0.05 | |
| 1-9 | 1.00 | 0 | 0 | Ce 0.06 | 5.6 |
| Comparative example | | | | | |
| 1-1 | 0.83 | 0.17 | 0 | | 4.75 |
| 1-2 | 0.91 | 0 | 0.09 | – | 5.22 |
| 1-3 | 0 | 0 | 0 | Ce 1 | 5.41 |

(*) Work function (AC-1: from Riken Keiki), in units of : ev

Fig. 2

| Practical example | Density g/cc | Bulk resistivity mΩ cm | Glass substrate ||||| Film substrate ||||
|---|---|---|---|---|---|---|---|---|---|---|
| | | | Resistivity*1 | Transparency*2 | Work function*3 | Etching property*4 | Resistivity*1 | Transparency*2 | Work function*3 |
| 1-1 | 6.62 | 2.3 | 960 | 89 | 5.72 | ◎ | 980 | 87 | 5.70 |
| 1-2 | 6.71 | 0.87 | 1850 | 90 | 6.03 | ◎ | 1890 | 89 | 5.93 |
| 1-3 | 6.76 | 103 | 750 | 88 | 5.82 | ◎ | 810 | 87 | 5.80 |
| 1-4 | 6.81 | 2.4 | 460 | 89 | 5.78 | ◎ | 610 | 88 | 5.73 |
| 1-5 | 6.93 | 0.82 | 880 | 87 | 5.63 | ◎ | 960 | 87 | 5.61 |
| 1-6 | 6.95 | 0.96 | 670 | 88 | 5.62 | ◎ | 750 | 88 | 5.60 |
| 1-7 | 6.92 | 0.72 | 540 | 89 | 6.20 | ◎ | 540 | 88 | 6.17 |
| 1-8 | 6.91 | 1.05 | 840 | 89 | 5.65 | ◎ | 860 | 88 | 5.61 |
| 1-9 | 6.78 | 2.8 | 1250 | 89 | 5.68 | ◎ | 1450 | 88 | 5.66 |
| Comparative example | | | | | | | | | |
| 1-1 | 6.65 | 2.5 | 380 | 89 | 5.22 | ◎ | 420 | 88 | 5.18 |
| 1-2 | 6.85 | 0.46 | 170 | 90 | 4.92 | × | 680 | 89 | 4.88 |
| 1-3 | 6.90 | NA | NA | 89 | 5.58 | × | NA | 88 | 5.55 |

*1 : Four probe method (Loresta: from Mitsubishi Petrochemical), in unit of :μΩ cm
*2 : Transmittance at 550 nm, in unit of :%
*3 : Work function (AC-1: from Riken Keiki), in unit of :eV
*4 : Evaluation on etching property depends on the presence/absence of residues occurring on each thin film after etching in a mixed acid of phosphoric acid -acetic acid-nitric acid type ◎: no residue at all  ○: little residue  △: a slight amount of residues  ×: a large mount of residues, or unetchable NA: resistivity >MΩ·cm Fig.15
(1) 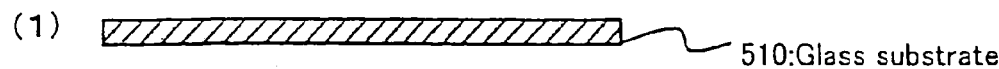 510: Glass substrate
(2) 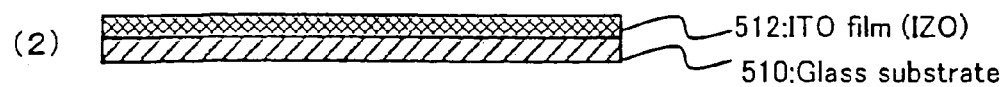 512: ITO film (IZO)
510: Glass substrate
(3) 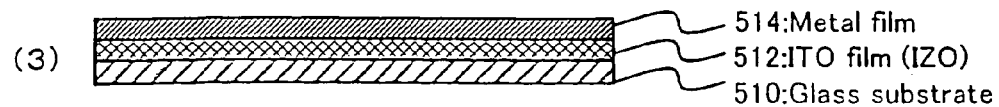 514: Metal film
512: ITO film (IZO)
510: Glass substrate
(4) 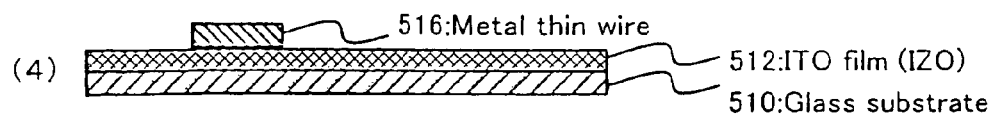 516: Metal thin wire
512: ITO film (IZO)
510: Glass substrate
(5) 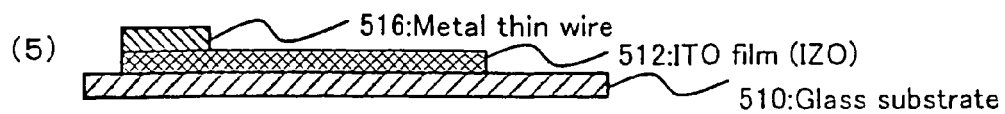 516: Metal thin wire
512: ITO film (IZO)
510: Glass substrate
(6) 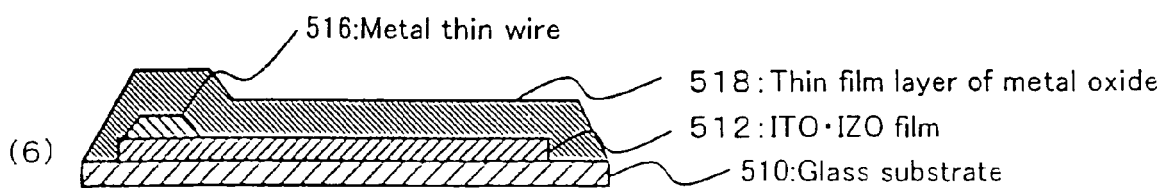 516: Metal thin wire
518: Thin film layer of metal oxide
512: ITO·IZO film
510: Glass substrate

SPUTTERING TARGET, SINTERED COMPACT, ELECTRICALLY CONDUCTIVE FILM PRODUCED BY USING THE SAME, AND ORGANIC EL DEVICE AND SUBSTRATE USED FOR THE SAME

TECHNICAL FIELD

The present invention relates to a transparent conductive film for use in an LCD (Liquid Crystal Display), an organic EL (Electroluminescence) device, and the like, and more particularly to the material thereof. The invention also relates to a sintered article and a sputtering target having the same composition as that of the material. Besides, the invention relates to a sputtering target which is made of this sintered article or the like and is intended for the formation of the transparent conductive film.

Moreover, the invention relates to the foregoing organic EL (electroluminescence) device, a substrate for use in this organic EL device, and a method of fabricating the same. To be more specific, the invention relates to an organic EL device which is suitably applicable to displays, the light sources of printer heads, and the like in consumer and industrial applications, a substrate for use in the organic EL device, and a method of fabricating the same.

The organic EL device may also be referred to as "organic electroluminescence apparatus," "organic electroluminescence device," "organic EL light emitting apparatus," "organic EL display," etc. In the present invention, the substrate for use in the organic EL device may also be referred to as an electrode substrate since it is provided with an electrode.

Furthermore, the invention relates to an organic EL device using such an electrode substrate.

BACKGROUND ART

Conventional Display

Recently, with technological development of LCDs and organic EL displays, there have been provided a number of products that achieve high display performance and high capability of energy saving. Since capable of small-size low-profile fabrication, these LCDs and organic EL displays are widely used as the displays of cellular phones, PDAs (personal Digital Assistants), personal computers, laptop computers (notebook computers), television sets, and the like in particular.

Organic EL devices, components of the organic EL displays, are light emitting devices utilizing organic compounds, of which significant performance improvements have been seen in recent years.

In general, the structures of these organic EL devices are broadly divided, depending on what layer is interposed between the anode and the cathode which are made of transparent electrodes, into the following types:

(1) A single-layer type which has the structure that only a luminescent layer comprising an organic compound is arranged between the anode and the cathode, or symbolically the structure of anode/luminescent layer/cathode;

(2) A double-layer type which has the structure that two layers, a hole transporting layer and a luminescent layer, are formed between the anode and the cathode, or symbolically the structure of anode/hole transporting layer/luminescent layer/cathode;

(3) A triple-layer type which has the triple-layer structure that a hole transporting layer, a luminescent layer, and an electron transporting layer are formed between the anode and the cathode. Symbolically, anode/hole transporting layer/luminescent layer/electron transporting layer/cathode; and (4) A quadruple-layer type which has the quadruple-layer structure that a hole injection layer, a hole transporting layer, a luminescent layer, and an electron transporting layer are formed between the anode and the cathode. Symbolically, anode/hole injection layer/hole transporting layer/luminescent layer/electron transporting layer/cathode.

When any of the device structures is adopted, holes injected from the anode and electrons injected from the cathode reach the luminescent layer through the hole transporting layer or the electron injection layer, and these holes and electrons recombine in this luminescent layer.

Incidentally, devices referable to as EL devices also include organic EL devices of polymer type utilizing polymer compounds and phosphorescence type light emitting devices utilizing phosphorescence, both of which are under research.

Conventional Organic EL Device

The organic EL devices having the structures of sandwiching an organic luminescent layer between (two) electrodes as described above have been put to intensive research, and heretofore subjected to development for such reasons as follows:

(1) Being fully solid devices and thus easy to handle and fabricate;
(2) Capable of self luminescence, thus requiring no light emitting member;
(3) Having excellent visibility, suitable for displays; and
(4) Easy to render full-color.

Nevertheless, there has been a known problem that organic luminescent layers, being organic materials, are typically difficult to transport electrons and holes through and thus prone to deterioration, easily causing a leak current due to secular changes over a long time of use.

On such a problem, various contrivances have been made heretofore.

For example, the patent document 1 to be mentioned later shows an organic EL device in which an energy difference between the work function of the anode and the ionization energy of the hole transporting layer is reduced for the sake of longer life. The patent document 1 describes that in order to achieve such an object, the anode is made of metal oxide materials that have a work function higher than that of indium tin oxide (ITO) and are conductive. For example, RuOx, $MoO_3$, and $V_2O_5$ are mentioned as such conductive metal oxides. Organic EL devices using these metal oxides are disclosed in the patent document 1.

In addition, this patent document 1 proposes anodes of double-layer structures in which thin films made of these conductive metal oxide materials and ITO are laminated for the sake of improved light transmittance (%).

The patent document 2 mentioned below discloses an organic EL device in which metal wires are arranged in connection with the transparent electrodes to reduce the resistances of the transparent electrodes.

The patent document 3 mentioned below discloses an organic EL device in which pieces of metal having a low work function are similarly arranged in connection with the transparent electrodes to reduce the resistances of the transparent electrodes.

The patent document 4 mentioned below discloses an example of an EL device that uses an auxiliary metal film. A special insulative film is arranged on the auxiliary metal film to avoid dielectric breakdown.

The patent document 5 mentioned below discloses an organic EL device which comprises an insulative thin film layer between an electrode and an organic luminescent layer in order to allow long-term use. Specifically, the organic EL device disclosed in this patent document 5 adopts the configuration that an insulative thin film layer made of aluminum nitride, tantalum nitride, or the like is arranged between the anode layer and the organic luminescent layer or between the cathode layer and the organic luminescent layer.

The patent document 6 discloses an organic EL device in which an inorganic material layer containing NiO and at least one additive out of $In_2O_3$, ZnO, $SnO_2$, or B, P, C, N, and O, or an inorganic material layer made of $Ni_{1-x}O$ ($0.05 \leq x \leq 0.5$) is formed between an electrode layer and the organic luminescent layer, with the objective of providing a low-cost organic EL device that is free of m-MTDATA, tetraaryldiamine derivatives, and the like.

The patent document 7 mentioned below discloses the technique of fluoridizing an ITO surface to obtain ITO having a work function of 6.2 eV.

"Patent Document 1"
Japanese Patent Publication No. 2824411 (Japanese Unexamined Patent Application Publication No. Hei 9-63771)

"Patent Document 2"
Japanese Unexamined Patent Application Publication No. Hei 4-82197

"Patent Document 3"
Japanese Unexamined Patent Application Publication No. Hei 5-307997

"Patent Document 4"
Japanese Patent Publication No. Hei 5-76155

"Patent Document 5"
Japanese Unexamined Patent Application Publication No. Hei 8-288069

"Patent Document 6"
Japanese Unexamined Patent Application Publication No. Hei 9-260063

"Patent Document 7"
Japanese Unexamined Patent Application Publication No. 2000-277256

"Patent Document 8"
Japanese Unexamined Patent Application Publication No. Hei 9-63771

DISCLOSURE OF THE INVENTION

As above, organic EL devices, polymer organic EL devices, phosphorescent devices, and the like require that holes be injected from the anode and these holes be further injected to the luminescent layer through the hole transporting layer. For the sake of performing this injection smoothly, it is obvious that an energy barrier between the anode and the hole transporting layer is desirably rendered as small as possible. To reduce this energy barrier, the difference between the work function of the anode material and the ionization potential of the organic compound used in the hole transporting layer must be made smaller.

Various organic compounds have been proposed as hole transporting substances. Of these, aromatic amine compounds, or triphenylamine derivatives and carbazole derivatives in particular, are known as having excellent functions. Then, triphenylamine, a triphenylamine derivative, has an ionization potential of 5.5 to 5.6 electron volts. Polyvinyl carbazole, a carbazole derivative, has an ionization potential of 5.8 electron volts.

Meanwhile, as for the transparent conductive film, indium oxide-tin oxide (ITO: Indium Tin Oxide) is well known as one having excellent transparency and low electric resistance. Then, ITO has a work function of 4.9 electron volts. Consequently, the anode and the hole transporting layer made of such typical materials have a relatively large energy barrier of 0.6 to 0.9 electron volts therebetween.

Under the circumstances, for example, the aforementioned patent document 8 (Japanese Unexamined Patent Application Publication No. Hei 9-63771) has proposed that a thin film made of a metal oxide having a work function higher than that of ITO be used as the anode of an organic luminescent device that has an organic compound layer between its anode and cathode.

Nevertheless, the anode made of this thin film of a metal oxide is typically low in transmittance. For example, terbium oxide has a transmittance of 10%. Vanadium oxide has a transmittance of 20%. To improve such a low transmittance, double-layer configuration has also been proposed in which a ultrathin film of the foregoing metal oxide, no greater than 300 angstroms is laminated on an ITO thin film. Even if this double-layer structure is adopted, however, the transmittance is on the order of 40-60%, which obviously is a rather small value as the transmittance of a display. As a result, the conventional thin film of a metal oxide has been insufficient in transparency.

First Object

The present invention has been achieved in view of the foregoing problems, with the objective of providing a highly-transparent conductive film to make the anode of an organic EL device or the like, the conductive film having a work function higher than heretofore. This conductive film can be used to achieve an EL device and the like of improved hole injection efficiency. This is the first object of the present invention. As will be described later, the aspect of a first group of invention is mainly intended to achieve this first object.

Now, the organic EL device disclosed in the foregoing patent document 1 seems to be still insufficient in the hole mobility and in durability despite the use of such metal oxide materials as RuOx, $MoO_3$, and $V_2O_5$. In addition, the metal oxide materials such as RuOx, $MoO_3$, and $V_2O_5$ have light absorption coefficients of 27000 cm$^{-1}$ or higher, exhibiting high values. This means higher degrees of coloring. Anode layers made of these metal oxide materials thus show as extremely low light transmittances (%) in the visible light range as, for example, approximately 1/9 to 1/5 that of ITO. This leads to the problem that the luminous efficiency is low and the amount of light available to exterior is small for an organic EL device. The presence has also been confirmed of the problem that even with the anodes of double-layer structure in which the thin films made of these metal oxide materials and ITO are laminated, the light transmittance (%) is of the order of approximately 1/2 that of ITO, still a small value not for practical use. In the case of constituting an anode layer of this double-layer structure, there is also the problem that ITO and the metal oxide thin film must be limited to respective predetermined ranges of thicknesses, which means a large constraint on fabrication.

Moreover, the work function can be made greater than that of ITO, whereas the resistance becomes equal to or greater than that of ITO with a practical problem.

Now, in the organic EL device disclosed in the foregoing patent document 2, aluminum nitride, tantalum nitride, or the like is used for the insulative thin film layer. This has produced the problem that a voltage loss (voltage drop) occurs in this portion (insulative thin film layer), resulting in higher driving voltages.

Second Object

Then, the inventors of the present application have made intensive studies on the foregoing problems, and found that the use of certain inorganic compounds in combination with the electrode layer of an organic EL device provides excellent transparency and durability along with excellent luminescence intensity even when a low driving voltage (for example, DC 10V or lower) is applied.

That is, the present invention has the objective of providing an organic EL device which comprises an electrode layer containing certain inorganic compounds, thereby achieving excellent transparency and durability, a low driving voltage, and high luminescence intensity. The present invention further has the objective of providing a method of fabricating an organic EL device by which such an organic EL device can be fabricated with efficiency. This is the second object of the present invention. The aspect of a second group of invention to be described later is mainly intended to achieve this second object.

Third and Fourth Objects

Now, in the method disclosed in the foregoing patent document 7, the ITO surface is fluoridized so that the work function improves to 6.2 eV. Nevertheless, while the work function improves, the surface of ITO becomes an insulative film. As a result, there is the problem that the improved work function is hard to achieve an effect.

The inventors of the present application have made intensive studies on the foregoing problem, and found that a multilayer film composed mainly of certain metal oxide and Ag (or Ag and the like) can be used in combination with the electrode layer of an organic EL device for excellent results. Specifically, it has been found that the foregoing configuration can be adopted to constitute an organic EL device which has excellent transparency and durability and exhibit excellent luminescence intensity even under the application of a low voltage (for example, DC 5 V or lower).

That is, the present invention has the objective of providing: an organic EL device which comprises an electrode layer made of a combination of a certain metal oxide layer and a thin film layer composed mainly of Ag (or Ag and the like), thereby achieving excellent transparency and durability and exhibiting high luminescence intensity even under the application of a low driving voltage; an (electrode) substrate for an organic EL device with which such an organic EL device can be obtained with efficiency; and a method of fabricating such an organic EL device. These are the third and fourth objects of the present invention. The aspects of third and fourth groups of invention to be described later are the inventions mainly intended to achieve the third and fourth objects.

Fifth Object

Now, the organic EL devices disclosed in the foregoing patent document 2 and the foregoing patent document 3 have had the problem that the metal wires for auxiliary use can cause a difference in level which easily disconnects opposed electrodes for a display defect. There has also been the problem that small charges injected from the metal wiring to an organic layer of the organic EL device, such as the hole injection layer, tend to cause so-called crosstalk.

The inorganic EL device disclosed in the foregoing patent document 4 has also had the problem that the thicknesses of the auxiliary metal film and the insulative film cause a difference in level, easily disconnecting opposed electrodes.

Moreover, in the case of ITO disclosed in the foregoing document 7, there has been the problem that pits and projections arise at the electrode ends after etching, so that a leak current flowing between the anode and the cathode can lower the luminescence intensity or preclude luminescence.

The inventors of the present application have made intensive studies on the foregoing problems, and found that a multilayer film which comprises auxiliary wiring of certain metal acid and has a surface layer of 5.6 eV or higher in work function and 10 Ωcm or higher in specific resistance all over can be used in combination with the electrode layer of an organic EL device to provide excellent transparency and durability along with excellent luminescence intensity even under the application of a low voltage (for example, DC 5V or lower).

That is, the present invention has the objective of providing: an organic EL device of high luminescence intensity comprising an electrode layer made of a combination of certain metal auxiliary wiring and a surface thin film layer, thereby achieving a significantly small electrode resistance, excellent transparency and durability, and a low driving voltage without the possibility of disconnection of opposed electrodes or crosstalk due to a leak current; a substrate for an organic EL device with which such an organic EL device can be obtained with efficiency; and a fabrication method for an organic EL device. This is the fifth object of the present invention. The aspect of a fifth group of invention to be described later is mainly intended to achieve this fifth object.

To solve the foregoing problems, the present invention adopts the following means.

First Group of Invention

Initially, description will be given of the aspect of a first group of invention. The aspect of this first group of invention will be detailed mainly in a first embodiment to be seen later.

Invention Pertaining to a Sputtering Target

To solve the foregoing problems, the present invention is a sputtering target containing one or more types of metal selected from indium, zinc, and tin as a component thereof, the sputtering target containing at least one or more types of metal selected from the group consisting of hafnium, tantalum, bismuth, or lanthanide metal as a third component thereof.

Since such metals as hafnium and tantalum are included as constituent elements, it is possible to increase the value of the work function while maintaining transparency as in practical examples to be described later.

The present invention is also characterized in that the third component metal such as hafnium is 1% to 20% by atom in composition ratio. Below 1% by atom, the effect of increasing the value of the work function is small. Above 20% by atom, on the other hand, the conductivity might drop. Incidentally, the third component metal such as hafnium is preferably 2% to 15% by atom in composition ratio. Moreover, the third component metal such as hafnium is yet preferably 3% to 10% by atom in composition ratio.

The present invention is also characterized in that the lanthanide metal comprises at least one or more types of metal selected from the group consisting of cerium, samarium, europium, and terbium.

Invention Pertaining to a Sintered Article

A typical example of the sputtering target is a sintered article of a metal oxide or the like. Hereinafter, the invention pertaining to this sintered article will be described.

Initially, the present invention is a sintered article containing one or more types of metal selected from indium oxide, zinc oxide, and tin oxide as a component thereof, the sintered article containing at least one or more types of metal oxides selected from the group consisting of hafnium oxide, tantalum oxide, bismuth oxide, or a lanthanide metal oxide as a third component thereof.

Since hafnium oxide and the like are included as the third component, it is possible to increase the value of the work function while maintaining transparency as in practical examples to be described later.

The present invention is also characterized in that the third component metal oxide such as hafnium mentioned above is 1% to 20% by atom in composition ratio with respect to the total amount of the sintered article. The present invention is further characterized in that the lanthanide metal oxide comprises at least one or more types of metal selected from the group consisting of cerium oxide, samarium oxide, europium oxide, and terbium oxide.

Moreover, the present invention is a sputtering target comprising: a flatly-worked piece of the sintered article described so far; and a backing plate of metal bonded to the worked sintered article. In a sputtering system equipped with this sputtering target, a thin film having the same composition as that of the sintered article can be fabricated by sputtering.

Invention Pertaining to a Sputtering Target that Contains an Alloy of Indium Oxide and Zinc Oxide Initially, the present invention is a sputtering target comprising an indium oxide alloy containing a hexagonal layered compound of indium oxide and zinc oxide ($In_2O_3(ZnO)m$: where m is an integer of 2 to 20), the sputtering target containing at least one or more types of metal oxides selected from the group consisting of cerium oxide, samarium oxide, europium oxide, terbium oxide, or bismuth oxide as a third component thereof. The third component metal oxide is 1% to 20% by atom in composition ratio with respect to the total amount of the sputtering target.

Without the hexagonal layered compound, the sputtering target itself may drop in conductivity. In the present invention, the hexagonal layered compound is included to avoid a drop in conductivity. The conductivity is preferably 10 mΩ·cm or smaller. The reason is that at or above 10 mΩ·cm, over discharge can occur during sputtering. Moreover, the hexagonal layered compound preferably has a crystal grain diameter of 5 micrometer or smaller. The reason is that greater diameters may contribute the occurrence of so-called nodule.

The sputtering target having such configuration makes it possible to form a transparent conductive film of low resistance and high work function while maintaining transparency.

Moreover, the present invention is a sputtering target characterized in that an expression In/(In+Zn) which means the content of indium oxide in the sputtering target has a value of 0.5 to 0.97.

Here, in the foregoing expression, In is a composition ratio of indium in the sputtering target in terms of percents by atom, and Zn is a composition ratio of zinc in the sputtering target in terms of percents by atom.

When the foregoing expression has a value below 0.5, the resulting transparent conductive film can drop in conductivity. At or above 0.97, on the other hand, etching may become difficult. The foregoing expression preferably has a value of 0.7 to 0.95. In particular, the range of 0.8 and 0.95 is even more preferable.

The present invention is also characterized in that the aforementioned sputtering target containing indium oxide and zinc oxide further contains tin oxide as a component thereof.

The present invention further is a sputtering target comprising an indium oxide alloy containing indium oxide and tin oxide of 0.03% to 0.3% by atom in composition ratio, the sputtering target containing at least one or more types of metal oxides selected from the group consisting of cerium oxide, samarium oxide, europium oxide, terbium oxide, or bismuth oxide as a third component thereof. The third component metal oxide is 1% to 20% by atom in composition ratio with respect to the total amount of the sputtering target.

The reason is that in such configuration, the conductivity might drop (the resistivity rise) when tin oxide falls below 0.03% by atom. On the other hand, when tin oxide exceeds 0.3% by atom, the conductivity may become lower (the resistivity higher) and the etching harder.

Moreover, tin oxide is preferably 0.04% to 0.2% by atom in composition ratio. Furthermore, tin oxide is yet preferably 0.05% to 0.15% by atom in composition ratio.

The present invention also is a sputtering target comprising an indium oxide alloy containing a hexagonal layered compound of indium oxide and zinc oxide ($In_2O_3(ZnO)m$: where m is an integer of 2 to 20), the sputtering target containing at least one or more types of metal oxides selected from the group consisting of cerium oxide, samarium oxide, europium oxide, terbium oxide, or bismuth oxide as a third component thereof. The third component metal oxide is 1% to 20% by atom in composition ratio with respect to the total amount of the sputtering target. Ratios of the respective components fall within the ranges of In/(In+Zn+Sn)=0.5 to 0.95, Zn/(In+Zn+Sn)=0.03 to 0.2, and Sn/(In+Zn+Sn)=0.02 to 0.3 in terms of percents by atom.

Here, in the foregoing expression, In is a composition ratio of indium in the sputtering target in terms of percents by atom, Zn is a composition ratio of zinc in the sputtering target in terms of percents by atom, and Sn is a composition ratio of tin in the sputtering target in terms of percents by atom.

According to such configuration, tin oxide has a composition ratio of 0.3% by atom to 0.02% by atom as in the foregoing expression. The reason is that if tin oxide exceeds 0.3% by atom in composition ratio, the conductivity may become lower and the etching harder. On the other hand, when the composition ratio of tin oxide falls below 0.02% by atom, the addition of tin might not produce any effect.

Naturally, the sputtering target described so far may contain metals other than the foregoing. Note, however, that the substances and amounts of the additives must not hinder increasing the value of the work function, which is an object of the present invention, or cause a drop in this value. It is also required of the substances not to lower the transparency or decrease the conductivity (increase the resistivity).

The substances that can maintain the work function at a high value without lowering the transparency or decreasing the conductivity include gallium oxide, germanium oxide, and antimony oxide.

Invention Pertaining to a Transparent Conductive Film

In the present invention, the conductive film fabricated through sputtering by using the sputtering target described above has the same composition as that of the sputtering target described above, and thus is large in the value of the work function, excellent in transparency, and high in conductivity (low in resistivity).

The present invention is also characterized in that this transparent conductive film has a work function of 5.6 eV or higher. At or above 5.6 eV, the value of the work function is equivalent to that of a hole transporting layer that is made of triphenylamine or the like. This reduces the energy barrier between the electrode and the hole transporting layer. As a result, it is possible to provide an organic EL device and the like which allows an improvement in hole injection efficiency.

Second Group of Invention

Next, the aspect of a second group of invention will be described. The aspect of this second group of invention will be detailed mainly in a second embodiment to be seen later.

Initially, a substrate for an organic EL device of the present invention is one comprising at least an electrode layer and a base member, wherein the electrode layer contains at least one compound selected from the following group A-1 and at least one compound selected from the group B-1.

Here, the group A-1 includes chalcogenides, oxynitrides, or nitrides of Si, Ge, Sn, Pb, Ga, In, Zn, Cd, and Mg. The group B-1 includes chalcogenides, oxynitrides, or nitrides of lanthanides.

In another configuration, the substrate for an organic EL device of the present invention is one comprising at least an electrode layer and a base member, wherein the electrode layer contains at least one compound selected from the group A-2 and at least one compound selected from the group B-2.

Here, the group A-2 includes chalcogenides, oxynitrides, or nitrides of Ge, Sn, Pb, Ga, In, Zn, Cd, and Mg. The group B-2 includes chalcogenides of lanthanides.

The substrate for an organic EL device of the present invention is one characterized in that the electrode layer is an anode layer.

The substrate for an organic EL device of the present invention is one characterized in that the electrode layer is a cathode layer. According to the configurations of these inventions, the combined use of a compound of the group A-1 and a compound of the group B-1 or the combined use of a compound of the group A-2 and a compound of the group B-2 can increase the ionization potential of the electrode layer effectively. Consequently, the substrate for an organic EL device of the present invention described above can be used to constitute an organic EL device which has excellent durability, a low driving voltage, and high luminescence intensity.

The electrode layer configured thus is also characterized by having an excellent etching property. Moreover, since at least one group out of the group A-1, the group A-2, the group B-1, and the group B-2 includes chalcogenides of Si or nitrides of the same in the electrode layer, it is possible to improve the adhesion of the electrode layer to the base member at the time of formation. In addition, the electrode layer can be formed with higher uniformity. Incidentally, when the anode layer is made of these inorganic compounds, the ionization potential is preferably given a value of 5.6 eV or higher in consideration of hole injectability. When the cathode layer is made, on the other hand, the ionization potential is preferably given a value below 4.0 eV in consideration of electron injectability.

The materials mentioned in the present invention can achieve ionization potentials of 5.8 eV or higher, being extremely suitable for the material of the anode.

Moreover, the substrate for an organic EL device of the present invention is one characterized in that the electrode layer has a specific resistance lower than 1 Ω·cm.

When such means is adopted, it is possible to avoid the phenomenon that uneven luminescence occurs in the display screen due to high resistance of the electrode layer.

Consequently, the specific resistance of the electrode layer can thus be limited in value to improve electron and hole injectability, as well as to achieve a further reduction in the driving voltage of the organic EL device. Incidentally, if, in contrast, the constituent material of the electrode layer has a specific resistance above 1 Ω·cm, a double-layer structure is preferably used which includes an electrode layer made of a constituent material having a specific resistance lower than 1 Ω·cm.

Moreover, the substrate for an organic EL device of the present invention is one in which the compound of the group A-1 or A-2 is any of chalcogenides or nitrides of Sn, In, and Zn. These compounds are particularly low in quenching property among the compounds of the group A-1 or A-2, and are capable of constituting an organic EL device having high luminescence intensity.

Moreover, the substrate for an organic EL device of the present invention is one in which the compound of the group B-1 or B-2 is any of oxides of Ce, Nd, Sm, Eu, Tb, and Ho. These compounds can be used in combination to facilitate adjusting the values of the ionization potential and the band gap energy in the electrode layer independently.

Moreover, the substrate for an organic EL device of the present invention is one in which the content of the compound of the group B-1 or B-2 falls within the range of 0.5 and 30 at. % with the total amount of the electrode layer as 100 at. %. Setting the value in such a range can facilitate adjusting the value of the ionization potential in the electrode layer while maintaining high transparency (light transmittance). Besides, the electrode layer configured thus is characterized by having excellent etching properties to acids and the like.

Moreover, the substrate for an organic EL device of the present invention is one in which the electrode layer has a thickness within the range of 1 and 100 nm. Such configuration makes it possible to fabricate an organic EL device which has more excellent durability, a low driving voltage, and high luminescence intensity. In addition, when the thickness of the electrode layer is in such a range, the organic EL device is prevented from becoming excessively thick.

Now, the configuration of the present invention pertaining to an organic EL device will be described.

Initially, an organic EL device of the present invention is one having a structure that at least an anode layer, an organic luminescent layer, and a cathode layer are laminated in succession, wherein the anode layer and cathode layer or either one of the electrode layers contains at least one compound selected from the following group A-1 and at least one compound selected from the following group B-1.

Here, the group A-1 includes chalcogenides, oxynitrides, or nitrides of Si, Ge, Sn, Pb, Ga, In, Zn, Cd, and Mg. The group B-1 includes chalcogenides, oxynitrides, or nitrides of lanthanides.

Another organic EL device of the present invention is one having a structure that at least an anode layer, an organic luminescent layer, and a cathode layer are laminated in succession, wherein the anode layer and cathode layer or either one of the electrode layers contains at least one compound selected from the following group A-2 and at least one inorganic compound selected from the following group B-2.

Here, the group A-2 includes chalcogenides, oxynitrides, or nitrides of Ge, Sn, Pb, Ga, In, Zn, Cd, and Mg. The group B-2 includes chalcogenides of lanthanides.

As above, the combined use of a compound of the group A-1 and a compound of the group B-1 or the combined use of a compound of the group A-2 and a compound of the group B-2 can increase the ionization potential of the electrode layer effectively. It is therefore possible to obtain an organic EL device which has excellent durability, a low driving voltage, and high luminescence intensity. The electrode layer configured thus is also characterized by having an excellent etching property. Moreover, since at least one group out of the group A-1, the group A-2, the group B-1, and the group B-2 includes chalcogenides of Si or nitrides of the same in the electrode layer, it is possible to improve the adhesion of the electrode layer to the base member at the time of formation. In addition, the electrode layer can be formed with higher uniformity.

Incidentally, when the anode layer is made of these compounds, the ionization potential is preferably given a value of 5.6 eV or higher in consideration of hole injectability. When the cathode layer is made, on the other hand, the ionization potential is preferably given a value below 4.0 eV in consideration of electron injectability. The materials mentioned in the present invention can achieve ionization potentials of 5.8 eV or higher, being extremely suitable for the anode material.

Moreover, the organic EL device of the present invention is one in which the anode layer and cathode layer or either one of the electrode layers has a specific resistance lower than 1 Ω·cm. Such configuration makes it possible to prevent the occurrence of uneven luminescence in the display screen due to high resistance of the electrode layer.

Consequently, the specific resistance of the electrode layer can thus be restricted to improve electron and hole injectabilities. A further reduction in the driving voltage of the organic EL device is also possible. Incidentally, if, in contrast, the constituent material of the electrode layer has a specific resistance above 1 Ω·cm, a double-layer structure is preferably used which includes an electrode layer made of a constituent material having a specific resistance lower than 1 Ω·cm.

Moreover, the present invention is the organic EL device in which the compound of the group A-1 or A-2 is any of chalcogenides or nitrides of Sn, In, and Zn. These compounds are particularly low in quenching property among the compounds of the group A-1 or A-2, and thus capable of achieving an organic EL device which has high luminescence intensity.

Moreover, the present invention is the organic EL device in which the compound of the group B-1 or B-2 is an oxide of any substance out of Ce, Nd, Sm, Eu, Tb, and Ho. These compounds can be used in combination to facilitate adjusting the values of the ionization potential and the band gap energy in the electrode layer independently.

Moreover, the present invention is the organic EL device in which the content of the compound of the group B-1 or B-2 falls within the range of 0.5 and 30 at. % with the total amount of the electrode layer as 100 at. %. Setting the value in such a range can further facilitate adjusting the value of the ionization potential in the electrode layer while maintaining high transparency (light transmittance). Besides, the electrode layer configured thus is characterized by having excellent etching properties to acids and the like.

Moreover, the present invention is the organic EL device in which the electrode layer has a thickness within the range of 1 and 100 nm. Such configuration makes it possible to obtain an organic EL device which has more excellent durability, a low driving voltage, and high luminescence intensity. In addition, when the thickness of the electrode layer is in such a range, the organic EL device is prevented from becoming excessively thick.

Now, the organic EL device of the present invention is one in which an inorganic thin film layer containing at least one inorganic compound selected from the foregoing group A-1 and at least one compound selected from the group B-1 or an inorganic thin film layer containing at least one compound selected from the foregoing group A-2 and at least one compound selected from the group B-2 is arranged in both or either between the anode layer and the organic luminescent layer and/or between the cathode layer and the organic luminescent layer.

Such additional arrangement of the inorganic thin film layer can suppress leak current effectively, enhance the efficiency of the organic EL device, and improve the durability.

Incidentally, the inorganic thin film layer, when arranged between the anode layer and the organic luminescent layer, is extremely preferably given a composition different from those of the anode layer and the organic thin film layer. Specifically, when the anode layer is made of a compound comprising a group A-1 compound/a group B-1 compound=70 to 90 at. %/0.5 to 10 at. %, it is preferable that the inorganic thin film layer be made of a compound comprising a group A-1 compound/a group B-1 compound=50 to below 90 at. %/above 10 at. % to 50 at. %. The same holds for the case of using the compounds of the groups A-2 and B-2.

Moreover, the organic EL device of the present invention is one in which the organic luminescent layer contains at least one aromatic compound having a styryl group whose structural formula is given by any of the following general formulae (chemical formula 2-1) to (chemical formula 2-3):

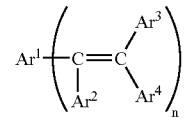

(Formula 2-1)

where in the general formula (chemical formula 2-1), $Ar^1$ is an aromatic group having 6 to 40 carbon atoms, each of $Ar^2$, $Ar^3$, and $Ar^4$ is hydrogen or an aromatic group having 6 to 40 carbon atoms, at least one of $Ar^1$, $Ar^2$, $Ar^3$, and $Ar^4$ is an aromatic group, and the condensation number n is an integer of 1 to 6;

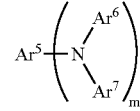

(Formula 2-2)

where in the general formula (chemical formula 2-2), $Ar^5$ is an aromatic group having 6 to 40 carbon atoms, each of $Ar^6$ and $Ar^7$ is hydrogen or an aromatic group having 6 to 40 carbon atoms, at least one of $Ar^5$, $Ar^6$, and $Ar^7$ is substituted with a styryl group, and the condensation number m is an integer of 1 to 6; and

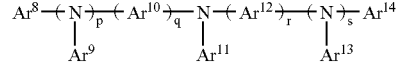

(Formula 2-3)

where in the general formula (chemical formula 2-3), $Ar^8$ and $Ar^{14}$ are each an aromatic group having 6 to 40 carbon atoms, each of $Ar^9$ to $Ar^{13}$ is hydrogen or an aromatic group having 6 to 40 carbon atoms, at least one of $Ar^8$ to $Ar^{14}$ is substituted with a styryl group, and the condensation numbers p, q, r, and s are 0 or 1 each.

The present invention also is a method of fabricating the organic EL device described so far, comprising the steps of: forming the electrode layer by sputtering; and forming the organic luminescent layer by vacuum deposition. In this way of formation, it is possible to form a hole injection layer and an organic luminescent layer which are dense and have uniform film thicknesses. It is thus possible to provide an organic EL device having yet uniform luminescence intensity.

Third Group of Invention

To solve the foregoing problems, the aspect of a third group of the invention adopts the following means.

Invention of an Electrode Substrate for an Organic EL Device

1. Initially, the present invention is an electrode substrate for an organic EL device, comprising an electrode for driving an organic electroluminescence layer and a base member, wherein the electrode is made of a laminate of the following two layers:

(1) a thin film layer of a metal oxide having a work function above 5.6 eV in value; and (2) a thin film layer composed mainly of Ag.

Now, when the multilayer-film configuration is employed, the outermost layer or the surface to contact the organic luminescent layer must be a metal oxide layer. The reason is that such effects as lower voltage, enhanced luminescence intensity, and improved durability are small.

The means described above can be adopted to make the outermost layer or the surface to contact the organic luminescent layer a metal oxide layer.

Here, the work function is set at 5.6 eV or higher for the reason that such effects as lower voltage, enhanced luminescence intensity, and improved durability are small unless this condition is satisfied.

2. Next, the present invention is the electrode substrate for an organic EL device, characterized in that the thin film layer of the metal oxide has a work function of 5.8 eV or higher.

As described above, the work function must be 5.6 eV or higher, and is preferably 5.8 eV or higher.

Note that this value is a measurement in the air after film formation, a value before the application of UV cleaning or the like (pre-cleaning value). This work function was measured with "AC-1" from Rikagaku Giken Co., Ltd., by using a photoemission method. The measurement samples were irradiated with light of 3.5 to 6.5 eV, and electrons emitted from the samples were measured. The work function is determined from the irradiation light energy required to emit electrons.

3. Next, the present invention is the foregoing electrode substrate, characterized in that the thin film layer of the metal oxide: is composed mainly of indium oxide; and contains at least one or more types of metal oxides selected from the group consisting of niobium oxide, hafnium oxide, tantalum oxide, and a lanthanide metal oxide.

4. Furthermore, the foregoing electrode substrate is characterized in that the thin film layer of the metal oxide contains zinc oxide or tin oxide as a main component thereof along with indium oxide.

As above, the present invention contains indium oxide as a main component of the thin film layer of the metal oxide. It also contains zinc oxide and/or tin oxide.

For example, when indium oxide+zinc oxide are the main components, In/(In+Zn)=0.5% to 0.95% by atom is desirable. Here, In/(In+Zn) indicates the ratio of indium atoms to the total sum of the numbers of indium atoms and zinc atoms in the thin film layer of the metal oxide.

The value of the foregoing ratio In/(In+Zn) is preferably 0.7 to 0.9, and yet preferably 0.8 to 0.9. The reason is that if this value is below 0.5, the thin film layer of the metal oxide can drop in conductivity. Above 0.95, on the other hand, the etching property might deteriorate.

Moreover, when, for example, indium oxide+tin oxide are the main components, In/(In+Sn)=0.7% to 0.95% by atom is desirable. Here, In/(In+Sn) indicates the ratio of indium atoms to the total sum of the numbers of indium atoms and tin atoms in the thin film layer of the metal oxide.

The value of the foregoing ratio In/(In+Sn) is preferably 0.8 to 0.95, and yet preferably 0.85 to 0.95. The reason is that if this value is below 0.7 or above 0.95, the thin film layer of the metal oxide can drop in conductivity.

Now, the amount of niobium oxide, hafnium oxide, tantalum oxide, and a lanthanide metal oxide to be added is 0.1% to below 20% by atom, preferably 1% to below 10% by atom, and yet preferably 1% to below 5% by atom with respect to the total metal atoms. The reason is that at amounts of addition below 0.1% by atom, the effect of the addition will not reach a significant level, sometimes failing to increase the work function to or above 5.6 eV. On the other hand, at amounts of addition of 20% and higher by atom, the thin film of the metal oxide becomes an insulative film with the problem of a drop in conductivity.

5. Moreover, the present invention is the foregoing electrode substrate, characterized in that the lanthanide metal oxide is at least one or more types of metal oxides selected from the group consisting of cerium oxide, praseodymium oxide, neodymium oxide, samarium oxide, and terbium oxide.

Incidentally, in the present invention, this multilayer film constituting an electrode preferably has a surface resistance below 10 Ω/sq. Preferably below 6 Ω/sq., and yet preferably 4 Ω/sq.

6. Moreover, the present invention is the foregoing electrode substrate, characterized in that the thin film layer composed mainly of Ag contains metal having a work function of 5.0 eV or higher.

7. Furthermore, the present invention is characterized in that the metal having a work function of 5.0 eV or higher contains one type or two or more types of metal selected from the Au, Ir, Ni, Pd, and Pt.

As in these inventions 6 and 7, the addition of metal having a work function of 5.0 eV or higher enhances the stability of the Ag layer. The amount of addition is 0.01 to 5 wt % or lower, preferably 0.1 to 2 wt %, and yet preferably 1 to 2 wt %.

The reason for this is that at amounts of addition below 0.01, the effect of the addition is small. On the other hand, at amounts of addition above 5 wt %, the Ag thin film layer may drop in conductivity or become expensive.

Moreover, other metals (such as Cu, Co and Zr) may be added as a third component without affecting stability, resistance, and reflectance.

When the present invention is used to constitute an organic EL device such as an organic EL device, it is preferable to employ thicknesses as follows:

(1) In the Case of Outputting Light through the Anode

In this case, the "thin film layer composed mainly of Ag" (sometimes referred to simply as an Ag thin film) is given a thickness of 3 to 15 nm, and preferably 5 to 10 nm. The reason is that if the Ag thin film has a thickness below 3 nm, the anode might not be reduced in resistance. On the other hand, when the Ag thin film has a thickness above 15 nm, the transmittance can fall with a drop in the light output efficiency from the luminescent layer.

Moreover, the thin film layer of the metal oxide (sometimes referred to simply as an oxide layer) may have a thickness selected from the range of 10 to 200 nm so as to suppress reflection from the Ag layer. The thickness of this oxide layer is preferably selected from the range of 20 and 50 nm, and yet preferably 25 and 40 nm. When this oxide layer has a thickness below 10 nm, the stabilization of the Ag layer might not be achieved, with the result of lower durability of the organic EL device. On the other hand, when this oxide layer has a thickness above 200 nm, the transmittance can fall with a drop in the light output efficiency.

(2) In the Case of Outputting Light through the Cathode

In this case, the Ag layer may be a thick film in order to reflect the light coming from the luminescent layer toward the cathode. The Ag layer has a thickness in the range of 30 and 300 nm, preferably 5.0 and 250 nm, and yet preferably 100 and 200 nm.

When this Ag layer is given a thickness of 300 nm or greater, it becomes too thick and can cause a leak current at the electrode end. In contrast, when the Ag layer has a thickness below 30 nm, the function of reflecting light toward the cathode may become weaker. With the objective of exercising the reflecting function of this Ag layer, the thickness of this Ag layer is desirably set at 30 nm or greater, and preferably 50 nm or greater.

Invention of an Organic EL Device

The following describes the invention of an organic EL device having the same characteristics as those of the electrode substrate for an organic EL device described above. These have the same functions as those of the electrode substrate for an organic EL device described above.

To achieve the foregoing object, the present invention is an organic EL device having a structure that at least an anode layer, an organic electroluminescence layer, and a cathode layer are laminated, wherein either one or both of the electrodes, i.e., the anode layer and the cathode layer are made of a laminate of a thin film layer of a metal oxide having a work function above 5.6 eV and a thin film layer composed mainly of Ag.

The present invention is also characterized in that the thin film layer of the metal oxide has a work function of 5.8 eV or higher.

The present invention is also characterized in that the thin film layer of the metal oxide: is composed mainly of indium oxide; and contains at least one or more types of metal oxides selected from the group consisting of niobium oxide, hafnium oxide, tantalum oxide, and a lanthanide metal oxide.

The present invention is also characterized in that the thin film layer of the metal oxide contains zinc oxide or tin oxide as a main component thereof along with indium oxide.

The present invention is also characterized in that the lanthanide metal oxide is at least one or more types of metal oxides selected from the group consisting of cerium oxide, praseodymium oxide, neodymium oxide, samarium oxide, and terbium oxide.

The present invention is also characterized in that the thin film layer composed mainly of Ag contains metal having a work function of 5.0 eV or higher.

The present invention is also characterized in that the metal having a work function of 5.0 eV or higher contains one type or two or more types of metal selected from Au, Ir, Ni, Pd, and Pt.

Invention of a Method of Fabricating an Organic EL Device

The present invention also is a method of fabricating the organic EL device described above, comprising the steps of: forming the electrode by sputtering; and forming the organic electroluminescence layer by vacuum deposition.

Fourth Group of Invention

To solve the foregoing problems, the aspect of a fourth group of the invention adopts the following means.

1. Initially, the present invention is an electrode substrate for an organic EL device, comprising an electrode for driving an organic electroluminescence layer and a base member, wherein the electrode is a laminate comprising an anode thin film layer of a metal oxide having a work function above 5.6 eV and a metal thin wire.

Here, the work function is set at 5.6 eV or higher for the reason that such effects as lower voltage, enhanced luminescence intensity, and improved durability might be smaller unless this condition is satisfied.

Besides, without the metal thin wire, the anode can grow in electrode resistance and increase in work function, possibly limiting the effects such as enhanced luminescence intensity.

2. Next, the present invention is characterized in that the anode thin film layer of the metal oxide is one having a work function of 5.8 eV or higher.

As described above, the work function must be 5.6 eV or higher, and is preferably 5.8 eV or higher. Incidentally, this value is a value measured in the air with AC-1 from Rikagaku Giken, after UV cleaning.

3. Next, the present invention is characterized in that the anode thin film layer of the metal oxide: is composed mainly of indium oxide, and also contains zinc oxide and/or tin oxide as a main component(s) thereof; and further contains a lanthanide metal oxide.

The addition of the lanthanide can effectively give the thin film layer of the metal oxide composed mainly of indium oxide, zinc oxide, and/or tin oxide a work function of 5.6 eV or higher.

In the cases of metals other than those mentioned above as main components, the amount of addition of lanthanides must be increased in order to set the work function at or above 5.6 eV effectively. A rise in the amount of addition, however, can increase the resistance, decrease the transmittance, and deteriorate the etching property.

4. Next, the present invention is characterized in that the foregoing lanthanide metal oxide is a single metal oxide or two or more metal oxides selected from cerium oxide, praseodymium oxide, neodymium oxide, samarium oxide, and terbium oxide.

For example, when indium oxide+zinc oxide are the main components, In/(In+Zn)=0.5% to 0.98% by atom is preferable. The value of the foregoing ratio In/(In+Zn) is preferably 0.7 to 0.95, and yet preferably 0.8 to 0.9. The reason is that if this value is below 0.5, the metal oxide film can drop in conductivity. Above 0.98, on the other hand, the etching property might deteriorate.

Moreover, when, for example, indium oxide+tin oxide are the main components, In/(In+Sn)=0.7% to 0.98% by atom is desirable.

The value of the foregoing ratio In/(In+Sn) is preferably 0.8 to 0.95, and yet preferably 0.85 to 0.95. The reason is that if this value is below 0.7 or above 0.98, the thin film layer of the metal oxide can drop in conductivity.

When, for example, indium oxide+tin oxide+zinc oxide are the main components, In/(In+Sn+Zn)=0.5% to 0.98% by atom is desirable.

The value of the foregoing ratio In (In+Sn+Zn) is preferably 0.7 to 0.95, and yet preferably 0.8 to 0.95. The reason is that if this value is below 0.5, the metal oxide film can drop in conductivity. Above 0.98, the etching property might deteriorate.

Now, the amount of the lanthanide metal oxide to be added is desirably 0.1% to below 20% by atom, preferably 1% to below 10% by atom, and yet preferably 1% to below 5% by atom with respect to the total metal atoms. The reason is that if this value is below 0.1% by atom, the addition might not produce any effect, failing to achieve a work function of 5.6 eV or higher. Above 20% by atom, the thin film can increase in resistance with a drop in conductivity.

Moreover, the thin film layer desirably has a thickness of 10 to 500 nm, preferably 30 to 300 nm, and yet preferably 30 to 200 nm. The reason is that if this value is 10 nm or smaller, a problem might occur in the mechanical strength of the thin film layer. At or above 500 nm, there can occur a problem in etching property and an increase in the film forming time.

The oxygen partial pressure at the time of film formation should be set at 0-5%. Preferably it is set at 0-2%, and yet preferably at 0-1%. The reason is that if this value is 5% or higher, the resistance can increase.

As for crystallinity, the anode layer is desirably amorphous. The reason is that when the anode layer has an amorphous crystallinity, residues disappear from the end faces at the time of etching (etching surfaces) and the electrodes can be tapered to resolve such troubles as disconnection of opposed electrodes.

5. The present invention is the foregoing substrate for an organic EL device, characterized in that the metal thin wire is composed mainly of any of Ag, Al, and Cu.

6. The present invention is the foregoing substrate for an organic EL device, characterized in that metal having a work function of 5.0 eV or higher is added to the metal thin wire.

7. The present invention is the foregoing substrate for an organic EL device, characterized in that the metal having a work function of 5.0 eV or higher contains one type or two or more types of metal selected from Au, Ir, Ni, Co, Pd, and Pt.

The addition of the metal having a work function of 5.0 or higher enhances the stability of the metal thin wire. The amount of addition is 0.01 to 5 wt % or lower, preferably 0.1 to 2 wt %, and yet preferably 0.5 to 2 wt %. The reason is that if this value is below 0.01, the effect of addition is small. With addition of above 5 wt %, the Ag thin film layer and the like may drop in conductivity or become expensive.

Moreover, other metals may be added as a third component without affecting stability and resistance.

The metal thin wire desirably has a thickness of 10 to 500 nm, and preferably 20 to 400 nm. The reason is that if this value is below 10 nm, there may occur the problem that the anode resistance will not decrease. Above 500 nm, an increased difference in level between electrodes can sometimes cause a leak current.

The width of the metal thin wire (in the minor-side direction) must be rendered smaller than the width of the anode thin film layer (in the minor-side direction). The width of the metal thin wire (in the minor-side direction) is 2-40%, preferably 3-30%, and yet preferably 4-25% the width of the anode thin film layer.

8. The present invention is the foregoing electrode substrate for an organic EL device, comprising a protective film on the anode thin film layer of the metal oxide. The reason is that the provision of the protective film improves the durability of the metal thin wire.

The protective layer is desirably made of material capable of being etched in the etchant of the metal thin wire, and has conductivity. An amorphous transparent conductive film made of indium oxide-zinc oxide can be suitably used as such material. In that case, indium may be used at the ratio of In/(In+Zn)=0.2 to 0.98, preferably 0.5 to 0.95, and yet preferably 0.7 to 0.9.

9. The present invention is a method of fabricating an electrode substrate for an organic EL device, comprising the steps of: laminating an anode thin film layer of the metal oxide on a base member, and then laminating a metal thin film layer made of a metal thin wire thereon; etching the metal thin film layer in a mixed acid of phosphoric acid, nitric acid, and acetic acid; and after the etching, performing additional oxalic-acid etching to pattern the anode thin film layer.

10. Moreover, the present invention is the method of fabricating an electrode substrate for an organic EL device, characterized in that the base member is a glass substrate.

Here, the anode thin film layer can be etched in an etchant containing oxalic acid. The concentration of oxalic acid is 1 to 20 wt % of the aqueous solution, preferably 2 to 10 wt % of the aqueous solution, and yet preferably 2 to 5 wt %. The reason is that at or below 1 wt %, a sufficient etching rate cannot be achieved. At or above 20 wt %, the crystal of oxalic acid may be precipitated. In addition, acids in no danger of corroding metal may also be added.

The metal-etching acids are not limited to any particular ones, but may be any acids as long as they cause no damage on the anode thin film layer. A mixed acid of phosphoric acid, nitric acid, and acetic acid can be used yet effectively. The ratios of mixture of the respective acids are not particularly restricted. Nevertheless, such mixture as allows a sufficient etching rate of the metal thin film and causes no damage on the anode thin film layer is naturally preferable. No particular restriction is imposed on the concentrations, either. Nevertheless, such concentrations as allow a sufficient etching rate of the metal thin film and cause no damage on the anode thin film layer are naturally preferable. Thus, water dilution is also desirable if needed.

11. An organic EL device uses an electrode substrate for an organic EL device, the electrode substrate comprising an electrode for driving an organic electroluminescence layer and a base member, the electrode being a laminate comprising an anode thin film layer of a metal oxide having a work function above 5.6 eV and a metal thin wire, the organic EL device including: the organic electroluminescence layer; and a cathode layer opposed to the electrode.

Here, the organic EL device provides the same functions and effects as those of the electrode substrate for an organic EL device described above.

Fifth Group of Invention

Hereinafter, the aspect of a fifth group of invention will be described. This fifth group will be detailed mainly in a fifth embodiment to be seen later.

1. The present invention is a substrate for an organic EL device, comprising a laminate of: an electrode for driving the organic electroluminescence layer descried above; a transparent conductive thin film containing indium oxide; a metal thin wire; and a thin film layer of a metal oxide, the laminate being formed in this order on a base member, wherein the thin film layer of the metal oxide has a work function above 5.6 eV and a specific resistance of 10E+4 Ωcm or higher.

The reason is that the work function of 5.6 eV or higher improves the hole injection efficiency to organic materials, enhances luminescence intensity, and extends life. The work function is preferably 5.8 eV or higher, and yet preferably 6.0 eV or higher.

Moreover, the thin film layer of the metal oxide has a thickness of 1 to 100 nm, preferably 5 to 50 nm, and yet preferably 5 to 20 nm. If the thickness of the thin film layer is 1 nm or smaller, the thin film layer may not produce any effect. If the thickness of the thin film layer is 100 nm or greater, the inter-anode resistance of the thin film layer decreases, possibly causing crosstalk.

The areas of the electrode substrate for the thin film layer to cover are a display area and/or a wiring area. An external electrode outlet may or may not be covered.

2. The present invention is a substrate for an organic EL device, comprising a laminate of: an electrode for driving the organic electroluminescence layer descried above; a metal thin wire; a transparent conductive thin film containing indium oxide; and a thin film layer of the metal oxide, the laminate being formed in this order on a base member, wherein the thin film layer of the metal oxide has a work function above 5.6 eV and a specific resistance of 10E+4 Ωcm or higher.

The present invention is the invention set forth in 1 above, the configuration of which is changed in order. That is, the order of lamination of the transparent conductive thin film containing indium oxide and the metal thin wire is inverted. Even in such a configuration, the functions and effects of the invention are the same as in 1 above.

3. The present invention is characterized in that the thin film layer of the metal oxide has a specific resistance with the range of 10E+04 Ωcm and 10E+08 Ωcm.

The reason is that if the specific resistance is 10E+4 Ωcm or lower, the inter-anode resistance decreases to cause crosstalk. Moreover, if the specific resistance is 10E+8 Ωcm or higher, the resistance becomes so high that the hole injection efficiency may drop.

4. The present invention is characterized in that a thin film layer of the metal oxide layer has a work function of 5.8 eV or higher.

As described above, the work function is preferably 5.8 eV or higher, and yet preferably 6.0 eV or higher.

5. The present invention is characterized in that the metal oxide contains at least either one of zinc oxide and tin oxide.

With main components of indium oxide+tin oxide type, In/(In+Sn)=0.6 to 0.98 at % is preferable. Yet preferably 0.75 to 0.95 at %.

With indium oxide+zinc oxide+tin oxide type, In/(In+Zn+Sn)=0.6 to 0.98 at % is preferable. Yet preferably 0.75 to 0.95 at %. Here, at % means percents by atom.

6. The present invention is characterized in that the metal oxide contains at least one type of lanthanide oxide.

The content of the lanthanide metal oxide is 5 to 50 at %, and preferably 10 to 40 at %, with respect to the total metal atoms. Yet preferably 10 to 30 at %. The reason is that if the content of the lanthanide metal oxide is below 5 at %, the resistance can fall with a drop in the work function. Moreover, if the content of the lanthanide metal oxide exceeds 50 at %, the film can become insulative, possibly reducing the work function. Here, at % means percents by atom.

As above, it is desirable that the metal oxide includes indium oxide, zinc oxide, and/or tin oxide, and contains a lanthanide metal oxide.

7. The present invention is characterized in that the lanthanide metal oxide is an oxide selected from the group consisting of cerium oxide, praseodymium oxide, neodymium oxide, samarium oxide, and terbium oxide.

8. The present invention is characterized in that the metal thin wire contains at least one selected from the group consisting of Ag, Al, and Cu.

The metal thin wire is desirably made of metal having a specific resistance below 10 μΩcm. The use of Ag, Al, and Cu is particularly desirable.

9. The present invention is characterized in that the metal thin wire contains metal having a work function of 5.0 eV or higher.

For the sake of stabilization of Ag, Al, and Cu which are used as the main components of the metal thin wire, metal having a work function of 5.0 eV or higher is desirably added.

10. The present invention is characterized in that the metal having a work function of 5.0 eV or higher contains one, type or two or more types of metal selected from the group consisting of Au, Ir, Ni, Co, Pd, and Pt.

As above, Au, Ir, Ni, Co, Pd, and Pt are desirably used as the metal having a work function of 5.0 eV or higher. Incidentally, metals other than the foregoing ones are also preferably added without adversely affecting the performance of the metal thin wire. Examples thereof include such metals as Mo and Zr.

Moreover, while the etchant of these metals is not limited to any particular one, it is desirable to select an etchant that causes no damage on the underlying transparent conductive thin film. An example thereof is a mixed acid of phosphoric acid-acetic acid-nitric acid. Incidentally, sulfonic acid, polysulfonic acid, and the like may be added to this mixed acid.

The metal layer made of this metal thin wire need not be a single layer. The metal layer may be sandwiched between different metals. Examples of the different metals include such metals as Ti, Cr, Mo, In, and Zn.

Concrete examples of the metal thin wire sandwiched between different metals include Ti/Al/Ti, Cr/Al/Cr, Mo/Al/Mo, In/Al/In, Zn/Al/Zn, and Ti/Ag/Ti.

11. The present invention is an organic EL device comprising: the electrode substrate for an organic EL device set forth in any of 1 to 10 above; a cathode layer; and an organic electroluminescence layer.

Here, the organic EL device provides the same functions and effects as those of the electrode substrate for an organic EL device described above.

BRIEF DESCRIPTION OF THE DRAWINGS

FIG. 1 is a diagram showing a table which shows the compositions of sputtering targets in practical examples 1-1 to 1-9 and comparative examples 1-1 to 1-3;

FIG. 2 is a diagram showing a table which shows the characteristics of conductive thin films fabricated by using the sputtering targets in the practical examples 1-1 to 1-9 and the comparative examples 1-1 to 1-3;

FIG. 15 is a series of sectional views of the process for fabricating the electrode substrate in the present embodiment;

BEST MODE FOR CARRYING OUT THE INVENTION

Figure 3:
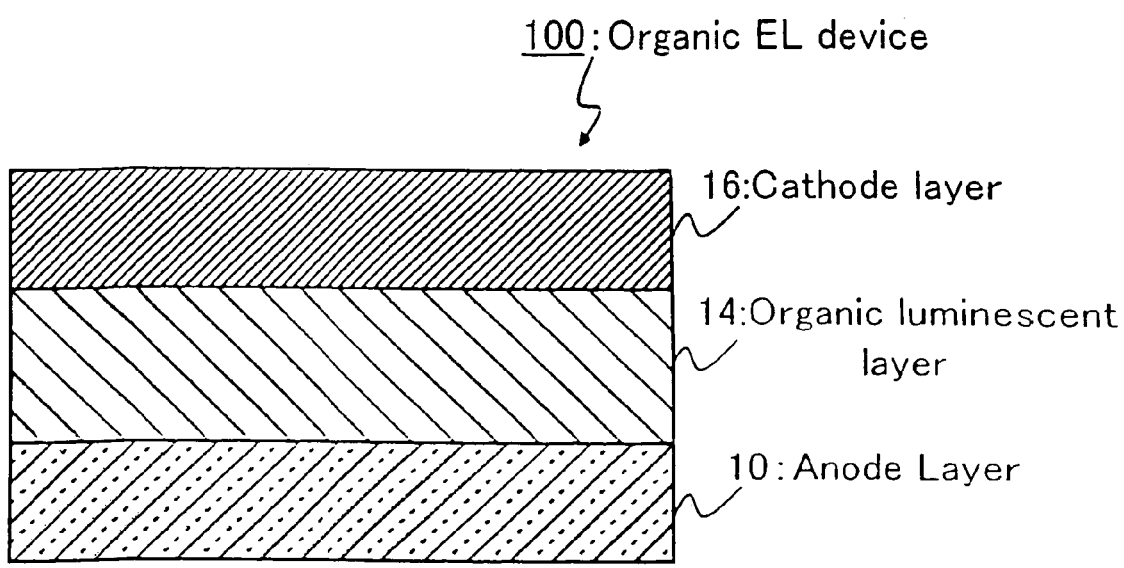
FIG. 3 is a sectional view of an organic EL device in an embodiment 2-1.

Hereinafter, embodiments of the present invention will be described in the concrete with reference to the drawings. Incidentally, the reference drawings schematically show the sizes, shapes, and arrangements of the individual components to an extent that this invention becomes apparent, the ratios among the individual parts being different from in actual devices and the like. Hence, this invention is not limited to the shown examples alone. In the drawings, hatching for showing a section may sometimes be omitted.

GROUP OF EMBODIMENTS 1

Hereinafter, a group of embodiments 1 of the present invention will be described with reference to the drawings.

In the present embodiment, indium oxide, zinc oxide, and tin oxide powders were mixed in predetermined proportions. In addition, a predetermined amount of cerium oxide, samarium oxide, europium oxide, terbium oxide, or bismuth oxide powder was measured and mixed therein as a third component. This mixture was ground in a wet grinder for 48 hours, and then dry granulated and press molded before it was sintered at 1380-1480° C. into a sintered article. This sintered article corresponds to an example of the sputtering target in claims.

Moreover, when the mixture is of indium oxide and zinc oxide, it contain a hexagonal layered compound comprising indium oxide and zinc oxide ($In_2O_3(ZnO)m$: where m is an integer of 2 to 20). For instance, in practical examples 1-1 to 1-6 to be described later, the inclusion of such a hexagonal layered compound comprising indium oxide and zinc oxide ($In_2O_3(ZnO)m$: where m is an integer of 2 to 20) seems to achieve a further reduction in resistance.

This sintered article was cut into a 4-inch φ5-mm(t) plate, which was bonded by metal indium to a backing plate of oxygen-free copper to constitute a sputtering target. In the present patent, the sputtering target, such as a sintered article, bonded to a backing plate will also be referred to as a "sputtering target."

In the present embodiment, a plurality of types of sputtering targets having different compositions were made. The table of FIG. 1 shows the compositions of the respective sputtering targets of the plurality of types.

PRACTICAL EXAMPLES 1-1 TO 1-5

As shown in the table of FIG. 1, practical examples 1-1 to 1-5 are examples where tin oxide is 0 in ratio. The practical examples 1-1 to 1-5 are, then, sputtering targets having indium of approximately 93% by atom and zinc of approximately 17% by atom. Note that in the table of FIG. 1, the composition ratios of indium, zinc, and tin, as is evident from the shown expressions, are ones with respect to the total sum of indium, zinc, and tin, not ones with respect to the total amount of the sputtering target.

In the practical example 1-1, a predetermined amount of cerium oxide powder is further added to the composition having indium of approximately 93% by atom and zinc of approximately 17% mentioned above. As a result, the sputtering target of the practical example 1-1 contains cerium (Ce) of 3% by atom.

In the practical example 1-2, a predetermined amount of cerium oxide powder is further added to indium of approximately 93% by atom and zinc of approximately 17% mentioned above. As a result, the sputtering target of the practical example 1-2 contains cerium (Ce) of 6% by atom.

In the practical example 1-3, a predetermined amount of samarium oxide powder is further added to indium of approximately 93% by atom and zinc of approximately 17% mentioned above. As a result, the sputtering target of the practical example 1-3 contains samarium (Sm) of 5% by atom.

In the practical example 1-4, a predetermined amount of europium oxide powder is further added to indium of approximately 93% by atom and zinc of approximately 17% mentioned above. As a result, the sputtering target of the practical example 1-4 contains europium (Eu) of 10% by atom. As above, in these practical examples, cerium, samarium, and europium are shown as examples of lanthanides. Needless to say, other lanthanides may also be used.

In the practical example 1-5, a predetermined amount of bismuth oxide powder is further added to indium of approximately 93% by atom and zinc of approximately 17% mentioned above. As a result, the sputtering target of the practical example 1-5 contains bismuth (Bi) of 6% by atom.

PRACTICAL EXAMPLES 1-6 TO 1-9

As shown in the table of FIG. 1, a practical example 1-6 is an example where indium oxide, zinc oxide, and tin oxide powders are all mixed.

The practical example 1-6 is a sputtering target having indium of approximately 89% by atom, zinc of approximately 6% by atom, and tin of approximately 5% by atom. A predetermined amount of hafnium oxide powder is added further. As a result, the sputtering target of the practical example 1-6 contains hafnium (Hf) of 5% by atom.

A practical example 1-7 is an example where zinc oxide is 0 in ratio. Then, the example is a mixture of indium oxide and tin oxide. The practical example 1-7 is a sputtering target having indium of approximately 91% by atom and tin of approximately 9% by atom. A predetermined amount of tantalum oxide powder is added further. As a result, the sputtering target of the practical example 1-7 contains tantalum (Ta) of 5% by atom.

A practical example 1-8 is a sputtering target having indium of approximately 91% by atom and tin of approximately 9% by atom. A predetermined amount of terbium oxide powder is added further. As a result, the sputtering target of the practical example 1-8 contains terbium (Tb) of 5% by atom.

A practical example 1-9 is a sputtering target of 100% indium oxide. A predetermined amount of cerium oxide powder is added further. As a result, the sputtering targets of the practical examples 1-9 each contain cerium (Ce) of 6% by atom.

The sputtering targets made thus were used in an RF magnetron sputtering system to form films on a glass substrate (#7059 from Corning, Inc.) and a polyethylene terephthalate film substrate from Toray Industries, Inc.

The table of FIG. 2 shows measurements on the physical properties of the thin films fabricated thus. The table shown in FIG. 2 is one showing the values of the transparency and work functions of conductive films, the conductive films being fabricated by using the sputtering targets of the foregoing practical examples 1-1 to 1-9 and comparative examples 1-1 to 1-3. This table also shows the physical properties of the sputtering targets themselves in the foregoing practical examples 1-1 to 1-9 and the comparative examples 1-1 to 1-3.

Initially, as shown in this table, the sputtering target of the practical example 1-1 has a density of 6.62 g/cc and a bulk resistivity of 2.3 mΩ·cm. The thin film formed on the glass substrate by using the sputtering target of this practical example 1-1 exhibited a resistivity of 960 μΩ·cm and a transparency of 89%. Besides, the work function was 5.72 eV. As for the etching characteristic, residues were not observed at all. Moreover, the thin film formed on the film substrate by using the sputtering target of this practical example 1 exhibited a resistivity of 980 μΩ·cm and a transparency of 87%. Besides, the work function was 5.55 eV.

Incidentally, the resistivities of the thin films were measured by the four probe method (Loresta: from Mitsubishi Petrochemical Co., Ltd.). Moreover, the transparencies were transmittances at a wavelength of 550 nm. The work functions were measured by AC-1 from Riken Keiki Co., Ltd. For the etching characteristics, the mark "double circle" in the table means no residue at all, the mark "circle" little residue, the mark "triangle" a slight amount of residues, and the mark "cross" a large amount of residues or that etching was impossible. The same also holds for the following descriptions.

In the practical example 1-2, the sputtering target has a density of 6.71 g/cc and a bulk resistivity of 0.87 mΩ·cm. The thin film formed on the glass substrate by using the sputtering target of this practical example 1-2 exhibited a resistivity of 1850 μΩ·cm and a transparency of 90%. Besides, the work function was 5.62 eV. As for the etching characteristic, residues were not observed at all. Moreover, the thin film formed on the film substrate by using the sputtering target of this practical example 1-2 exhibited a resistivity of 1880 μΩ·cm and a transparency of 89%. Besides, the work function was 5.93 eV.

In the practical example 1-3, the sputtering target has a density of 6.76 g/cc and a bulk resistivity of 1.03 mΩ·cm. The thin film formed on the glass substrate by using the sputtering target of this practical example 1-3 exhibited a resistivity of 750 μΩ·cm and a transparency of 88%. Besides, the work function was 6.03 eV. As for the etching characteristic, residues were not observed at all. Moreover, the thin film formed on the film substrate by using the sputtering target of this practical example 1-3 exhibited a resistivity of 810 μΩ·cm and a transparency of 87%. Besides, the work function was 5.93 eV.

In the practical example 1-4, the sputtering target has a density of 6.81 g/cc and a bulk resistivity of 2.4 mΩ·cm. The thin film formed on the glass substrate by using the sputtering target of this practical example 1-4 exhibited a resistivity of 460 μΩ·cm and a transparency of 89%. Besides, the work function was 5.78 eV. As for the etching characteristic, residues were not observed at all. Moreover, the thin film formed on the film substrate by using the sputtering target of this practical example 1-4 exhibited a resistivity of 610 μΩ·cm and a transparency of 88%. Besides, the work function was 5.73 eV.

In the practical example 1-5, the sputtering target has a density of 6.93 g/cc and a bulk resistivity of 0.82 mΩ·cm. The thin film formed on the glass substrate by using the sputtering target of this practical example 1-5 exhibited a resistivity of 880 μΩ·cm and a transparency of 87%. Besides, the work function was 5.63 eV. As for the etching characteristic, residues were not observed at all. Moreover, the thin film formed on the film substrate by using the sputtering target of this practical example 1-5 exhibited a resistivity of 960 μΩ·cm and a transparency of 87%. Besides, the work function was 5.61 eV.

In the practical example 1-6, the sputtering target has a density of 6.95 g/cc and a bulk resistivity of 0.96 mΩ·cm. The thin film formed on the glass substrate by using the sputtering target of this practical example 1-6 exhibited a resistivity of 670 μΩ·cm and a transparency of 88%. Besides, the work function was 5.62 eV. As for the etching characteristic, residues were not observed at all. Moreover, the thin film formed on the film substrate by using the sputtering target of this practical example 1-6 exhibited a resistivity of 750 μΩ·cm and a transparency of 88%. Besides, the work function was 5.60 eV.

In the practical example 1-7, the sputtering target has a density of 6.92 g/cc and a bulk resistivity of 0.72 mΩ·cm. The thin film formed on the glass substrate by using the sputtering target of this practical example 1-7 exhibited a resistivity of 540 μΩ·cm and a transparency of 89%. Besides, the work function was 6.20 eV. As for the etching characteristic, residues were not observed at all. Moreover, the thin film formed on the film substrate by using the sputtering target of this practical example 1-7 exhibited a resistivity of 540 μΩ·cm and a transparency of 88%. Besides, the work function was 6.17 eV.

In the practical example 1-8, the sputtering target has a density of 6.91 g/cc and a bulk resistivity of 1.05 mΩ·cm. The thin film formed on the glass substrate by using the sputtering target of this practical example 1-8 exhibited a resistivity of 840 μΩ·cm and a transparency of 89%. Besides, the work function was 6.20 eV. At the time of etching, residues were not observed at all. The thin film formed on the film substrate by using the sputtering target of this practical example 1-8 exhibited a resistivity of 860 μΩ·cm and a transparency of 88%. Besides, the work function was 5.61 eV.

In the practical example 1-9, the sputtering target has a density of 6.78 g/cc and a bulk resistance of 2.8 mΩ·cm. The thin film formed on the glass substrate by using the sputtering target of this practical example 1-9 exhibited a resistivity of 1250 μΩ·cm and a transparency of 89%. Besides, the work function was 5.68 eV. As for the etching characteristic, residues were not observed at all. The thin film formed on the film substrate by using the sputtering target of this practical example 1-9 exhibited a resistivity of 1450 μΩ·cm and a transparency of 88%. Besides, the work function was 5.66 eV.

When evaluated for crystallinity through an X-ray analysis, the thin films of these practical examples 1-1 to 1-9 showed no peak, confirming that all were amorphous.

As described above, according to these practical examples, it is possible to obtain a conductive film of high work function while maintaining high transparency.

Next, the three types of comparative examples were also sputtered into thin films as in the foregoing practical examples. Then, the physical properties of the formed thin films are also shown in the table of FIG. 2.

As shown in the table of FIG. 2, the sputtering target of the comparative example 1-1 has a density of 6.65 g/cc and a bulk resistivity of 2.5 mΩ cm. The sputtering target of this comparative example 1-1 was used to form a thin film on the glass substrate as in the foregoing practical examples. This thin film was 380 μΩ·cm in resistivity and 89% in transparency. The work function was 5.22 eV. As for the etching characteristic, residues were not observed at all. Moreover, the sputtering target of this comparative example 1 was used to form a thin film on the film substrate as in the foregoing practical examples. This thin film was 420 μΩ·cm in resistivity and 88% in transparency. Besides, the work function was 5.18 eV.

Then, the sputtering target of the comparative example 1-2 has a density of 6.85 g/cc and a bulk resistivity of 0.46 mΩ·m. The sputtering target of this comparative example 1-2 was used to form a thin film on the glass substrate as in the foregoing practical examples. This thin film was 170 μΩ·cm in resistivity and 90% in transparency. The work function was 4.92 eV. As for the etching characteristic, a large amount of residues were observed which precluded the etching. Moreover, the sputtering target of this comparative example 1-2 was used to form a thin film on the film substrate as in the foregoing practical examples. This thin film was 680 μΩ·cm in resistivity and 89% in transparency. Besides, the work function was 4.88 eV.

Moreover, the sputtering target of the comparative example 1-3 had a density of 6.90 g/cc and a bulk resistivity over MΩ·cm. The sputtering target of this comparative example 1-2 was used to form a thin film on the glass substrate by the rf magnetron sputtering method as in the foregoing practical examples. This thin film was over MΩ·cm in resistivity and 89% in transparency. The work function was 5.58 eV. As for the etching characteristic, etching could not be done, the etching being impossible. Moreover, the sputtering target of this comparative example 1-3 was used to form a thin film on the film substrate in the same manner. This thin film was over MΩ·cm in resistivity and 88% in transparency. Besides, the work function was 5.55 eV.

Thus, as can be seen from the contrast between the practical examples and the comparative examples, any of the sputtering targets of the practical examples have a work function of 5.50 eV or greater in value while maintaining a transparency of 87% or higher. Consequently, when organic EL devices or organic phosphorescence type light emitting devices are fabricated by using such thin films as shown in the practical examples for transparent electrodes thereof, it is possible to obtain devices of improved hole injection rates.

Summary of the Group of Embodiments 1

As described above, according to the aspect of the first group of the present invention, the inclusion of such metals as lanthanides and hafnium makes it possible to provide a transparent conductive film of higher work function while maintaining transparency. As a result, according to the present invention, it becomes possible to obtain organic EL devices and organic phosphorescence type light emitting devices of improved hole injection efficiencies.

GROUP OF EMBODIMENTS 2

Embodiment 2-1

Initially, with reference to FIG. 3, description will be given of an embodiment 2-1 according to the organic EL device of the present invention. FIG. 3 is a sectional view of an organic EL device 100. As shown in this diagram, the organic EL device 100 has the structure that an anode layer 10, an organic luminescent layer 14, and a cathode layer 16 are laminated on a substrate (not shown) in succession.

Hereinafter, description will concentrate on the anode layer 10 and the organic luminescent layer 14 which are the characteristic parts of the embodiment 2-1. The configuration and forming method of the rest of the components, such as the cathode layer 16, will be described in the briefest form. As for parts that are not mentioned, various configurations and forming methods generally known in the field of organic EL devices may be employed.

Incidentally, in the embodiment 2-1, the anode layer 10 is made of compounds of group A-1 or A-2 (which will hereinafter be referred to collectively as group A) and group B-1 or B-2 (which will hereinafter be referred to collectively as group B) to be described below. Nevertheless, the cathode layer 16 may be made of the foregoing inorganic compounds when the work functions of the foregoing inorganic compounds are rendered below 4.0 eV in value.

(1) Constituent Materials of the Anode Layer 10

The anode layer 10 of the present embodiment 2-1 adopts either the constitution of containing an inorganic compound of the following group A-1 and a compound of the group B-1 in combination or the constitution of containing an inorganic compound of the following group A-2 and a compound of the group B-2 in combination. Note that the combinations of inorganic compounds of the group A-1 and compounds of the group B-1 and the combinations of inorganic compounds of the group A-2 and compounds of the group B-2 have some overlapping compounds:

Group A-1: chalcogenides, oxynitrides, or nitrides of Si, Ge, Sn, Pb, Ga, In, Zn, Cd, and Mg;

Group A-2: chalcogenides, oxynitrides, or nitrides of Ge, Sn, Pb, Ga, In, Zn, Cd, and Mg;

Group B-1: chalcogenides, oxynitrides, or nitrides of lanthanides; and

Group B-2: chalcogenides of lanthanides.

The compounds of two types, the group A and the group B, are thus combined because it is difficult, as described above, for either one (group A or group B) of compounds (organic compound or inorganic compound) alone to increase the value of ionization potential effectively. Specifically, it is difficult to increase the ionization potential to values above 5.8 eV.

Consequently, the inorganic compounds of the group A-1 and the compounds of the group B-1, or the inorganic compounds of the group A-2 and the compounds of the group B-2, can be combined to constitute the anode layer 10 so that the ionization potential has an extremely large value of 5.8 eV or above. As a result, an organic EL device can be obtained which has excellent durability and transparency, a low driving voltage (low specific resistance) and high luminescence intensity.

Moreover, the compounds combining the inorganic compounds of the group A-1 and the compounds of the group B-1, or the compounds combining the inorganic compounds of the group A-1 and the compounds of the group B-2, are characterized by having excellent etching properties to acids such as hydrochloric acid and oxalic acid. Specifically, the interface between an acid-treated part and an untreated part exhibits a smooth section, which allows clear distinction between the areas of the acid-treated part and the untreated part. Electrode layers made of such inorganic compounds thus have electrode patterns of excellent etching precision, with the effect that even microelectrodes and electrodes of complicated shapes are less prone to disconnection, deformation, increased resistance, and so on.

Group A Inorganic Compounds

More specifically, the inorganic compounds of group A-1 include $SiO_x$ ($1 \leq x \leq 2$), $GeO_x$ ($1 \leq x \leq 2$), $SnO_2$, $PbO$, $In_2O_3$, $ZnO$, $GaO$, $CdO$, $ZnS$, $ZnCe$, $CdSe$, $InxZnyO$ ($0.2 \leq x/(x+y) \leq 0.95$), $ZnOS$, $CdZnO$, $CdZnS$, $MgInO$, $CdInO$, $MgZnO$, $GaN$, $InGaN$, and $MgZnSSe$.

Moreover, the inorganic compounds of the group A-2 specifically include the foregoing inorganic compounds of group A-1 excluding $SiO_x$ ($1 \leq x \leq 2$) etc. Naturally, ZnO here means oxides of Zn, and ZnS sulfides of Zn. In particular, in the present embodiment, Zn and O, and Zn and S, are not always in their respective regular compositions of 1:1 in ratio. Compounds out of the proportions are also included.

Moreover, particularly preferable materials among the inorganic compounds of the group A-1 and the group A-2 are chalcogenides of Sn, In, and Zn or nitrides of the same. The reason for this is that these compounds, as partly described above, have smallest absorption coefficients or smallest quenching properties in particular among the inorganic compounds of the group A-1 and the group A-2, with excellent transparency so that more amounts of light can betaken out. Of the chalcogenides of Ge, Sn, Zn, and Cd mentioned above, the oxides thereof are yet preferable in particular.

Group B Compounds

Now, the compounds of the group B-1 specifically include $Ce_2O_3$, $CeO_2$, $Pr_6O_{11}$, $Nd_2O_3$, $Sm_2O_3$, $Eu_2O_3$, $Gd_2O_3$, $Tb_4O_7$, $Dy_2O_3$, $Ho_2O_3$, $Tm_2O_3$, $Yb_2O_3$, $Lu_2O_3$, CeN, PrN, NdN, SmN, EuN, GdN, TbN, DyN, HoN, ErN, TmN, YbN, and LuN. They can be used alone or combinations of two or more types of these.

Moreover, the compounds of the group B-2 specifically include ones or combinations of two or more types selected from the group consisting of $Ce_2O_3$, $CeO_2$, $Pr_6O_{11}$, $Nd_2O_3$, $Sm_2O_3$, $Eu_2O_3$, $Gd_2O_3$, $Tb_4O_7$, $Dy_2O_3$, $Ho_2O_3$, $Er_2O_3$, $Tm_2O_3$, $Yb_2O_3$, and $Lu_2O_3$.

Of these compounds of the group B-1 and the group B-2, oxides of Ce, Nd, Sm, Eu, Tb, and Ho, i.e., $CeO_x$, $Nd_2O_3$, $Sm_2O_3$, $Eu_2O_3$, $Tb_4O_7$, and $Ho_2O_3$ are yet preferable. The reason for this is also that, as partly described above, the use of these inorganic compounds can increase the value of the ionization potential in the anode layer 10 effectively.

Content of the Group B (Group B-1 or Group B-2) Compound

Next, description will be given of the content of the group B (group B-1 or group B-2 will be referred to simply as group B) compound. The content of such a group B compound preferably has a value within the range of 0.5 and 30 at. % with the total amount of the anode layer 10 as 100 at. %. The reason for this is that if the content of the group B compound falls below 0.5 at. %, the anode layer 10 deteriorates in ionization potential adjustability. Specifically, it might be difficult to adjust the ionization potential into the range of 5.65 and 6.40 eV. On the other hand, when the content of the group B compound exceeds 30 at. %, there might occur a conductivity drop, coloring, or a transparency (light-transmittance) drop.

Consequently, in view of better balance between the adjustability of the value of the ionization potential in the anode layer 10 and the transparency etc., the content of the group B compound preferably has a value within the range of 0.8 and 20 at. %, and yet preferably a value within the range of 1 and 10 at. %, with the total amount of the anode layer as 100 at. %.

Content of the Group A (Group A-1 or Group A-2) Compound

Incidentally, the content of the group A (group A-1 or group A-2 will be referred to simply as group A) inorganic compound has a value that is obtained by subtracting the content of the group B compound from the total amount of 100 at. % when the anode layer 10 is composed of the compounds of the group A (group A-1 or group A-2) and the group B (group B-1 or group B-2). Thus, when the content of the group B compound in the anode layer 10 has a value within the range of 0.5 and 30 at. %, the content of the group A inorganic compound in the anode layer 10 is a value within the range of 70 and 99.5 at. %.

Nevertheless, when the anode layer 10 contains any compound (third component) other than group A and group B, the content of the group A inorganic compound is preferably determined in consideration of the content of the third component.

Thickness and Structure of the Anode Layer

The anode layer 10 is not limited to any particular thickness, but is preferably given a value, in concrete terms, within the range of 0.5 and 1000 nm. The reason for this is that if the anode layer 10 has a thickness below 0.5 nm, pin holes can occur to cause a leak current in a long-term use. On the other hand, when the anode layer 10 has a thickness above 1000 nm, the electrode transparency can fall with a drop in luminescence intensity. Consequently, in view of better balance between the durability and the driving voltage value etc., the anode layer 10 preferably has a thickness within the range of 1.0 and 800 nm, and yet preferably a thickness within the range of 2.0 and 300 nm. The anode layer 10 is not limited to any particular structure, either. Both a single-layer structure and a multilayer structure having two or more layers are applicable. Consequently, when yet higher transparency (light transmittance) or yet higher conductivity is desired, a double-layer structure may be formed through lamination on a conductive electrode layer of higher transparency or a conductive electrode layer of higher conductivity, such as ITO and $In_2O_3$—ZnO.

Specific Resistance of the Anode Layer

Next, description will be given of the specific resistance of the anode layer 10. This specific resistance is not limited to any particular value, but is preferably given a value below 1 Ω·cm, for example. The reason for this is that if the specific resistance has a value of 1 Ω·cm or higher, there can occur uneven luminescence within pixels as well as an increase in the driving voltage of the organic EL devices fabricated. Consequently, in order to achieve a lower driving voltage, the specific resistance of the anode layer 10 preferably has a value of 40 mΩ·cm or smaller, and yet preferably a value of 1 mΩ·cm or smaller. Incidentally, the value of the specific resistance of the anode layer 10 can be determined by measuring the surface resistance with a resistance meter of four probe method and measuring the thickness separately.

Method of Forming the Anode Layer

Next, description will be given of a method of forming the anode layer 10. This forming method is not limited to any particular method. For example, it is possible to adopt such methods as sputtering, vapor deposition, spin coating, a casting-based sol-gel method, spray pyrolysis, and ion plating. In particular, high frequency magnetron sputtering is preferably adopted. In concrete terms, the sputtering is preferably performed under the condition of $1\times10^{-7}$ to $1\times10^{-3}$ Pa in vacuum, 0.01 to 50 nm/sec in the rate of film formation, and −50 to 300° C. in substrate temperature.

(2) Organic Luminescent Layer

Now, description will be given of the organic luminescent layer.

Constituent Material of the Organic Luminescent Layer

Organic luminescent material to be used as the constituent material of the organic luminescent layer preferably combines the following three functions:

(a) Charge injecting function: a function of enabling hole injection from the anode layer or a hole injection layer and enabling electron injection from the cathode layer or an electron injection layer under the application of an electric field;

(b) Transporting function: a function of moving injected holes and electrons by force of the electric field; and (c) Luminescence function: a function of providing a field for electrons and holes to recombine, thus contributing luminescence.

Nevertheless, it is not always necessary to combine all the foregoing functions (a) to (c). For example, suitable organic luminescent materials are also found in ones that have hole injection and transportation capabilities much superior to their electron injection and transport capabilities. Thus, materials can be suitably used as long as they promote electron movement in the organic luminescent layer 14 to allow recombination of holes and electrons in the organic luminescent layer 14 near the center.

Here, for the sake of improved recombinability of the organic luminescent layer 14, the organic luminescent material preferably has an electron mobility of $1\times10^{-7}$ cm$^2$/V·s or greater. The reason for this is that values below $1\times10^{-7}$ cm$^2$/V·s can make quick response of the organic EL device difficult and reduce the luminescence intensity. Consequently, the electron mobility of the organic luminescent material preferably has a value within the range of $1.1\times10^{-7}$ and $2\times10^{-3}$ cm$^2$/V·s, and yet preferably a value within the range of $1.2\times10^{-7}$ and $1.0\times10^{-3}$ cm$^2$/V·s.

Moreover, the organic luminescent material of the organic luminescent layer 14 preferably has an electron mobility smaller than its hole mobility in value. The reason is that if this relationship is inverse, organic luminescent materials available for the organic luminescent layer 14 can be restricted excessively and the luminescence intensity might drop. Meanwhile, the electron mobility of the organic luminescent material is preferably rendered greater than 1/1000 of the value of the hole mobility. The reason is that too small an electric mobility can make it difficult for holes and electrons to recombine the organic luminescent layer 14 near the center and the luminescence intensity might drop again. Consequently, the hole mobility (μh) and electron mobility (μe) of the organic luminescent material of the organic luminescent layer 14 preferably satisfy the relationship of $\mu h/2 > \mu e > \mu h/500$, and yet preferably satisfy the relationship of $\mu h/3 > \mu e > \mu h/100$.

Moreover, in the present embodiment 2-1, the organic luminescent layer 14 preferably contains aromatic ring compounds having styryl groups expressed by the foregoing general formulae (2-1) to (2-3). The aromatic ring compounds having such styryl groups can be used to facilitate satisfying the condition on the electron mobility and hole mobility of the organic luminescent material of the organic luminescent layer 14 described above. Among the aromatic groups having 6 to 40 carbon atoms in the general formulae (2-1) to (2-3), the preferred 5- to 40-nucleus aryl groups include phenyl, naphthyl, anthranyl, pyrenyl, coronyl, biphenyl, terphenyl, pirrolyl, furanyl, thiophenyl, benzothiophenyl, oxadiazolyl, diphenylanthranyl, indolyl, carbazolyl, pyridyl, and benzoquinolyl.

Besides, the preferred 5- to 40-nucleus arylene groups include phenylene, naphthylene, anthranylene, phenanthrylene, pyrenylene, coronylene, biphenylene, terphenylene, pyrrolylene, furanylene, thiophenylene, benzophenylene, oxadiazolylene, diphenylanthranylene, indolylene, carbazolylene, pyridylene, and benzoquinolylene. Incidentally, the aromatic groups having 6 to 40 carbon atoms may further be substituted with substituent groups. The preferred substituent groups include 1- to 6-carbon alkyl groups (ethyl group, methyl group, i-propyl group, n-propyl group, s-butyl group, t-butyl group, pentyl group, hexyl group, cyclopentyl group, cyclohexyl group, etc.), 1- to 6-carbon alkoxyl groups (ethoxy group, methoxy group, i-propoxy group, n-propoxy group, s-butoxy group, t-butoxy group, pentoxy group, hexyloxy group, cycropentoxy group, cyclohexyloxy group, etc.), 5- to 40-nucleus aryl groups, amino groups substituted with 5- to 40-nucleus aryl groups, ester groups having 5- to 40-nucleus aryl groups, ester groups having 1- to 6-carbon alkyl groups, cyano group, nitro group, and halogen atom.

It is also preferable for the organic luminescent layer 14 to contain fluorescent brighteners of benzothiazole type, benzimidazole type, benzoxazole type and the like, compounds of styrylbenzene type, and metal complexes having 8-quinolinol derivatives as a ligand. Moreover, one having a host of distyrylarylene-skeleton organic luminescent material, such as 4,4'-bis(2,2-diphenylvinyl)biphenyl, doped with blue to red strong fluorochomes, such as fluorochromes of cumarin type or ones similar to the host, is also suitably used.

Method of Forming the Organic Luminescent Layer

Next, description will be given of a method of forming the organic luminescent layer 14. This forming method is not limited to any particular method. For example, it is possible to adopt such methods as vacuum deposition, spin coating, casting, LB method, and sputtering. For example, in the case of formation through vacuum deposition, it is preferable to satisfy the condition of 50° C. to 450° C. in deposition temperature, $1\times10^{-7}$ to $1\times10^{-3}$ Pa in vacuum, 0.01 to 50 nm/sec in the rate of film formation, and −50° C. to 300° C. in substrate temperature.

The organic luminescent layer 14 can also be formed by dissolving a binder and an organic luminescent material in a predetermined solvent, and then making it into a thin film by spin coating or the like. Incidentally, the forming method and forming condition are preferably selected as appropriate so that the organic luminescent layer 14 is a molecular deposition film, which is a thin film formed through deposition from a material compound in a vapor phase or a film formed through solidification from a material compound in a solution or liquid phase. Typically, this molecular deposition film can be fully distinguished from a thin film formed by LB method (molecular accumulation film) based on differences in cohesion structure and high-order structure as well as resulting functional differences.

Thickness of the Organic Luminescent Layer

The organic luminescent layer 14 is not limited to any particular thickness, but may select an appropriate thickness as needed depending on the circumstances. In reality, values within the range of 5 nm and 5 μm are often preferable. The reason for this is that if the thickness of the organic luminescent layer falls below 5 nm, the luminescence intensity and the durability might drop. On the other hand, when the thickness of the organic luminescent layer 14 exceeds 5 μm, the value of the voltage to be applied often becomes higher. Consequently, in view of better balance with the luminescence intensity, the value of the applied voltage, etc., the organic luminescent layer 14 preferably has a thickness within the range of 10 nm and 3 μm, and yet preferably a thickness within the range of 20 nm and 1 μm.

(3) Cathode Layer

The cathode layer 16 is preferably made of metals, alloys, or electroconductive compounds having a small work function (for example, below 4.0 eV), or mixtures of these. Specifically, one of magnesium, aluminum, indium, lithium, sodium, cesium, silver, and the like may be used alone, or two or more types thereof in combination. The cathode layer 16 is not limited to any particular thickness, either, whereas it is preferably given a value within the range of 10 and 1000 nm, and yet preferably a value within the range of 10 and 200 nm.

(4) Miscellaneous

Although not shown in FIG. 3, it is also preferable that a sealing layer for preventing moisture and oxygen from getting into the organic EL device 100 is arranged so as to cover the entire organic EL device 100. Preferred materials of the sealing layer include: copolymers obtained by copolymerizing tetrafluoroethylene and monomer mixtures including at least one type of comonomer; fluorine-containing copolymers having a ring structure in their copolymer main chain; and copolymers of polyethylene, polypropylene, polymethylmethacrylate, polyimide, polyuria, polytetrafluoroethylene, polychlorotrifluoroethylene, polydichlorofluoroethylene, or chrolotrifluoroethylene with dichlorodifluoroethylene.

The preferred materials of the sealing layer also include: water-absorbing substances having an absorptivity of 1% or higher; moisture-proof substances having an absorptivity of 0.1% or lower; metals such as In, Sn, Pb, Au, Cu, Ag, Al, Ti, and Ni; metal oxides such as MgO, SiO, $SiO_22$, GeO, NiO, CaO, BaO, $Fe_2O$, $Y_2O_3$, and $TiO_2$; metal fluorides such as $MgF_2$, LiF, $AlF_3$, and $CaF_2$; liquid fluorocarbons such as perfluoroalkane, perfluoroamine, and perfluoropolyether; and compositions of those liquid flurocarbons in which absorbents for absorbing moisture and oxygen are dispersed.

To form the sealing layer, it is possible to employ vacuum deposition, spin coating, sputtering, casting, MBE (molecular beam epitaxy), cluster ion beam deposition, ion plating, plasma polymerization (high frequency excitation ion plating), reactive sputtering, plasma CVD, laser CVD, thermal CVD, gas-source CVD, and the like as appropriate.

Embodiment 2-2

Figure 4:
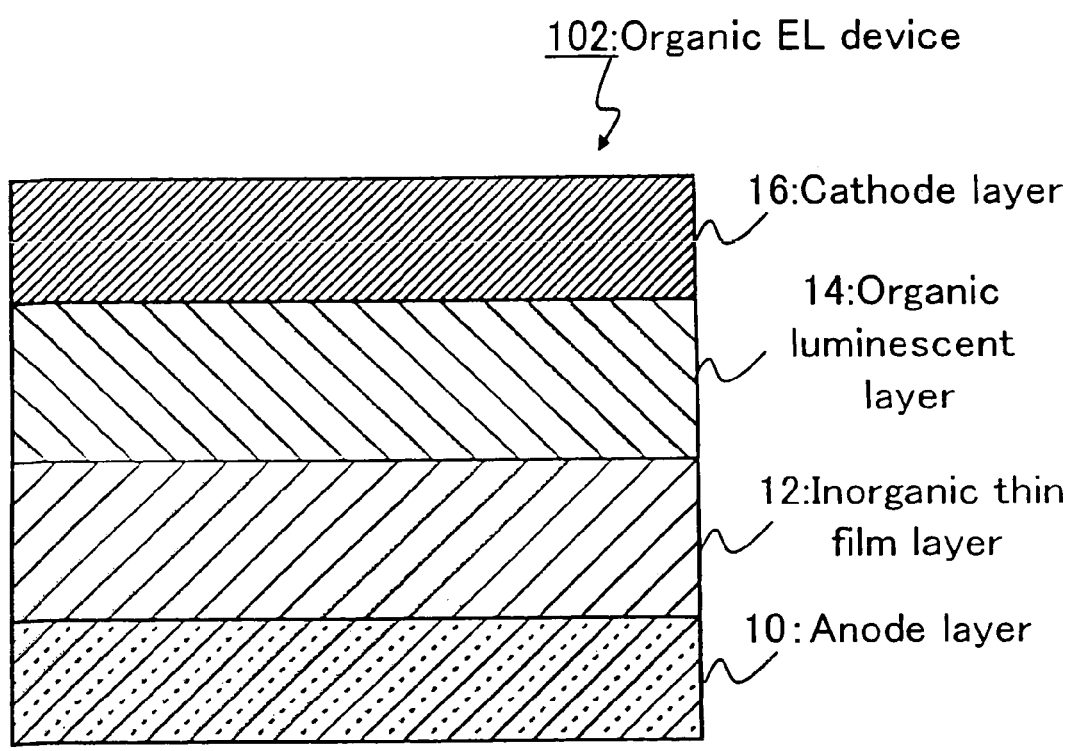
FIG. 4 is a sectional view of an organic EL device in an embodiment 2-2.

Next, with reference to FIG. 4, description will be given of an embodiment 2-2 of this invention. FIG. 4 is a sectional view of an organic EL device 102 according to the embodiment 2-2, showing the device having the structure that an anode layer 10, an inorganic thin film layer 12, an organic luminescent layer 14, and a cathode layer 16 are laminated on a substrate (not shown) in succession. When the inorganic thin film layer 12 is provided thus, injected holes can be transported effectively. Consequently, the provision of the inorganic thin film layer 12 allows low-voltage driving and improves the durability of the organic EL device 102.

Incidentally, the organic EL device 102 of the embodiment 2-2 is characterized in that the inorganic thin film layer 12 is interposed between the anode layer 10 and the organic luminescent layer 14. In other respects, it has the same structure as that of the organic EL device 100 of the embodiment 2-1.

Hence, the following description will deal mainly with the inorganic thin film layer 12 which is the characteristic part of the embodiment 2-2. See the description of the embodiment 2-1 for the rest of the components, such as the cathode layer 16, since they have the same configuration as in the first embodiment.

Now, the inorganic compounds available to constitute the inorganic thin film layer 12 include combinations of the compounds of the group A (group A-1 or group A-2) and the group B (group B-1 or group B-2) which constitute the anode layer 10 described above. Thus, as in the anode layer 10, the content of such a group B compound is preferably given a value within the range of 0.5 and 50 at. %, yet preferably a value within the range of 1.0 and 40 at. %, and even more preferably a value within the range of 5.0 and 30 at. % with the total amount of the inorganic thin film layer as 100 at. %. It is also preferable that the thickness and forming method thereof are the same as those of the anode layer 10.

Nevertheless, when the inorganic thin film layer 12 is arranged between the anode layer 10 and the organic luminescent layer 14, the anode layer 10 and the inorganic thin film layer 14 must be given different compositions. Specifically, the anode layer 10 is preferably made of the compounds of group A (group A-1 or group A-2)/group B (group B-1 or group B-2)=70 to 90 at. %/0.5 to 10 at. % while the inorganic thin film layer 12 the inorganic compounds of group A (group A-1 or group A-2)/group B (group B-1 or group B-2)=50 to below 90 at. %/above 10 at. % to 50 at. %. The reason for this is that if the amount of the group B (group B-1 or group B-2) compound falls outside this range, there can occur a drop in transparency and an increase in specific resistance which are unfavorable for electrodes.

Embodiment 2-3

Figure 5:
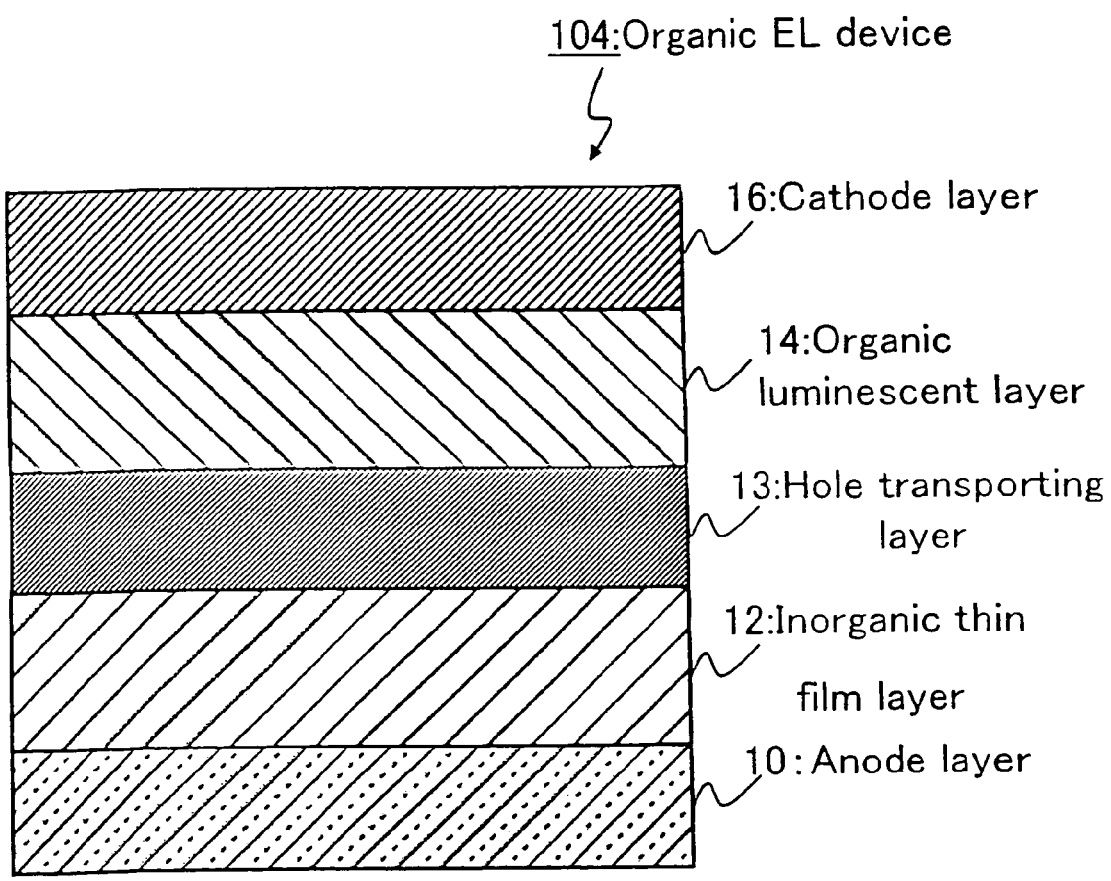
FIG. 5 is a sectional view of an organic EL device in an embodiment 2-3.

Next, with reference to FIG. 5, description will be given of an embodiment 2-3 of this invention. FIG. 5 is a sectional view of an organic EL device 104 according to the embodiment 2-3, showing the device having the structure that an anode layer 10, an inorganic thin film layer 12, a hole transporting layer 13, an organic luminescent layer 14, and a cathode layer 16 are laminated on a substrate (not shown) in succession.

In the present embodiment 2-3, the provision of the hole transporting layer 13 in addition to the embodiments 2-1 and 2-2 allows efficient transportation of injected holes. Consequently, the provision of the hole transporting layer 13 allows low-voltage driving and improves the durability of the organic EL device 104.

Incidentally, the organic EL device 104 of the present embodiment 2-3 has the same structure as that of the organic EL device 102 of the embodiment 2-2 except that the hole transporting layer 13 is interposed between the inorganic thin film layer 12 and the organic luminescent layer 14. Hence, the following description will deal mainly with the hole transporting layer 13 which is the characteristic part of the embodiment 2-3. See the description of the foregoing embodiments 2-1 and 2-2 for the rest of the components, such as the cathode layer 16, since they may be configured the same as in the embodiments 2-1 and 2-2.

(1) Constituent Material of the Hole Transporting Layer 13

The hole transporting layer 13 is preferably made of an organic compound or inorganic compound. Such organic materials include, for example, phthalocyanine compounds, diamine compounds, diamine-containing oligomers, and thiophene-containing oligomers. Preferred materials of the inorganic compound include, for example, amorphous silicon (α-Si), α-SiC, microcrystalline silicon (μC—Si), μC—SiC, II-VI family compounds, III-V family compounds, noncrystalline carbon, crystalline carbon, and diamond. Among other types of the inorganic material are oxides, fluorides, and nitrides. To be more specific, $Al_2O_3$, SiO, $SiO_x$ ($1 \leq x \leq 2$), GaN, InN, GaInN, $GeO_x$ ($1 \leq x \leq 2$), LiF, SrO, CaO, BaO, $MgF_2$, $CaF_2$, $UgF_2$, $SiN_x$ ($1 \leq x \leq 4/3$), and the like can be used alone, or two or more types thereof in combination. Besides, the constituent material is preferably selected so that the hole mobility has a value of $1 \times 10^6$ $cm^2/V \cdot s$ or greater (applied voltage of $1 \times 10^4$ to $1 \times 10^6$ V/cm), and the ionization potential has a value of 5.5 eV or lower.

(2) Structure and Forming Method of the Hole Transporting Layer 13

The hole transporting layer 13 is not limited to the single-layer structure, but may have a double-layer structure or a triple-layer structure, for example. The hole transporting layer 13 is not limited to any particular thickness, either, whereas a value within the range of 0.5 nm and 5 μm is preferable. The hole transporting layer 13 is not limited to any particular forming method, either. A variety of methods can be adopted. In reality, however, it is preferable to adopt the same method as the method of forming the hole injection layer.

Embodiment 2-4

Figure 6:
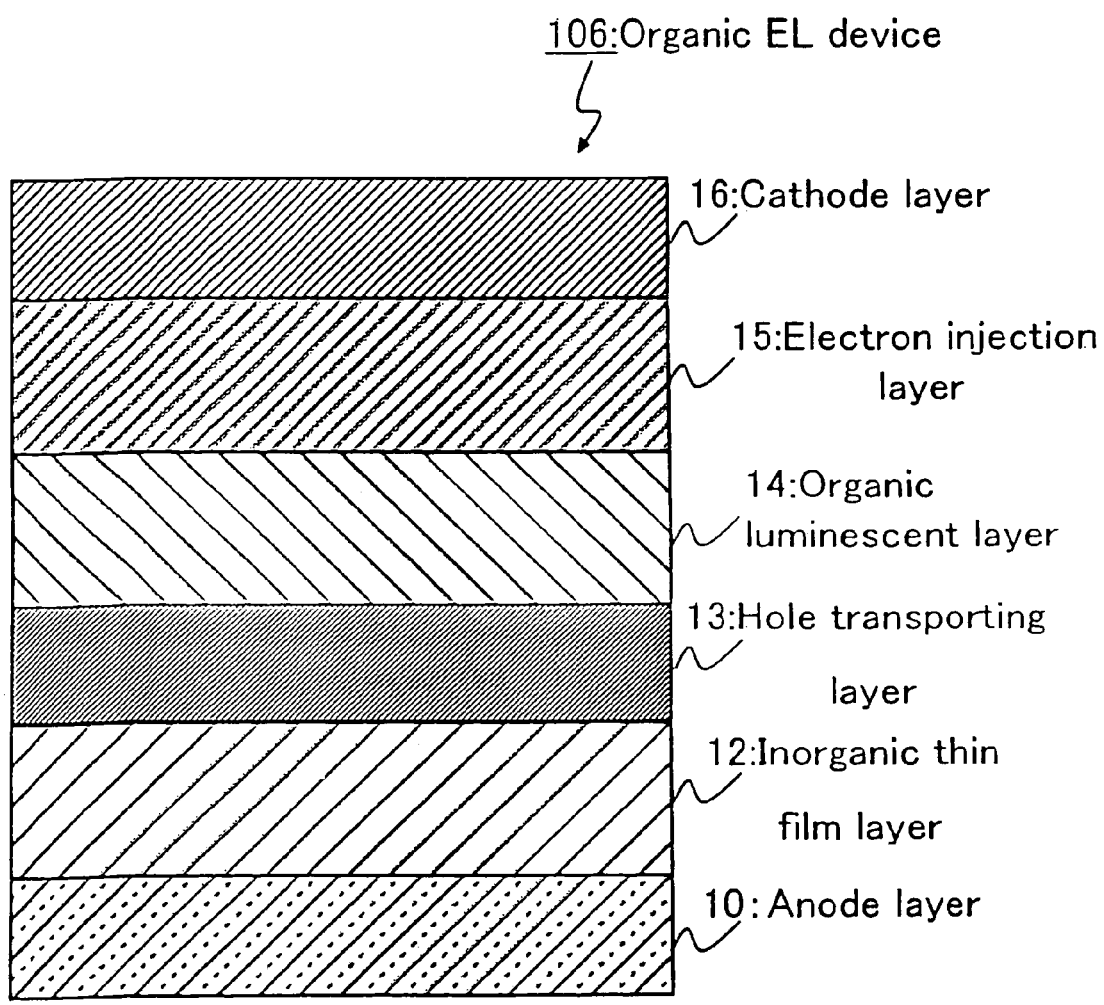
FIG. 6 is a sectional view of an organic EL device in an embodiment 2-4.

Next, with reference to FIG. 6, description will be given of an embodiment 2-4 of this invention. FIG. 6 is a sectional view of an organic EL device 106 according to the embodiment 2-4, showing the device having the structure that an anode layer 10, an inorganic thin film layer 12, a hole transporting layer 13, an organic luminescent layer 14, an electron injection layer 15, and a cathode layer 16 are laminated on a substrate (not shown) in succession. As above, in the embodiment of the present section 4, the provision of the electron injection layer 15 allows the function of injecting electrons effectively. The provision of the electron injection layer 15 thus facilitates moving electrons to the organic luminescent layer 14, with an improvement to the responsivity of the organic EL device 106.

Incidentally, the organic EL device 106 of the embodiment 2-4 is characterized in that the electron injection layer 15 is interposed between the organic luminescent layer 14 and the cathode layer 16. Except this, the organic EL device 106 of the embodiment 2-4 has the same structure as that of the organic EL device 104 of the embodiment 2-3. Hence, the following description will deal mainly with the electron injection layer 15 which is the characteristic part of the embodiment 2-4. The rest of the components may adopt the same configurations as in the embodiments 2-1 to 2-3 described above, or typical publicly-known configurations in the field of organic EL devices.

(1) Constituent Material of the Electron Injection Layer

The electron layer 15 is preferably made of an organic compound or inorganic compound. In particular, organic compounds can be used to constitute an organic EL device that has excellent electron injectability from the cathode as well as an excellent durability. Here, preferred organic compounds include 8-hydroxyquinoline and oxadiazol, and derivatives thereof such as metal chelate oxinoid compounds containing 8-hydroxyquinoline.

When the electron injection layer 15 is made of an inorganic compound, this inorganic compound preferably uses an insulator or semiconductor. The electron injection layer 15, when made of an insulator or semiconductor, can effectively avoid current leak and improve electron injectability. For such an insulator, it is preferable to use at least one metal compound selected from the group consisting of alkaline metal chalcogenides (oxides, sulfides, selenides, tellurides), alkaline earth metal chalcogenides, halides of alkaline metals, and halides of alkaline earth metals. When the electron injection layer 15 is made of these alkaline metal chalcogenides or the like, the electron injectability is preferably improved further.

Specifically, the preferred alkaline metal chalcogenides include $Li_2O$, LiO, $Na_2S$, $Na_2Se$, and NaO, for example. The preferred alkaline earth metal chalcogenides include CaO, BaO, SrO, BeO, BaS, and CaSe, for example. In addition, the preferred halides of alkaline metals include LiF, NaF, KF, LiCl, KCl, and NaCl, for example. The preferred halides of alkaline earth metals include, for example, fluorides such as $CaF_2$, $BaF_2$, $SrF_2$, $MgF_2$, and $BeF_2$, and halides other than fluorides.

Now, when the electron injection layer 15 is made of a semiconductor, preferred semiconductors include oxides, nitrides, or nitric oxides containing at least one element out of Ba, Ca, Sr, Yb, Al, Ga, In, Li, Na, Cd, Mg, Si, Ta, Sb, and Zn. They can be used alone, or two or more types thereof in combination. Moreover, it is preferable that the inorganic compound for constituting the electron injection layer 15 is a microcrystalline or noncrystalline insulative thin film. The electron injection layer 15, when made of these insulative thin films, can form a more homogenous thin film to reduce defective pixels such as dark spots. Incidentally, such inorganic compounds include the alkaline metal chalcogenides, the alkaline earth metal chalcogenides, the halides of alkaline metals, and the halides of alkaline earth metals described above.

(2) Electron Affinity

Now, the electron injection layer 15 according to the embodiment 2-4 preferably has an electron affinity within the range of 1.8 and 3.6 eV. When the electron affinity falls below 1.8 eV in value, the electron injectability drops with the tendency toward higher driving voltage and lower luminescent efficiency. When the electron affinity exceeds 3.6 eV in value, on the other hand, the probability of occurrence of complexes having lower luminescent efficiency increases while it becomes possible to suppress the occurrence of blocking junction effectively. Thus, the electron affinity of the electron injection layer is preferably given a value within the range of 1.9 and 3.0 eV, and yet more preferably a value within the range of 2.0 and 2.5 eV. Moreover, the difference in electron affinity between the electron injection layer 15 and the organic luminescent layer 14 preferably has a value of 1.2 eV or smaller, and yet preferably a value of 0.5 eV or smaller. The smaller this difference in electron affinity is, the easier the election injection from the electron injection layer 15 to the organic luminescent layer 14 becomes. This makes it possible to constitute the organic EL device 106 of improved responsivity.

(3) Energy Gap

The electron injection layer 15 according to the embodiment 2-4 preferably has an energy gap (band gap energy) of 2.7 eV or greater, and yet preferably a value of 3.0 eV or greater. When the energy gap is thus set at or above a predetermined value, e.g., a value as great as or above 2.7 eV, it is possible to reduce the chance that holes reach the electron injection layer 15 beyond the organic luminescent layer 14. This can improve the efficiency of the recombination between holes and electrons, enhancing the luminescence intensity of the organic EL device 106. It is also possible to prevent the electron injection layer 15 itself from emitting light.

(4) Structure

Now, description will be given of the structure of the electron injection layer 15 that is made of an inorganic compound. This electron injection layer 15 is not limited to any particular structure, but may have a single-layer structure, double-layer structure, or triple-layer structure, for example. Moreover, the electron injection layer 15 is not limited to any particular thickness, either. Various thicknesses may be employed depending on the circumstances. In reality, values within the range of, e.g., 0.1 nm and 1000 nm are preferable. The reason for this is that when the electron injection layer 15 made of an inorganic compound falls below 0.1 nm in thickness, there may occur a drop in electron injectability or a drop in mechanical strength. On the other hand, when the electron injection layer 15 made of an inorganic compound exceeds 1000 nm in thickness, it becomes high in resistance, possibly deteriorating the responsivity of the organic EL device 106, i.e., making quick response difficult, or requiring time for film formation. Consequently, the electron injection layer 15 made of an inorganic compound preferably has a thickness within the range of 0.5 and 100 nm, and yet more preferably a thickness within the range of 1 and 50 nm.

(5) Forming Method

Next, description will be given of a method of forming the electron injection layer 15. The electron injection layer 15 is not limited to any particular forming method as long as it can be formed as a thin film layer of uniform thickness. Various types of methods, such as vacuum deposition, spin coating, casting, LB method, and sputtering, are applicable.

Embodiment 2-5

Now, description will be given of an embodiment 2-5 of the present invention. In the embodiment 2-5, a plurality of inorganic compounds can be used to achieve an anode layer 16 of excellent etching property and transparency in which the constituent materials are in uniform composition ratios. As a result, a fabrication method is provided by which an organic EL device of low driving voltage, excellent luminescence intensity, and excellent durability can be obtained with efficiency. That is, a first characteristic of the embodiment 2-5 lies in that the anode layer 16 is formed by using certain targets and sputtering method. Moreover, in the embodiment 2-5, for example, a plurality of organic luminescent materials can be used to achieve an organic luminescent layer 14 in which the constituent materials are in uniform composition ratios. As a result, a fabrication method is provided by which an organic EL device of low driving voltage, high luminescence intensity, and excellent durability can be obtained with efficiency. That is, a second characteristic of the embodiment 2-5 lies in that the organic luminescent layer 14 is made of a plurality of organic compounds by using a certain vacuum deposition method.

In order to obtain the organic EL device having the property that its constituent materials are in uniform composition ratios, at least the anode layer 10 and the organic luminescent layer 14 are preferably formed under a consistent identical vacuum condition without being exposed to the air. A third characteristic of the embodiment 2-5 lies in the sharing of a vacuum chamber for exercising sputtering and a vacuum chamber for exercising vacuum deposition. The reason is to obtain an organic EL device having the property that the constituent materials are in uniform composition ratios. Then, in the embodiment 2-5, a single vacuum chamber is provided not only with a heating unit and substrate holding means necessary for exercising sputtering but also with a heating unit, evaporation sources, and the like for exercising vacuum deposition. This allows the sharing of the vacuum tube for exercising sputtering and the vacuum chamber for exercising vacuum deposition. Incidentally, as a modified example of the embodiment 2-5, it is possible to employ the configuration that the vacuum chamber for sputtering and the vacuum chamber for vacuum deposition are arranged separately and are connected to each other in advance. According to such a modification, a substrate given vacuum deposition can be then transported into the vacuum chamber for sputtering by a predetermined transportation unit, with the same result as in the case of sharing the vacuum chamber. For ease of understanding, the organic EL device to be described in the present embodiment 2-5 shall have the same configuration as that of the embodiment 2-5.

According to the fabrication method employed in the embodiment 2-5, the layers shown below were formed by the respective corresponding fabrication methods:

Anode layer 10: high frequency magnetron sputtering;
Inorganic thin film layer 12: high frequency magnetron sputtering;
Hole transporting layer 13: vacuum deposition;
Organic luminescent layer 14: vacuum deposition;
Electron injection layer 15: vacuum deposition; and
Cathode layer 16: vacuum deposition.

(1) Formation of the Anode Layer and the Inorganic Thin Film Layer

In forming the anode layer 10 and the inorganic thin film layer 12 by high frequency magnetron sputtering, it is preferable to use a target that is made of compounds of the group A (group A-1 or group A-2) and the group B (group B-1 or group B-2). Specifically, the target must contain at least the group A (group A-1 or group A-2) and the group B (group B-1 or group B-2) in predetermined proportions. Moreover, the target (1 μm or less in average particle diameter), or raw material, is preferably obtained by being mixed uniformly by using a solution method (coprecipitation method) (concentration: 0.01 to 10 mol/liter; solvent: polyhydric alcohol or the like; precipitating agent: potassium hydroxide or the like) and a physical mixing method (mill: ball mill, bead mill, or the like; mixing period: 1 to 200 hours) and then sintered (at temperatures of 1200° C. to 1500° C., for a period of 10 to 72 hours or preferably 24 to 48 hours), followed by molding (press molding, HIP molding, or the like) Here, the rate of temperature rise during the molding preferably falls within the range of 1 and 50° C./minute in value. The target obtained by these methods is characterized by having the property that its constituent materials are in uniform composition ratios. Incidentally, since the composition ratios and the like can be adjusted by the sputtering condition alone, it is also preferable that the compounds of the group A (group A-1 or group A-2) and the group B (group B-1 or group B-2) are sputtered separately.

The sputtering condition is not limited to any particular one, whereas it is preferable to employ the condition of: in argon or other inert gas; 0.3 to 4 W in plasma output per a 1-cm$^2$ surface area of the target; $1\times10^{-7}$ to $1\times10^{-3}$ Pa in vacuum; 0.01 to 50 nm/sec in the rate of film formation; 5 to 120 minutes in the period of film formation; and $-50°$ C. to $300°$ C. in substrate temperature. The reason is that such a sputtering condition is cost-effective and capable of forming a dense anode layer 16 and inorganic thin film layer 12 having uniform film thicknesses.

(2) Formation of the Organic Luminescent Layer 14

Figure 7:
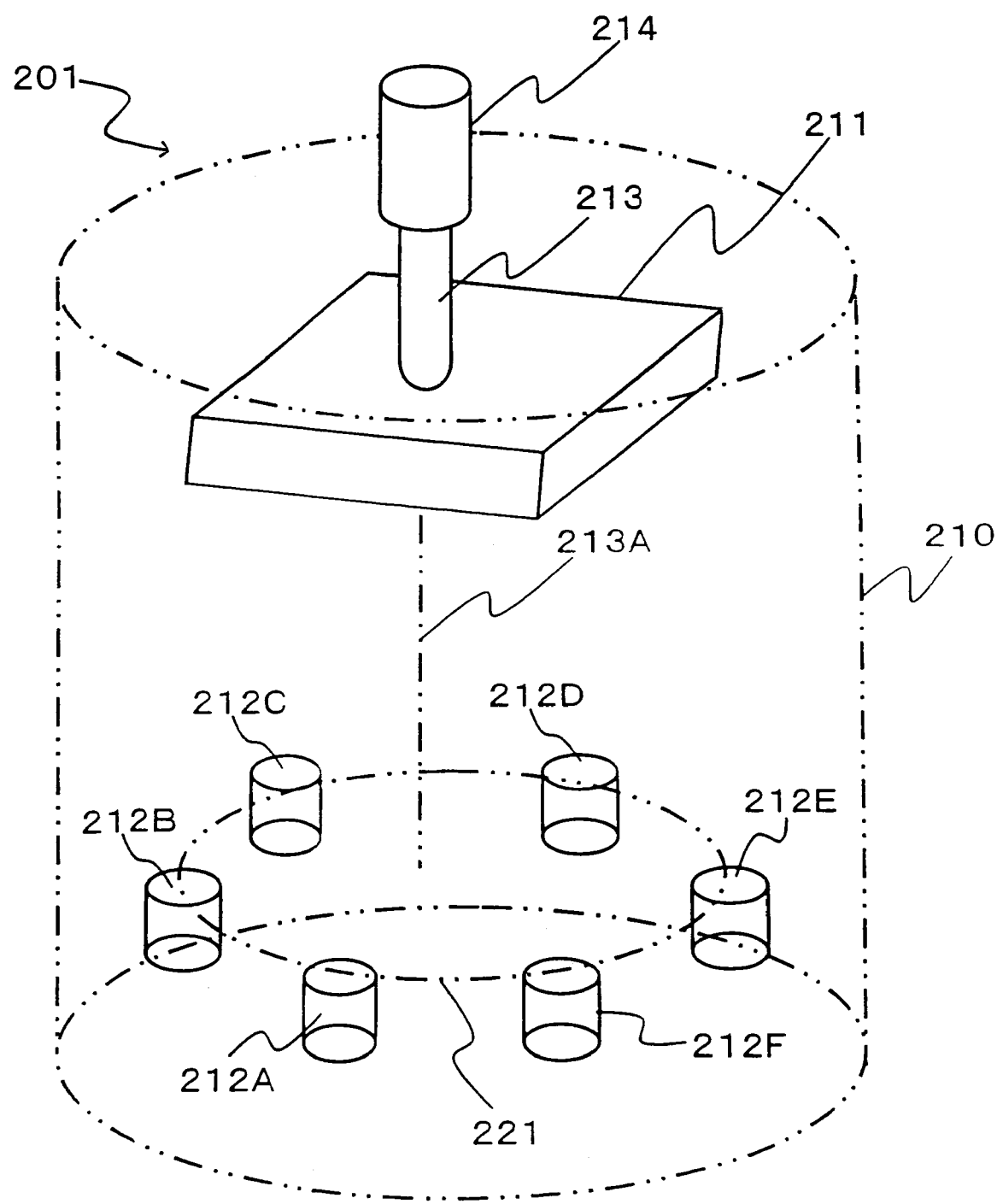
FIG. 7 is a perspective view of a vacuum evaporator in an embodiment 2-5.
Figure 8:
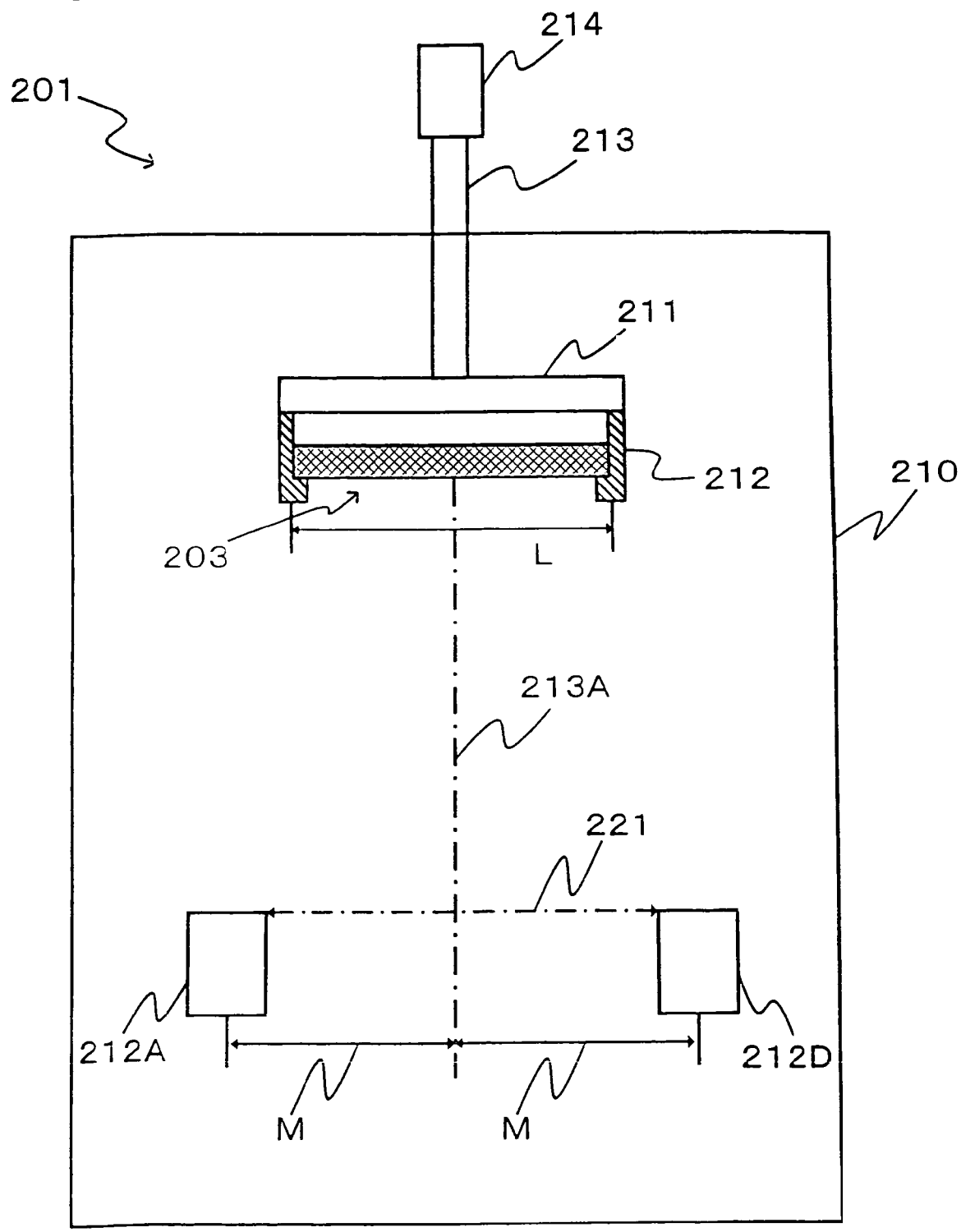
FIG. 8 is a sectional view of the vacuum evaporator in the embodiment 2-5.

With reference to FIGS. 7 and 8, description will be given of the method of forming the organic luminescent layer 14 by evaporating different evaporation materials at the same time. Initially, the rotation axis 213A for a substrate 203 to make self rotation about is set on that substrate 203 by using a vacuum evaporator 201. Next, evaporation sources 212A to 212F are arranged at positions each away from the rotation axis 213A of the substrate 203, and the substrate 203 is rotated about itself. At the same time, various evaporation materials are evaporated simultaneously from the plurality of evaporation sources 212A to 212F which are arranged opposite to the substrate 203, thereby exercising deposition. The organic luminescent layer 14 can be obtained in this way.

Here, the vacuum evaporator 201 shown in FIGS. 7 and 8 comprises: a vacuum chamber 210; a substrate holder 211 for fixing the substrate 203 to the inner top part of this vacuum chamber 210; and the plurality (six) of evaporation sources 212A to 212F to be filled with evaporation materials, opposed to and arranged below this substrate holder 211. This vacuum chamber 210 is configured capable of maintaining its interior in a predetermined depressurized state by using exhaust means (not shown). Incidentally, while six evaporation sources are shown in the diagram, the number of evaporation sources is not limited thereto but may be five or less, or seven or more.

Now, the substrate holder 211 has a holding part 212 for holding the periphery of the substrate 203, and is configured to hold the substrate 203 horizontally in the vacuum chamber 210. A rotating shaft part 213 for making the substrate 203 rotate (about itself) is erected vertically at the center of the top surface of this substrate holder 211. This rotating shaft portion 213 is connected with a motor 214, rotating and agitating means. By the rotational operation of the motor 214, the substrate 203 held by the substrate holder 211 makes self rotation about the rotating shaft portion 213, along with the substrate holder 211. That is, the vertical rotation axis 213A is established at the center of the substrate 203 by means of the rotating shaft portion 213.

Next, concrete description will be given of the method of forming the organic luminescent layer 12 on the substrate 203 out of two types of organic luminescent materials (host material and dopant material) by using the vacuum evaporator 201 configured thus. Initially, the substrate 203 of flat square shape as shown in FIG. 7 is prepared. This substrate 203 is locked to the holding part 212 of the substrate holder 211 in a horizontal state. In this respect, the substrate 203 shown in FIG. 7 being held in a horizontal state means that the substrate 203 is locked to the holding part 212 of the substrate holder 211 in a horizontal state.

Here, in forming the organic luminescent layer 12, the two evaporation sources 212B and 212C adjoining on an imaginary circle 221 are filled with the host material and the dopant material, respectively. After the filling, the vacuum chamber 210 is depressurized inside by the exhaust means to a predetermined vacuum such as $1.0\times10^{-4}$ Torr. Then, the evaporation sources 212B and 212C are heated so that the host material and the dopant material evaporate from the respective evaporation sources 212B and 212C simultaneously. In the meantime, the motor 214 is rotated for agitation, whereby the substrate 203 is rotated at a predetermined speed, such as 1 to 100 rpm, about the rotation axis 213A. In this way, the substrate 203 makes self rotation while the host material and the dopant material are co-evaporated to form the organic luminescent layer 12. Here, as shown in FIG. 8, the evaporation sources 212B and 212C are arranged at positions off the rotation axis 213A of the substrate 203 by a predetermined distance M in horizontal directions. Thus, the rotation of the substrate 203 can change the angles of incident of the evaporation materials, such as the host material and the dopant material, on the substrate 203 regularly. This allows the evaporation materials to adhere to the substrate 203 uniformly, so that a thin film layer having evaporation materials of uniform composition ratios can be surely formed within the film surface of the electrode injection layer 15. For example, it is possible to form a thin film layer having concentration variations of ±10% (on a mole basis) Moreover, when the evaporation is performed thus, no revolution is required of the substrate 203. This eliminates the need for intended space and equipment, allowing economic film formation in a minimum space. Here, the revolution of the substrate 203 refers to rotation about any rotating axis other than that of the substrate. It requires space wider than in the case of self rotation.

Now, in exercising the simultaneous evaporation, the substrate 203 is not limited to any particular shape. Take, for example, the case shown in FIG. 7 where the substrate 203 has the shape of a short plate and all the sides of the substrate 203 are identical in length. Here, the plurality of evaporation sources 212A to 212F are arranged along the circumference of the imaginary circle 221 around the rotation axis 213a of this substrate 203. The short-plate shape preferably satisfies $M>(1/2)\times L$, where M is the radius of the imaginary circle 221 and L is the length of a side of the substrate 203. On the other hand, when the sides of the substrate 203 are not identical but different in length, L shall be the length of the longest side. In such configurations, the angles at which evaporation materials are incident on the substrate 203 from the plurality of evaporation sources 212A to 212F can be rendered identical, so that the composition ratios of the evaporation materials can be controlled more easily. Besides, due to such configurations, the evaporation materials are evaporated at a certain angle of incidence on the substrate 203. The absence of vertical incidence can further improve the uniformity of the composition ratios within the film surface.

Moreover, in exercising the fabrication method of the embodiment 2-5, as shown in FIG. 7, the plurality of evaporation sources 212A to 212F are preferably arranged on the circumference of the imaginary circle 221 around the rotation axis 213A of the substrate 203, the individual evaporation sources 212A to 212F being arranged at angles of $360°/n$ about the center of the imaginary circle 221, where n is the number of evaporation sources 212A to 212F to be arranged. For example, when six evaporation sources 212 are to be arranged, they are suitably arranged at angles of $60°$ about the center of the imaginary circle 221. In such arrangement, the plurality of evaporation materials can be formed in layers successively on each portion of the substrate 203. It is therefore possible to form a thin film layer whose composition ratios vary regularly in the direction of the film thickness.

Next, description will be given in more detail of the composition uniformity of the organic luminescent layer 14 that is formed by the simultaneous evaporation method described above. By way of example, Alq was used as the host material and Cs as the dopant. The substrate 203 shown in FIG. 9 was rotated at 5 rpm while a thin film layer having a thickness of approximately 1000 angstroms (setting) was simultaneously deposited under the following condition:

Deposition rate of Alq: 0.1 to 0.3 nm/s;
Deposition rate of Cs: 0.1 to 0.3 nm/s; and
Thickness of Alq/Cs: 1000 angstroms (setting).

Figure 19:
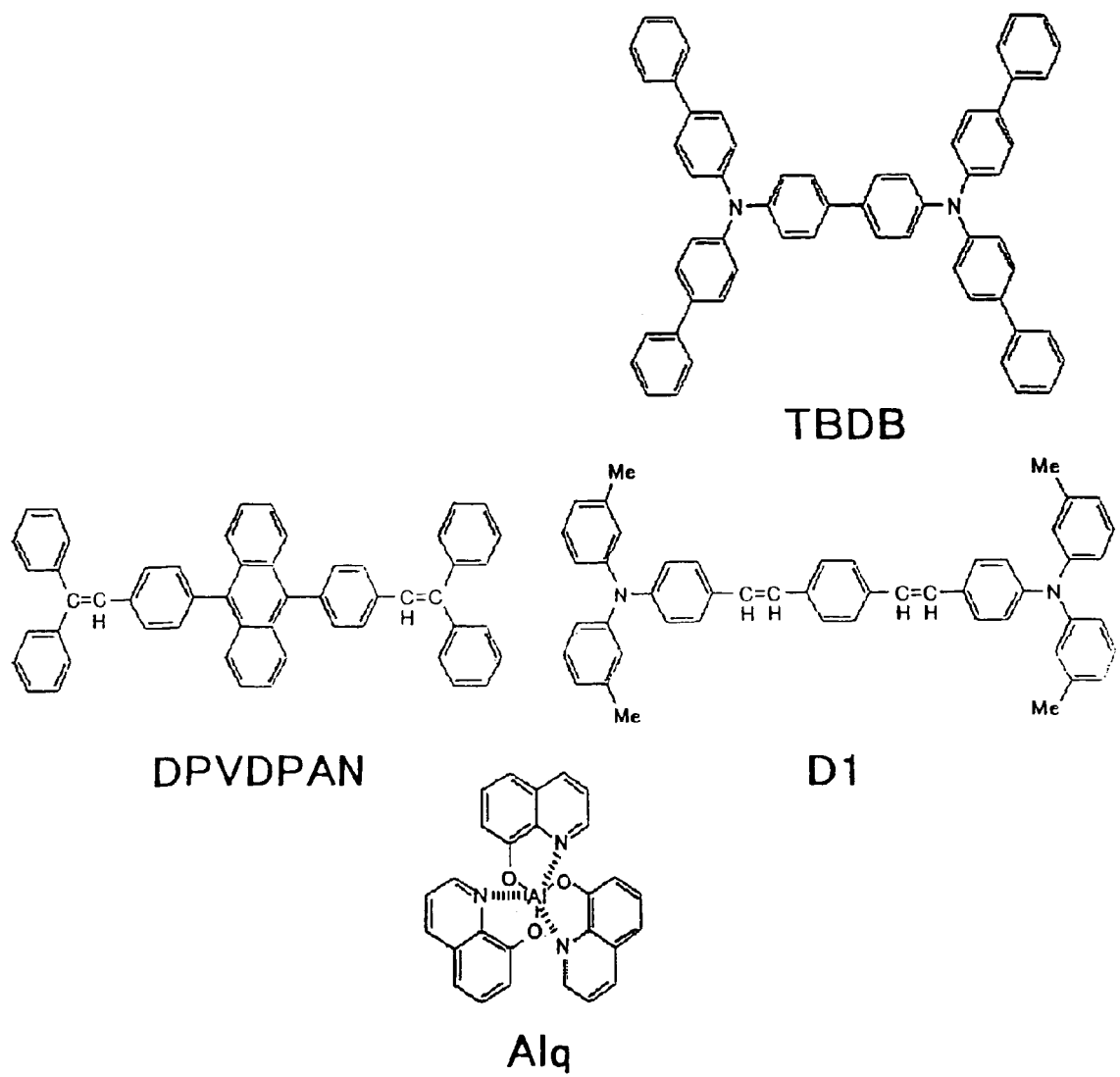
FIG. 19 is a diagram showing the chemical formulae of various substances.

Incidentally, the chemical structural formula of Alq is shown in FIG. 19.

Figure 9:
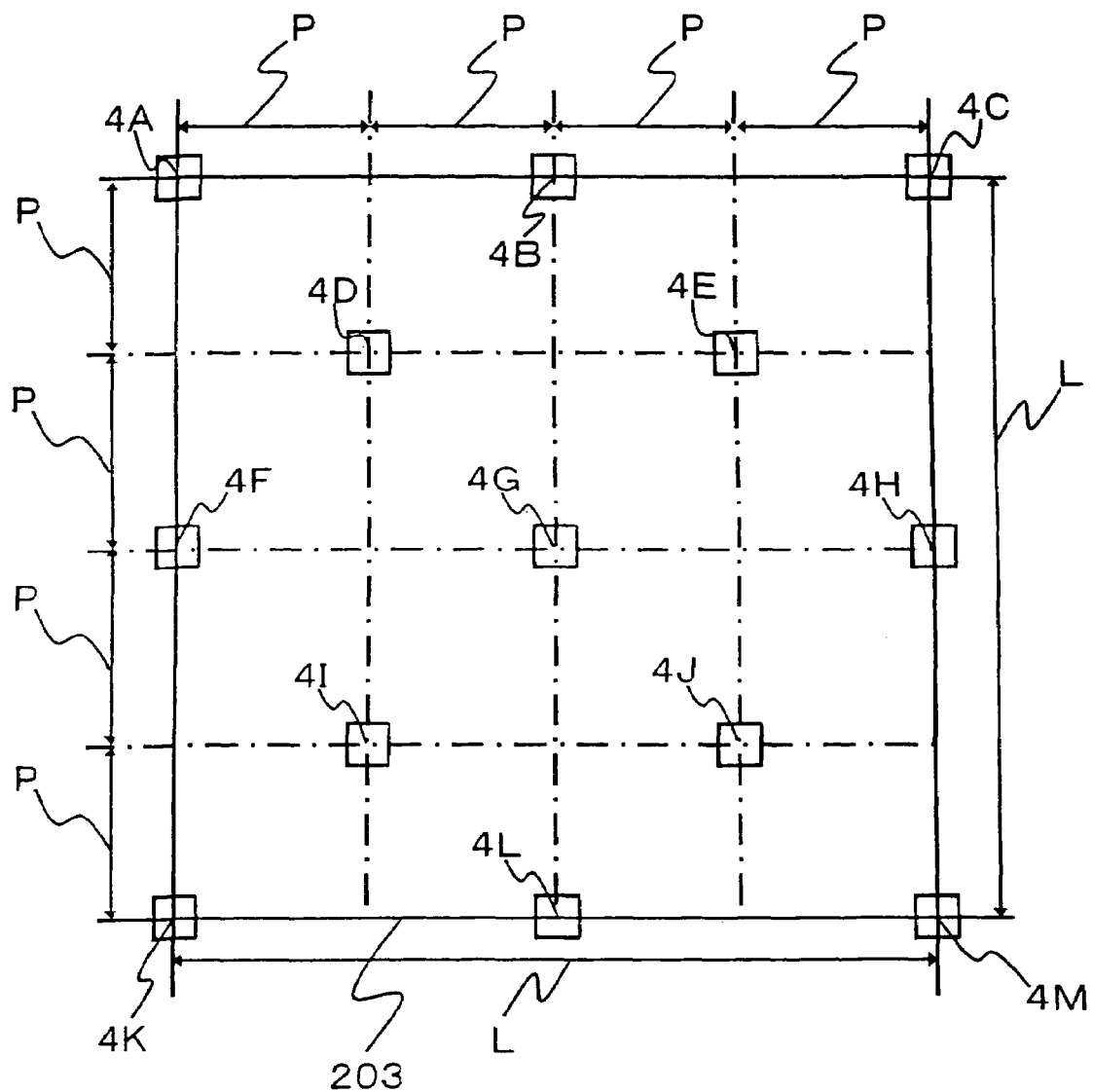
FIG. 9 is a diagram for use in explaining measuring points on a substrate.
Figure 10:
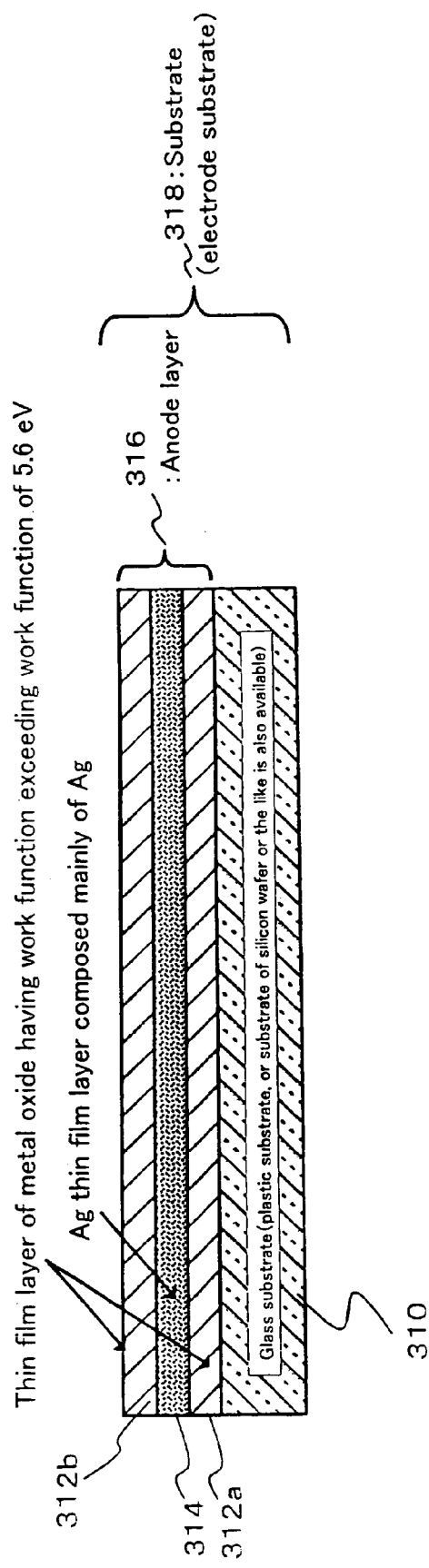
FIG. 10 is a sectional view of an electrode substrate in the present embodiment.
Figure 11:
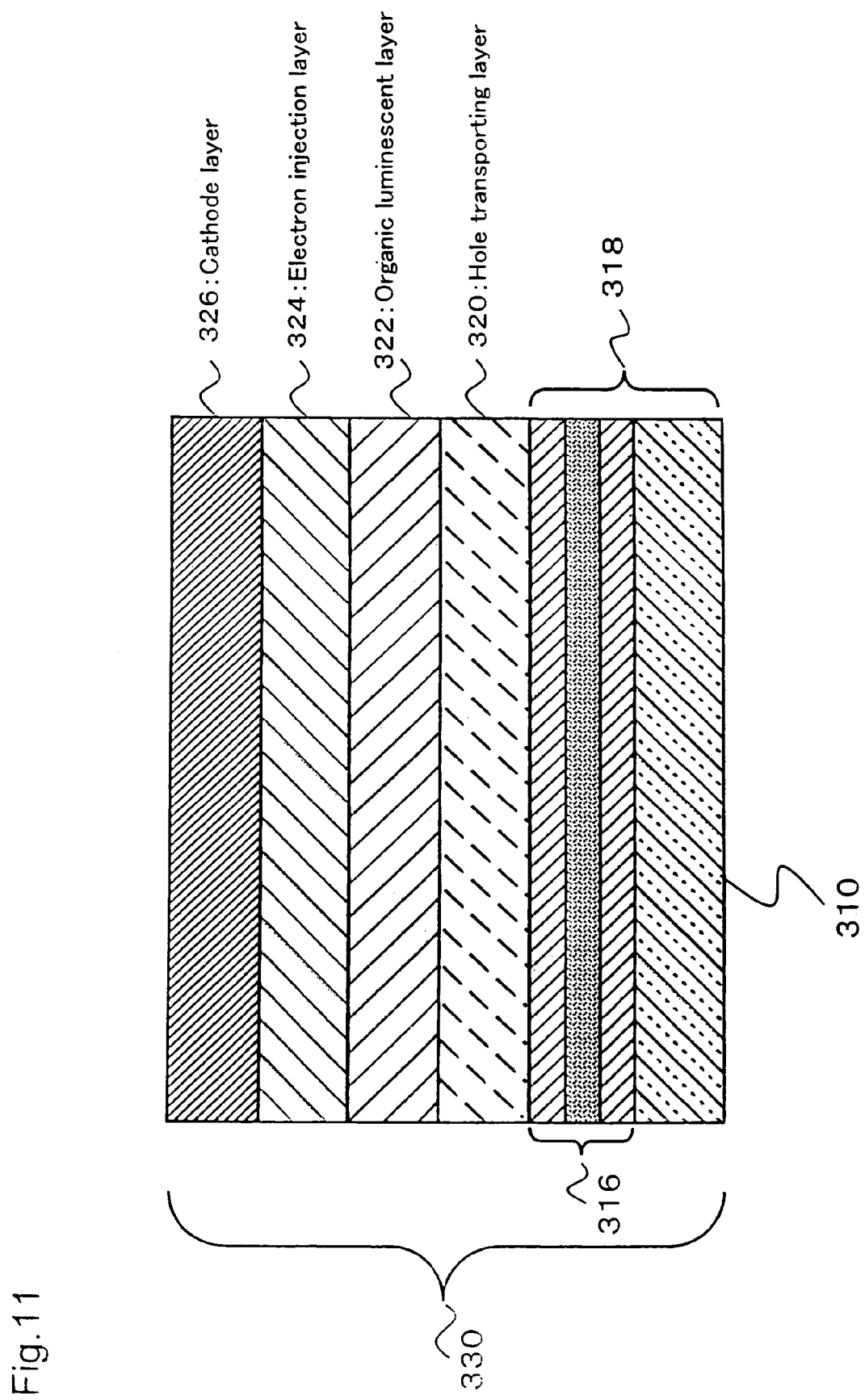
FIG. 11 is a sectional view of an organic EL device in the present embodiment.

Next, the thin film layer obtained was measured for thicknesses at measuring points (4A to 4M) on the glass substrate 203 shown in FIG. 9 by using a contact type film thickness meter. It was also measured for Cs/Al (Al in Alq) composition ratios (atomic ratios) by using an X-ray photoelectron spectroscope (XPS). Incidentally, the measuring points (4A to 4M) on the glass substrate 203 shown in FIG. 9 are arbitrary corners (13 points) of 16 equal sections having a square shape with each side of 50 mm in length P, into which the surface of the substrate 203 is divided in advance. Table 2-1 shows the results obtained.

"Table 2-1"

TABLE 2-1

| Measuring point | Thickness(A) | Cs/Al |
| --- | --- | --- |
| 4A | 1053 | 1.0 |
| 4B | 1035 | 1.0 |
| 4C | 1047 | 1.0 |
| 4D | 1088 | 1.1 |
| 4E | 1091 | 1.0 |
| 4F | 1093 | 1.1 |
| 4G | 1082 | 1.1 |
| 4H | 1075 | 1.0 |
| 4I | 1082 | 1.1 |
| 4J | 1065 | 1.1 |
| 4K | 1010 | 1.0 |
| 4L | 1008 | 1.0 |
| 4M | 1025 | 1.0 |

Meanwhile, a thin film layer having a thickness of approximately 1000 angstroms (setting) was formed under the same evaporation condition as in the foregoing simultaneous evaporation method except that the glass substrate 203 was not rotated. The thin film layer obtained was measured for thicknesses and Cs/Al composition ratios (atomic ratios) at the measuring points (4A to 4M). Table 2-2 shows the results.

"Table 2-2"

TABLE 2-2

| Measuring point | Thickness(A) | Cs/Al |
| --- | --- | --- |
| 4A | 895 | 0.6 |
| 4B | 941 | 1.1 |
| 4C | 884 | 1.1 |
| 4D | 911 | 0.7 |
| 4E | 922 | 1.1 |
| 4F | 1022 | 0.8 |
| 4G | 919 | 1.2 |
| 4H | 1015 | 1.3 |

TABLE 2-2-continued

| Measuring point | Thickness(A) | Cs/Al |
| --- | --- | --- |
| 4I | 1067 | 0.7 |
| 4J | 908 | 1.2 |
| 4K | 895 | 0.5 |
| 4L | 920 | 1.0 |
| 4M | 950 | 1.1 |

As is evident from these results, it was confirmed that according to the simultaneous evaporation method described above, the thin film layer was obtained with extremely uniform film thicknesses within the range of 1008 and 1093 angstroms and extremely uniform Cs/Al composition ratios (atomic ratios) within the range of 1.0 and 1.10 over the measuring points (4A to 4M) on the substrate 203. On the other hand, in the case of using the fabrication method different from the foregoing simultaneous evaporation method, it was confirmed that the measuring points (4A to 4M) on the substrate 203 showed film thicknesses in the range of 884 and 1067 angstroms and Cs/Al composition ratios in the range of 0.6 and 1.3.

PRACTICAL EXAMPLES

Practical Example 2-1

(1) Preparation for Fabrication of an Organic EL Device (Fabrication of a Target)

Powders of indium oxide and cerium oxide (no greater than 1 μm in average particle diameter) were accommodated in a wet ball mill container so that the mole ratio Ce/(In+Ce) was 0.05, and then mixed and ground for 72 hours. Next, the resulting ground article was granulated, followed by press molding to dimensions of 4 inches in diameter and 5 mm in thickness. The resultant was accommodated in a baking furnace, and then heated and baked at a temperature of 1400° C. for 36 hours to fabricate a target 2-1 for the anode layer 10.

(2) Formation of the Anode Layer 10

Then, a transparent glass substrate of 1.1 mm in thickness, 25 mm in width, and 75 mm in length and the obtained target 2-1 were placed in the common vacuum chamber of the high frequency sputtering system and the vacuum evaporator. The high frequency sputtering system was operated to form a transparent electrode film of 75 nm in thickness as the anode layer 10, thereby obtaining a substrate. Here, a mixed gas of argon gas and oxygen gas was filled in a state depressurized down to $3\times10^{-1}$ Pa in vacuum. In that atmosphere, the sputtering was performed under the condition of: an ultimate vacuum of $5\times10^{-4}$ Pa; a substrate temperature of 25° C.; an input voltage of 100 W; and a film forming time of 14 minutes. Hereinafter, this glass substrate and the anode layer 10 will be referred to collectively as a substrate. Subsequently, this substrate was subjected to ultrasonic cleaning in isopropyl alcohol, and then dried in a $N_2$ (nitrogen gas) atmosphere before 10-minute cleaning by using UV (ultraviolet rays) and ozone. In this state, the anode layer 10 of the substrate was measured for the value of ionization potential by using AC-1 (from Riken Keiki Co., Ltd.) and found to be 6.20 eV. Moreover, the substrate provided with the anode layer 10 was measured for light transmittance (wavelength of 550 nm) and found to be 89%.

(3) Treatment in Vacuum Evaporator

The substrate was loaded on the substrate holder of the vacuum chamber. Then, the vacuum chamber was depressurized inside to a vacuum of $1\times10^{-6}$ Torr or lower before the hole transporting layer 13, the organic luminescent layer 14, the electron injection layer 15, and the cathode layer 16 were laminated in succession on the anode layer 10 and the inorganic thin film layer 12 of the substrate to obtain an organic EL device. Here, in the period from the formation of the organic luminescent layer 14 to the formation of the cathode layer 16, the vacuum was not broken even once so that the same vacuum condition was maintained.

Initially, as hole transporting material, TBDB mentioned above was vacuum-evaporated to 60 nm. Next, as the luminescent layer, DPVDPAN and D1 were co-evaporated to 40 nm in the vacuum. Here, the deposition rate of the DPVDPAN was 40 nm/s and the deposition rate of D1 was 1 nm/s.

Incidentally, the chemical structural formula of TBDB is shown in FIG. 19. The chemical structural formula of DPVDPAN is also shown in FIG. 19. The chemical structural formula of D1 is also shown in FIG. 19.

Then, as the electron injection layer, Alq was vacuum-evaporated to 20 nm.

Finally, Al and Li were vacuum-evaporated to form the cathode layer 16 on the electron injection layer 15, fabricating the organic EL device. Here, the deposition rate of Al was 1 nm/s, and the deposition rate of Li was 0.01 nm/s. The thickness of the Al/Li film was 200 nm.

(4) Evaluation on the Organic EL Device

A direct-current voltage of 4.8 V was applied to across electrodes with the cathode layer 16 of the obtained organic EL device as the negative (−) electrode and the anode layer 10 as the positive (+) electrode. Here, the current density was 2.0 mA/cm$^2$ and the luminescence intensity was 164 nit (cd/m$^2$). The luminescent color was confirmed to be blue. Furthermore, for the sake of durability evaluation, constant-current driving was conducted at 10 mA/cm$^2$. No particular leak current was found even after a lapse of 1000 hours or more.

"Table 2-3"

TABLE 2-3

|  | Practical embodiment 2-1 | Practical embodiment 2-2 | Practical embodiment 2-3 | Practical embodiment 2-4 |
|---|---|---|---|---|
| Material of anode layer | In oxide/ Ce oxide | In oxide/ Sn oxide/ Zn oxide/ Nd oxide/ | In oxide/ Sn oxide/ Zn oxide/ Sm oxide/ | In oxide/ Sn oxide/ Zn oxide/ Eu oxide/ |
| IP(eV) | 6.20 | 5.85 | 5.95 | 5.80 |
| Thickness(nm) | 75 | 75 | 75 | 75 |
| Light transmittance (%)* | 89 | 89 | 88 | 88 |
| Hole transporting material | TBDB | TBDB | TBDB | TBDB |
| Thickness(nm) | 60 | 60 | 60 | 60 |
| Material of luminescent layer | DPVDPAN | DPVDPAN | DPVDPAN | DPVDPAN |
| Thickness(nm) | 40 | 40 | 40 | 40 |
| Material of electron injection layer | Alq | Alq | Alq | Alq |
| Thickness(nm) | 20 | 20 | 20 | 20 |
| Material of cathode layer | Al/Li | Al/Li | Al/Li | Al/Li |
| Thickness(nm) | 200 | 200 | 200 | 200 |
| Voltage(V) | 4.8 | 5.3 | 5.0 | 5.1 |
| Luminescence intensity(cd/m$^2$) | 164 | 158 | 168 | 165 |
| Half life | 1000 hours or more | 1000 hours or more | 1000 hours or more | 1000 hours or more |

*Grass reference

"Table 2-4"

TABLE 2-4

|  | Practical embodiment 2-5 | Practical embodiment 2-6 | Practical embodiment 2-7 | Comparative example 2-1 |
|---|---|---|---|---|
| Material of anode layer | In oxide/ Sn oxide/ Zn oxide/ Tb oxide/ | In oxide/ Sn oxide/ Zn oxide/ Ho oxide/ | In oxide/ Sn oxide/ Zn oxide/ Sm oxide/ | In oxide/ Sn oxide/ Zn oxide/ |
| IP(eV) | 5.84 | 5.82 | 5.98 | 5.23 |
| Thickness(nm) | 75 | 75 | 75 | 75 |
| Light transmittance (%)* | 88 | 88 | 89 | 89 |
| Hole transporting material | TBDB | TBDB | TBDB | TBDB |
| Thickness(nm) | 60 | 60 | 60 | 60 |
| Material of luminescent layer | DPVDPAN/ D1 | DPVDPAN/ D1 | DPVDPAN/ D1 | DPVDPAN/ D1 |
| Thickness(nm) | 40 | 40 | 40 | 40 |

TABLE 2-4-continued

|  | Practical embodiment 2-5 | Practical embodiment 2-6 | Practical embodiment 2-7 | Comparative example 2-1 |
|---|---|---|---|---|
| Material of electron injection layer | Alq | Alq | Alq | Alq |
| Thickness(nm) | 20 | 20 | 20 | 20 |
| Material of cathode layer | Al/Li | Al/Li | Al/Li | Al/Li |
| Thickness(nm) | 200 | 200 | 200 | 200 |
| Voltage(V) | 5.1 | 5.1 | 4.9 | 6.0 |
| Luminescence intensity(cd/m$^2$) | 165 | 166 | 164 | 166 |
| Half life | 1000 hours or more | 1000 hours or more | 1000 hours or more | 1000 hours or more |

*Grass reference

Practical Example 2-2

Instead of the target 2-1 of the practical example 2-1, a target 2-3 made of indium oxide, tin oxide, zinc oxide, and neodymium oxide was used with indium of 0.8 in the mole ratio (In/(In+Sn+Zn)), tin of 0.1 in the mole ratio (Sn/(In+Sn+Zn)), and zinc of 0.1 in the mole ratio (Zn/(In+Sn+Zn)). An organic EL device was fabricated with the rest of the fabrication condition the same as in the practical example 2-1. Incidentally, the anode layer 10 had an ionization potential of 5.85 eV. A direct-current voltage of 5.3 V was applied to across the electrodes of the obtained organic EL device as in the practical example 1, with the result that the current density was 2.0 mA/cm$^2$ in value and the luminescence intensity was 158 nit. The luminescent color was confirmed to be blue.

Practical Example 2-3

Instead of the target 2-1 of the practical example 2-1, a target 2-4 made of indium oxide, tin oxide, zinc oxide, and samarium oxide was used with indium of 0.8 in the mole ratio (In/(In+Sn+Zn)), tin of 0.1 in the mole ratio (Sn/(In+Sn+Zn)), zinc of 0.1 in the mole ratio (Zn/(In+Sn+Zn)), and samarium of 0.04 in the mole ratio with respect to the total metal (Sm/(In+Sn+Zn+Sm)). An organic EL device was fabricated with the rest of the fabrication condition the same as in the practical example 1. Incidentally, the anode layer 10 had an ionization potential of 5.95 eV. A direct-current voltage of 5.0 V was applied to across the electrodes of the obtained organic EL device as in the practical example 1, with the result that the current density was 2.0 mA/cm$^2$ in value and the luminescence intensity was 168 nit. The luminescent color was confirmed to be blue.

Practical Example 2-4

Instead of the target 2-1 of the practical example 2-1, a target 2-5 made of indium oxide, tin oxide, zinc oxide, and europium oxide was used with indium of 0.8 in the mole ratio (In/(In+Sn+Zn)), tin of 0.1 in the mole ratio (Sn/(In+Sn+Zn)), zinc of 0.1 in the mole ratio (Zn/(In+Sn+Zn)), and europium of 0.04 in the mole ratio with respect to the total metal (Eu/(In+Sn+Zn+Eu)). An organic EL device was fabricated with the rest of the fabrication condition the same as in the practical example 2-1. Incidentally, the anode layer 10 had an ionization potential of 5.80 eV. A direct-current voltage of 5.1 V was applied to across the electrodes of the obtained organic EL device as in the practical example 2-1, with the result that the current density was 2.0 mA/cm in value and the luminescence intensity was 165 nit. The luminescent color was confirmed to be blue.

Practical Example 2-5

Instead of the target 2-1 of the practical example 2-1, a target 2-6 made of indium oxide, tin oxide, zinc oxide, and terbium oxide was used with indium of 0.8 in the mole ratio (In/(In+Sn+Zn)), tin of 0.1 in the mole ratio (Sn/(In+Sn+Zn)), zinc of 0.1 in the mole ratio (Zn/(In+Sn+Zn)), and terbium of 0.06 in the mole ratio with respect to the total metal (Tb/(In+Sn+Zn+Tb)). An organic EL device was fabricated with the rest of the fabrication condition the same as in the practical example 2-1. Incidentally, the anode layer 10 had an ionization potential of 5.84 eV. A direct-current voltage of 5.1 V was applied to across the electrodes of the obtained organic EL device as in the practical example 2-1, with the result that the current density was 165 mA/cm$^2$ in value and the luminescence intensity was 95 nit. The luminescent color was confirmed to be blue.

Practical Example 2-6

Instead of the target 2-1 of the practical example 2-1, a target 2-7 made of indium oxide, tin oxide, zinc oxide, and holnium oxide was used with indium of 0.8 in the mole ratio (In/(In+Sn+Zn)), tin of 0.1 in the mole ratio (Sn/(In+Sn+Zn)), zinc of 0.1 in the mole ratio (Zn/(In+Sn+Zn)), and holnium of 0.12 in the mole ratio with respect to the total metal (Ho/(In+Sn+Zn+Ho)). An organic EL device was fabricated with the rest of the fabrication condition the same as in the practical example 2-1. Incidentally, the anode layer 10 had an ionization potential of 5.82 eV. A direct-current voltage of 5.1 V was applied to across the electrodes of the obtained organic EL devices as in the practical example 2-1, with the result that the current density was 2.0 mA/cm$^2$ in value and the luminescence intensity was 166 nit. The luminescent color was confirmed to be blue.

Practical Example 2-7

Instead of the target 2-1 of the practical example 2-1, a target 2-8a made of indium oxide, tin oxide, zinc oxide, and cerium oxide was used with indium of 0.8 in the mole ratio (In/(In+Sn+Zn)), tin of 0.1 in the mole ratio (Sn/(In+Sn+Zn)), zinc of 0.1 in the mole ratio (Zn/(In+Sn+Zn)), and cerium of 0.06 in the mole ratio with respect to the total metal (Ce/(In+Sn+Zn+Ce)). An organic EL device was fabricated with the rest of the fabrication condition the same as in the practical example 2-1. Incidentally, the anode layer 10 had an ionization potential of 5.98 eV. A direct-current voltage of 4.9 V was applied to across the electrodes of the obtained organic EL device as in the practical example 2-1, with the result that the current density was 2.0 mA/cm$^2$ in value and the luminescence intensity was 164 nit. The luminescent color was confirmed to be blue.

Practical Example 2-8

Instead of the target 2-1 of the practical example 2-1, a target 2-8b made of indium oxide, tin oxide, and cerium oxide with indium of 0.9 in the mole ratio (In/(In+Sn)) and tin of 0.1 in the mole ratio (Sn/(In+Sn)) was used to form a 75-nm-thick film on a substrate, on which a 20-nm-thick film was made by using a target composed mainly of zinc oxide with cerium of 0.05 in the mole ratio with respect to the total metal (Ce/(Zn+Ce)). An organic EL device was fabricated with the rest of the fabrication condition the same as in the practical example 2-1. Incidentally, the anode layer 10 had an ionization potential of 6.18 eV and a transmittance of 79%. Moreover, a direct-current voltage of 4.8 V was applied to across the electrodes of the obtained organic EL device as in the practical example 2-1. Here, the current density was 2.0 mA/cm$^2$ and the luminescence intensity was 162 nit (cd/m$^2$). The luminescent color was confirmed to be blue. Furthermore, for the sake of durability evaluation, constant-current driving was conducted at 10 mA/cm$^2$. No particular leak current was found even after a lapse of 1000 hours or more.

Comparative Example 2-1

Instead of the target 2-1 of the practical example 2-1, a target 2-9 made of indium oxide, tin oxide, and zinc oxide was used with indium of 0.6 in the mole ratio (In/(In+Sn+Zn)), tin of 0.3 in the mole ratio (Sn/(In+Sn+Zn)), and zinc of 0.1 in the mole ratio (Zn/(In+Sn+Zn)). In other respects, the organic EL device was fabricated in the same manner as in the practical example 2-1. Incidentally, the anode layer 10 had an ionization potential of 5.23 eV. A direct-current voltage of 6.0 V was applied to across the electrodes of the obtained organic EL device as in the practical example 2-1, with the result that the current density was 2.0 mA/cm$^2$ in value and the luminescence intensity was 166 nit. The luminescent color was confirmed to be blue.

Summary of the Group of Embodiments 2

As has been detailed above, according to the organic EL device of the present invention, it has become possible to provide an organic EL device which has excellent transparency and durability and exhibits high luminescence intensity even under a low driving voltage, comprising the anode layer and the like made of certain organic compounds. It was also confirmed that the anode layer and the like made of certain inorganic compounds had excellent etching properties.

Moreover, according to the substrate for an organic EL device of the present invention, an organic EL device exhibiting such preferable performance can be fabricated easily.

Besides, according to the method of fabricating an organic EL device of the present invention, it has become possible to provide an organic EL device effectively which has excellent transparency and durability and exhibits high luminescence intensity even under a low driving voltage.

GROUP OF EMBODIMENTS 3

Hereinafter, embodiments pertaining to the third group of invention will be described with reference to the drawings.

Practical Example 3-1

(1) Preparation for the Fabrication of a Substrate for an Organic EL Device (Fabrication of a Target)

Initially, a sputtering target to be used in forming electrodes of an organic EL device by sputtering is fabricated.

Initially, powders of indium oxide and cerium oxide (no greater than 1 μm in average particle diameter) were accommodated in a wet ball mill container, and mixed and ground for 72 hours. Here, the mixing and grinding are performed so that cerium oxide is 0.05 in the mole ratio with respect to the total amount (this mole ratio will be expressed as Ce/(In+Ce)).

Next, the resulting ground article was granulated, followed by press molding to dimensions of 4 inches in diameter and 5 mm in thickness. The resultant was accommodated in a baking furnace, and then heated and baked at a temperature of 140° C. for 36 hours to fabricate a target 3-1 for an anode layer.

Incidentally, the present embodiment 3 will deal with an organic EL device. This organic EL device corresponds to an example of the organic electroluminescence apparatus in claims.

(2) Formation of the Anode Layer

Then, a transparent glass substrate 310 of 1.1 mm in thickness, 25 mm in width, and 75 mm in length, the foregoing target 3-1 fabricated, and an Ag target (Ag: 98.5 wt %, Pd: 0.5 wt %, Cu: 1.0 wt %) are placed in the common vacuum chamber of the high frequency sputtering system and the vacuum evaporator.

Then, the high frequency sputtering system was operated to form a 35-nm-thick metal oxide layer 312a; a 5-nm-thick Ag thin film 14, and a 35-nm-thick metal oxide layer 312b on the glass substrate 310. In this way, an electrode substrate 318 having an anode layer 316 composed of these three layers was obtained. This is shown in FIG. 1.

Here, the glass substrate 310 corresponds to an example of the "base member" in claims. While this practical example uses the glass substrate 310, it is possible to use a plastic substrate or such a substrate as a silicon wafer, depending on the applications. Besides, the step of forming an anode layer by such sputtering corresponds to an example of "forming an electrode by sputtering" in claims. That is, the anode layer 316 corresponds to an example of the "electrode" in claims.

Here, a mixed gas of argon gas and oxygen gas was filled in a state depressurized down to 5×10$^{-4}$ Pa in vacuum. In that atmosphere, the sputtering was performed under the condition of: an ultimate vacuum of 3×10$^{-1}$ Pa; a substrate temperature of 25° C.; an input voltage of 100 W; and a film forming time of 14 minutes.

Hereinafter, the electrode substrate 318 combining this glass substrate 310 and the anode layer 316 will be referred to simply as substrate 318. This substrate 318 corresponds to an example of the electrode substrate for an organic electroluminescence apparatus in claims.

Subsequently, this substrate 318 was subjected to ultrasonic cleaning in isopropyl alcohol, and then dried in a N$_2$ (nitrogen gas) atmosphere before 10-minute cleaning by using UV (ultraviolet rays) and ozone.

(3) Measurements

Before and after the UV cleaning of the substrate, the anode layer 316 was measured for the value of its work function by using AC-1 (from Riken Keiki Co., Ltd.), and found to be 5.85 eV (before cleaning) and 6.20 eV (after cleaning). Moreover, the substrate provided with the anode layer 316 was measured for light transmittance (wavelength of 550 nm) and found to be 84%. The surface resistance was measured by the four probe method and found to be 4.6 Ω/sq.

(4) Formation of the Organic EL Device

Next, the foregoing "substrate" was loaded on the substrate holder in the vacuum chamber of the vacuum evaporator. Then, the vacuum chamber was depressurized inside to a vacuum of $1 \times 10^{-6}$ Torr or lower before a hole transporting layer 320, an organic luminescent layer 322, an electron injection layer 324, and a cathode layer 326 were laminated in succession on the anode layer 316 of the substrate 318 to obtain an organic EL device. This is shown in FIG. 2.

Here, in the period from the formation of the hole transporting layer 320 to the formation of the cathode layer 326, the vacuum was not broken even once so that the same vacuum condition was maintained.

The step of forming the organic luminescent layer 322 by such vacuum deposition corresponds to an example of "forming an organic electroluminescence layer by vacuum deposition" in claims. That is, the organic luminescent layer 322 corresponds to an example of the "organic electroluminescence layer" in claims.

Initially, as the hole transporting material 320, TBDB was vacuum-evaporated to 60 nm. Next, as the organic luminescent layer 322, DPVDPAN and D1 were co-evaporated to 40 nm in the vacuum. Here, the deposition rate of the DPVDPAN was 40 nm/s and the deposition rate of D1 was 1 nm/s.

Then, as the electron injection layer 324, Alq was vacuum-evaporated to 20 nm. Finally, Al and Li were vacuum-evaporated to form the cathode layer 326 on the electron injection layer 324, thereby fabricating the organic EL device 30. Incidentally, the deposition rate of Al here was 1 nm/s, and the deposition rate of Li was 0.01 nm/s. The thickness of the Al/Li film was 200 nm.

The chemical formulae of TBDB, DPVDPAN, D1, and Alq are shown in FIG. 19.

(5) Evaluation on the Organic EL Device Fabricated

A direct-current voltage of 4.3 V was applied to across electrodes with the cathode layer 326 of the obtained organic EL device 330 as the negative (−) electrode and the anode layer 316 as the positive (+) electrode. Here, the current density was 2.0 mA/cm$^2$ and the luminescence intensity was 160 nit (cd/m$^2$). The luminescent color was confirmed to be blue. Furthermore, for the sake of durability evaluation, constant-current driving was conducted at 10 mA/cm$^2$. No particular leak current was found even after a lapse of 1000 hours or more.

The results of the practical example 3-1 are shown in Table 3-1.

"Table 3-1"

TABLE 3-1

|  | Practical embodiment 3-1 | Practical embodiment 3-2 | Practical embodiment 3-3 | Practical embodiment 3-4 |
|---|---|---|---|---|
| Material of anode layer | In oxide/ Ce oxide/ | In oxide/ Sn oxide/ Zn oxide/ Nd oxide/ | In oxide/ Sn oxide/ Zn oxide/ Sm oxide/ | In oxide/ Sn oxide/ Zn oxide/ Pr oxide/ |
| Work function(eV) (before cleaning) | 5.85 | 5.81 | 5.84 | 5.80 |
| Work function (eV) (after cleaning) | 6.20 | 8.85 | 5.95 | 5.85 |
| Thickness(nm) oxide/Ag/oxide | 35/5/35 | 35/5/35 | 35/5/35 | 35/5/35 |
| Light transmittance(%)* | 85 | 85 | 84 | 84 |
| Surface resistance(Ω/□) | 4.6 | 4.3 | 3.9 | 4.0 |
| Hole transporting material | TBDB | TBDB | TBDB | TBDB |
| Thickness(nm) | 60 | 60 | 60 | 60 |
| Material of luminescent layer | DPVDPAN | DPVDPAN | DPVDPAN | DPVDPAN |
| Thickness(nm) | 40 | 40 | 40 | 40 |
| Material electron injection layer | Alq | Alq | Alq | Alq |
| Thickness(nm) | 20 | 20 | 20 | 20 |
| Material of cathode layer | Al/Li | Al/Li | Al/Li | Al/Li |
| Thickness(nm) | 200 | 200 | 200 | 200 |
| Voltage(V) | 4.3 | 4.8 | 4.5 | 4.6 |
| Luminescence intensity(cd/m$^2$) | 160 | 156 | 164 | 161 |
| Half life | 1000 hours or more | 1000 hours or more | 1000 hours or more | 1000 hours or more |

*Glass reference

Practical Example 3-2

A target 3-3 shown below was used instead of the target 3-1 of the practical example 3-1. This target 3-3 is one made of indium oxide, tin oxide, zinc oxide, and neodymium oxide, having the following specific composition.

Here, indium oxide, tin oxide, and zinc oxide will be referred to as main metal components.

Initially, the mole ratio of indium in the main metal components (expressed as In/(In+Sn+Zn)) is 0.8. The mole ratio of tin in the main metal components (expressed as Sn/(In+Sn+Zn)) is 0.1. The mole ratio of zinc in the main metal components (expressed as Zn/(In+Sn+Zn)) is 0.1. In addition, the mole ratio of neodymium in the total metal (expressed as Nd/(In+Sn+Zn+Nd)) is 0.06.

The organic EL device 330 was fabricated as in the foregoing practical example 3-1 except that the target 3-3 was used instead of the target 3-1.

Incidentally, at the time of fabrication, the anode layer 316 showed work functions of 5.81 eV (before cleaning) and 5.85 eV (after cleaning). The surface resistance of the anode layer 316 was 4.3 Ω/sq.

Moreover, a direct-current voltage of 4.8 V was applied to across the electrodes of the obtained organic EL device 330 as in the practical example 3-1, with the result that the current density was 2.0 mA/cm² in value and the luminescence intensity was 156 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 3-2 are also shown in Table 3-1.

Practical Example 3-3

A target 3-4 shown below was used instead of the target 3-1 of the practical example 3-1. This target 3-4 is one made of indium oxide, tin oxide, zinc oxide, and samarium oxide, having the specific composition as follows:

The mole ratio of indium in the main metal components (In/(In+Sn+Zn)) is 0.8. The mole ratio of tin in the main metal components (Sn/(In+Sn+Zn)) is 0.1. The mole ratio of zinc in the main metal components (Zn/(In+Sn+Zn)) is 0.1. In addition, the mole ratio of samarium in the total metal (this mole ratio will be expressed as Sm/(In+Sn+Zn+Sm)) is 0.04.

The organic EL device 330 was fabricated as in the foregoing practical example 3-1 except that the target 3-4 was used instead of the target 3-1.

Incidentally, the anode layer 316 showed work functions of 5.84 eV (before cleaning) and 5.95 eV (after cleaning). The surface resistance of the anode layer 316 was 3.9 Ω/sq. A direct-current voltage of 4.5 V was applied to across the electrodes of the obtained organic EL device 330 as in the practical example 3-1, with the result that the current density was 2.0 mA/cm² in value and the luminescence intensity was 164 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 3-3 are also shown in Table 3-1.

Practical Example 3-4

A target 3-5 shown below was used instead of the target 3-1 of the practical example 3-1. This target 3-5 is one made of indium oxide, tin oxide, zinc oxide, and praseodymium oxide, having the specific composition as follows:

The mole ratio of indium in the main metal components (In/(In+Sn+Zn)) is 0.8. The mole ratio of tin in the main metal components (Sn/(In+Sn+Zn)) is 0.1. The mole ratio of zinc in the main metal components (Zn/(In+Sn+Zn)) is 0.1. In addition, the mole ratio of praseodymium in the total metal (Pr/(In+Sn+Zn+Pr)) is 0.04.

The organic EL device 330 was fabricated as in the foregoing practical example 3-1 except that the target 3-5 was used instead of the target 3-1. Incidentally, the anode layer 316 showed work functions of 5.80 eV (before cleaning) and 5.85 eV (after cleaning). The surface resistance of the anode layer 316 was 4.0 Ω/sq.

A direct-current voltage of 4.6 V was applied to across the electrodes of the obtained organic EL device 330 as in the practical example 3-1, with the result that the current density was 2.0 mA/cm² in value and the luminescence intensity was 161 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 3-4 are also shown in Table 3-1.

Practical Example 3-5

A target 3-6 shown below was used instead of the target 3-1 of the practical example 3-1. This target 3-6 is one made of indium oxide, tin oxide, zinc oxide, and tantalum oxide, having the specific composition as follows:

The mole ratio of indium in the main metal components (In/(In+Sn+Zn)) is 0.8. The mole ratio of tin in the main metal components (Sn/(In+Sn+Zn)) is 0.1. The mole ratio of zinc in the main metal components (Zn/(In+Sn+Zn)) is 0.1. In addition, the mole ratio of tantalum in the total metal (Ta/(In+Sn+Zn+Ta)) is 0.06.

The organic EL device 330 was fabricated as in the foregoing practical example 3-1 except that the target 3-6 was used instead of the target 3-1. Incidentally, the anode layer 316 showed work functions of 5.60 eV (before cleaning) and 5.64 eV (after cleaning). The surface resistance of the anode layer 316 was 4.8 Ω/sq.

A direct-current voltage of 5.1 V was applied to across the electrodes of the obtained organic EL device 330 as in the practical example 3-1, with the result that the current density was 162 mA/cm² in value and the luminescence intensity was 62 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 3-5 are shown in Table 3-2.

"Table 3-2"

TABLE 3-2

|  | Practical embodiment 3-5 | Practical embodiment 3-6 | Practical embodiment 3-7 | Practical embodiment 3-8 |
| --- | --- | --- | --- | --- |
| Material of anode layer | In oxide/ Sn oxide/ Zn oxide/ Ta oxide/ | In oxide/ Sn oxide/ Zn oxide/ Nb oxide/ | In oxide/ Sn oxide/ Zn oxide/ Hf oxide/ | In oxide/ Sn oxide/ Zn oxide/ Sm oxide/ |

TABLE 3-2-continued

|  | Practical embodiment 3-5 | Practical embodiment 3-6 | Practical embodiment 3-7 | Practical embodiment 3-8 |
|---|---|---|---|---|
| Work function(eV) (before cleaning) | 5.60 | 5.64 | 5.61 | 5.72 |
| Work function (eV) (after cleaning) | 5.64 | 5.71 | 5.65 | 5.95 |
| Thickness(nm) oxide/Ag/oxide | 35/5/35 | 35/5/35 | 35/5 | 35/100/35 |
| Light transmittance(%)* | 83 | 83 | 83 |  |
| Surface resistance($\Omega/\square$) | 5.3 | 4.8 | 5.6 | 0.2 |
| Hole transporting material | TBDB | TBDB | TBDB | TBDB |
| Thickness(nm) | 60 | 60 | 60 | 60 |
| Material of luminescent layer | DPVDPAN/D1 | DPVDPAN/D1 | DPVDPAN/D1 | DPVDPAN/D1 |
| Thickness(nm) | 40 | 40 | 40 | 40 |
| Material electron injection layer | Alq | Alq | Alq | Alq |
| Thickness(nm) | 20 | 20 | 20 | 20 |
| Material of cathode layer | Al/Li | Al/Li | Al/Li | Mg/Ag In oxide/Zn oxide |
| Thickness(nm) | 200 | 200 | 200 | 5 75 (Total thickness: 80) |
| Voltage(V) | 4.8 | 4.7 | 4.8 | 4.4 |
| Luminescence intensity(cd/m$^2$) | 162 | 165 | 163 | 166 |
| Half life | 1000 hours or more | 1000 hours or more | 1000 hours or more | 1000 hours or more |

*Transmittance:Glass reference

Practical Example 3-6

A target 3-7 shown below was used instead of the target 3-1 of the practical example 3-1. This target 3-7 is one made of indium oxide, tin oxide, zinc oxide, and niobium oxide, having the specific composition as follows:

The mole ratio of indium in the main metal components (In/(In+Sn+Zn)) is 0.8. The mole ratio of tin in the main metal components (Sn/(In+Sn+Zn)) is 0.1. The mole ratio of zinc in the main metal components (Zn/(In+Sn+Zn)) is 0.1. In addition, the mole ratio of niobium in the total metal (Nb/(In+Sn+Zn+Nb)) is 0.12.

The organic EL device 330 was fabricated as in the foregoing practical example 3-1 except that the target 3-7 was used instead of the target 3-1.

Incidentally, the anode layer 316 showed work functions of 5.64 eV (before cleaning) and 5.71 eV (after cleaning). The surface resistance of the anode layer 316 was 4.8 $\Omega$/sq.

A direct-current voltage of 5.1 V was applied to across the electrodes of the obtained organic EL device 330 as in the practical example 3-1, with the result that the current density was 2.0 mA/cm$^2$ in value and the luminescence intensity was 166 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 3-6 are also shown in Table 3-2.

Practical Example 3-7

A target 3-8 shown below was used instead of the target 3-1 of the practical example 3-1. This target 3-8 is one made of indium oxide, tin oxide, zinc oxide, and hafnium oxide, having the specific composition as follows:

The mole ratio of indium in the main metal components (In/(In+Sn+Zn)) is 0.8. The mole ratio of tin in the main metal components (Sn/(In+Sn+Zn)) is 0.1. The mole ratio of zinc in the main metal components (Zn/(In+Sn+Zn)) is 0.1. In addition, the mole ratio of hafnium in the total metal (Hf/(In+Sn+Zn+Hf)) is 0.06.

The organic EL device 330 was fabricated as in the foregoing practical example 3-1 except that the target 3-8 was used instead of the target 3-1. Incidentally, the anode layer 316 showed work functions of 5.61 eV (before cleaning) and 5.65 eV (after cleaning). The surface resistance of the anode layer 316 was 5.6 $\Omega$/sq.

A direct-current voltage of 4.8 V was applied to across the electrodes of the obtained organic EL device 330 as in the practical example 3-1, with the result that the current density was 2.0 mA/cm$^2$ in value and the luminescence intensity was 163 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 3-7 are also shown in Table 3-2.

Practical Example 3-8

The target 3-4 of the practical example 3-3 was used to form the anode layer 316 with thicknesses of an oxide layer: 35 nm, a metal layer: 100 nm, and an oxide layer: 35 nm. Moreover, the cathode layer was given the composition of an Mg/Ag thickness: 5 nm and a transparent conductive film made of indium oxide and zinc oxide (In/(In+Zn))=0.85): 75 nm. Here, In/(In+Zn) represents the mole ratio of indium with respect to the total amount of indium and zinc. In other respects, the organic EL device 330 was fabricated in the same manner as in the practical example 3-1.

The anode layer 316 showed work functions of 5.72 eV (before cleaning) and 5.95 eV (after cleaning). The surface resistance of the anode layer 316 was 0.2 $\Omega$/sq.

A direct-current voltage of 4.4 V was applied to across the electrodes of the obtained organic EL device 330 as in the practical example 3-1, with the result that the current density was 2.0 mA/cm$^2$ in value and the luminescence intensity was 166 nit. The luminescent color was confirmed to be blue.

Furthermore, for the sake of durability evaluation, constant-current driving was conducted at 10 mA/cm$^2$. No particular leak current was found even after a lapse of 1000 hours or more.

Incidentally, the results of the practical example 3-8 are also shown in Table 3-2.

Comparative Example 3-1

A target 3-9 made of indium oxide, tin oxide, and zinc oxide was used instead of the target 3-1 of the practical example 3-1. The specific composition of the target 3-9 is as follows:

In the target 3-9, the mole ratio of indium in the main metal components (In/(In+Sn+Zn)) is 0.6. The mole ratio of tin in the main metal components (Sn/(In+Sn+Zn)) is 0.3. The mole ratio of zinc in the main metal components (Zn/(In+Sn+Zn)) is 0.1. The organic EL device 330 was fabricated in the same manner as in the practical example 3-1 except that this target 3-9 was used.

Incidentally, the anode layer 316 showed work functions of 4.65 eV (before cleaning) and 5.23 eV (after cleaning). A direct-current voltage of 6.0 V was applied to across the electrodes of the obtained organic EL device 330 as in the practical example 3-1, with the result that the current density was 2.0 mA/cm$^2$ in value and the luminescence intensity was 166 nit. The luminescent color was confirmed to be blue.

Incidentally, the results of the comparative example 3-1 are shown in Table 3-3.

"Table 3-3"

TABLE 3-3

|  | Comparative example 3-1 | Comparative example 3-2 |
|---|---|---|
| Material of anode layer | In oxide/ Sn oxide/ Zn oxide/ | Ce oxide/ |
| Work function(eV) (before cleaning) | 4.65 | 5.25 |
| Work function (eV) (after cleaning) | 5.23 | 5.46 |
| Thickness(nm) | 75 |  |
| oxide/Ag/oxide |  | 35/5/35 |
| Light transmittance(%)* | 89 |  |
| Surface resistance(Ω/□) | 15.8 | N/A |
| Hole transporting material | TBDB | TBDB |
| Thickness(nm) | 60 | 60 |
| Material of luminescent layer | DPVDPAN/ D1 | DPVDPAN/ D1 |
| Thickness(nm) | 40 | 40 |
| Material electron injection layer | Alq | Alq |
| Thickness(nm) | 20 | 20 |
| Material of cathode layer | Al/Li | Al/Li |
| Thickness(nm) | 200 | 200 |
| Voltage(V) | 6.0 |  |
| Luminescence intensity(cd/m$^2$) | 166 |  |
| Half life |  |  |

*Transmittance:Glass reference

Comparative Example 3-2

A target of 100% cerium oxide was used instead of the target 3-1 of the practical example 3-1. In other respects, the film formation was performed in the same manner as in the practical example 3-1.

As a result, the anode layer 316 showed work functions of 5.25 eV (before cleaning) and 5.46 eV (after cleaning). As for the surface resistance, the anode layer 316 had an insulative surface and could not be measured.

Incidentally, the results of the comparative example 3-2 are also shown in Table 3-3.

Summary of the Group of Embodiments 3

As has been detailed above, according to the organic organic EL device of the present invention, it has become possible to provide an organic EL device which has excellent transparency and durability and exhibits high luminescence intensity even under a low driving voltage, comprising electrodes (such as the anode layer) made of certain inorganic compounds.

It was also confirmed that the anode layer and the like made of certain inorganic compounds described in the present invention caused no deterioration in etching property.

Besides, according to the organic EL device of the present invention, it has become possible to provide an organic EL device effectively which has excellent transparency and durability and exhibits high luminescence intensity even under a low driving voltage.

Moreover, according to the electrode substrate of the present invention, it is possible to fabricate an organic EL device which provides the foregoing effects.

Furthermore, according to the fabrication method of the present invention, it is possible to fabricate an organic EL device which provides the foregoing effects.

GROUP OF EMBODIMENTS 4

Hereinafter, a group of preferred embodiments 4 of the present invention will be described with reference to the drawings.

Practical Example 4-1

(1) Preparation for the Fabrication of a Substrate for an Organic EL Device (Fabrication of Targets)

Initially, powders of indium oxide, tin oxide, and cerium oxide are accommodated in a wet ball mill container so that the mole ratio of indium (In/(In+Sn)) is 0.9, the mole ratio of tin (Sn/(In+Sn)) is 0.1, and the mole ratio of cerium to the total metal (Ce/(In+Sn+Ce)) is 0.05, followed by mixing and grinding for 72 hours.

Then, the resulting ground article was granulated, and press molded to dimensions of 4 inches in diameter and 5 mm in thickness. The resultant was accommodated in a baking furnace, and then heated and baked at a temperature of 1400° C. for 36 hours to fabricate a target 4-1 for a thin film layer of a metal oxide.

In addition, powders of indium oxide and zinc oxide (no greater than 1 μm in average particle diameter) were accommodated in a wet ball mill container so that the mole ratio Zn/(In+Zn) was 0.15, followed by mixing and grinding for 72 hours.

Then, the resulting ground article was granulated, and press molded to dimensions of 4 inches in diameter and 5 mm in thickness. The resultant was accommodated in a baking furnace, and then heated and baked at a temperature of 1400° C. for 36 hours to fabricate an IZO target for the anode layer.

Next, a metal target of Ag with additional Cu of 0.7 wt % and Au of 0.8 wt % was fabricated. This will be referred to as an Ag target.

Besides, a metal target of Cu with additional Ni of 1.7 wt % and Co of 1.3 wt % was fabricated. This will be referred to as a Cu target. Moreover, a metal target of pure Al will be referred to as an Al target.

(2) Fabrication of the Substrate for an Organic EL Device

Figure 12:
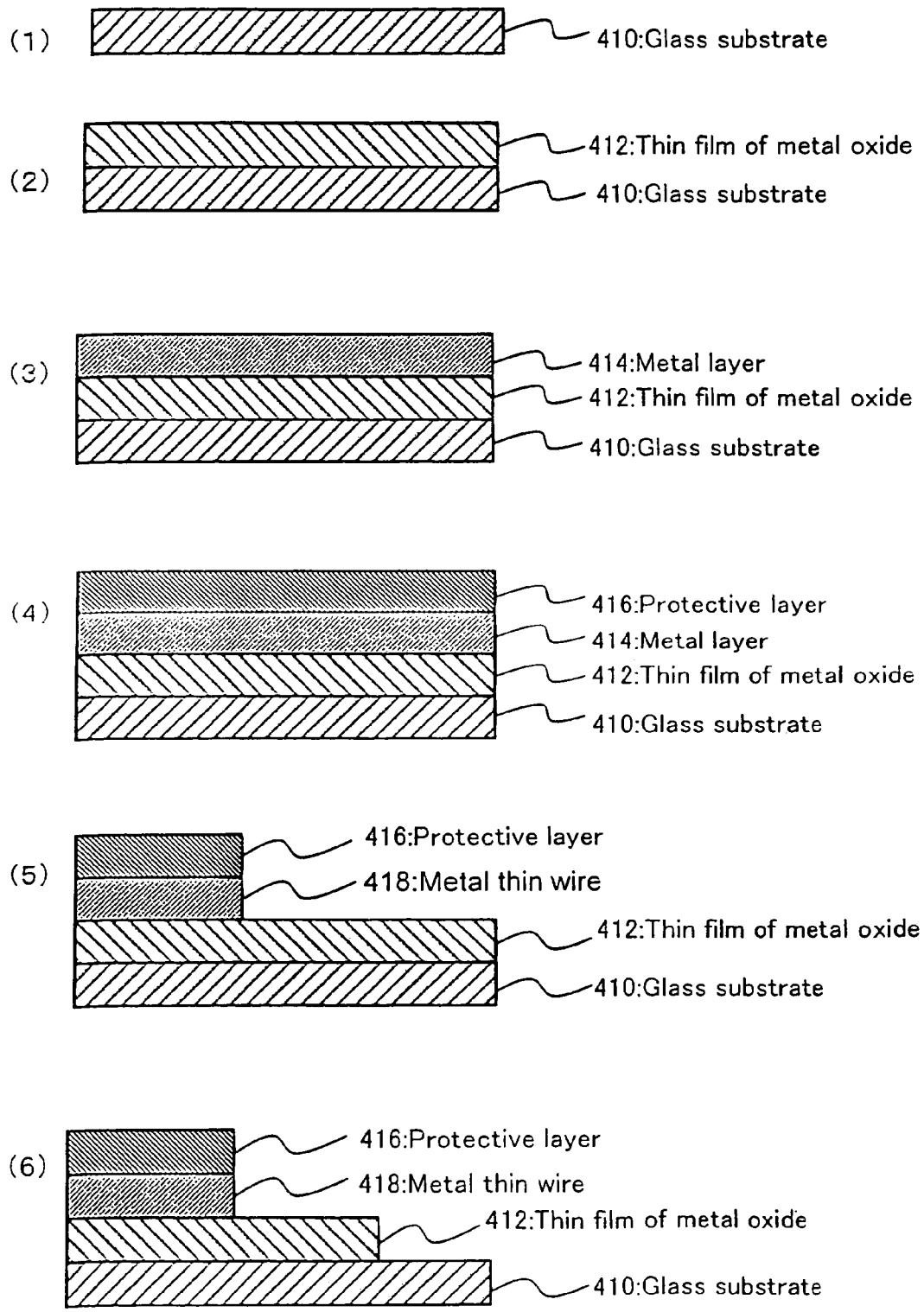
FIG. 12 is a series of sectional views of the process for fabricating the electrode substrate in the present embodiment.
Figure 13:
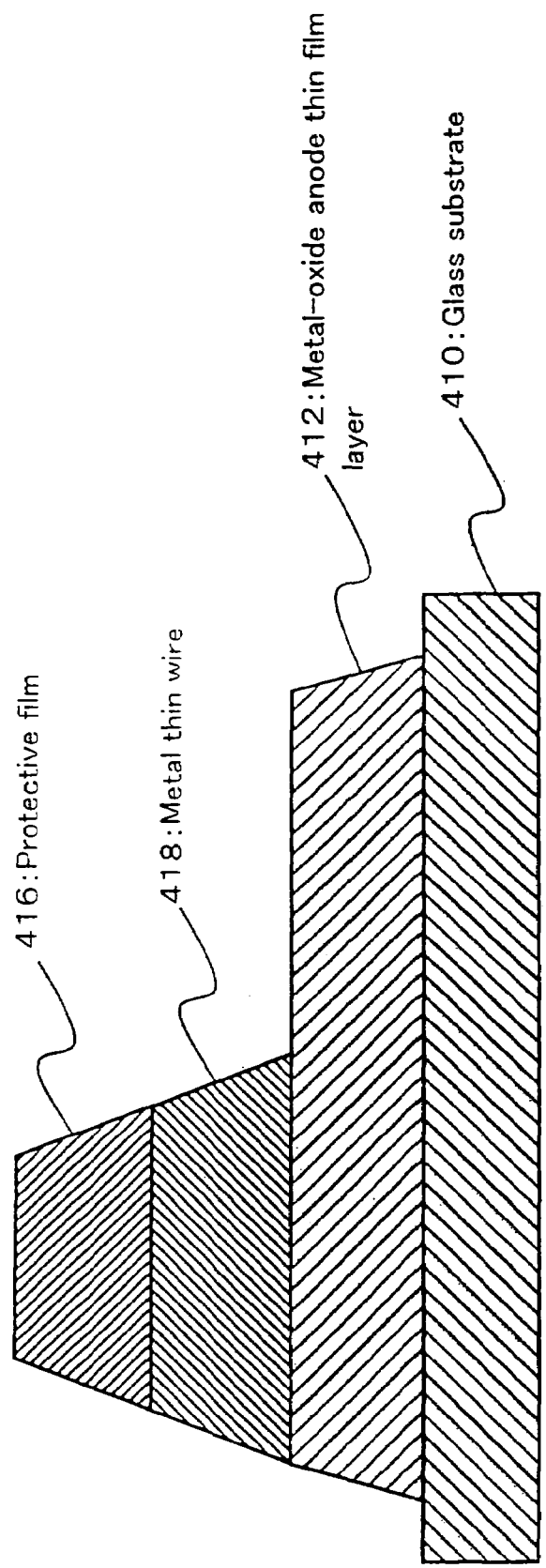
FIG. 13 is a sectional view of an electrode substrate in the present embodiment.

Next, description will be given of the formation of the substrate for an organic EL device. This is shown in FIG. 12.

A transparent glass substrate 410 of 1.1 mm in thickness, 25 mm in width, and 75 mm in length, and the fabricated target 4-1, IZO target, and Al target are placed in the vacuum chamber of the high frequency sputtering system. The high frequency sputtering system is operated to depressurize down to an ultimate vacuum of $5\times10^{-4}$ Pa, in which state argon gas alone is filled. FIG. 12(1) shows the glass substrate 410, which corresponds to an example of the "base member" in claims.

In that atmosphere, sputtering was performed under the condition of: a vacuum of $3\times10^{-1}$ Pa; a substrate temperature at room temperatures; an input voltage of 100 W; and a film forming time of 14 minutes, so that a 110-nm-thick thin film layer 412 of a metal oxide was formed by using the target 4-1 in the argon gas. This is shown in FIG. 12(2).

Subsequently, the Al target was used to form a 120-nm-thick Al thin film 414 in the argon gas. This is shown in FIG. 12(3).

Moreover, the IZO target was used to form a 20-nm-thick IZO thin film 416 in the argon gas mixed with oxygen gas. This is shown in FIGS. 12(4) and 13.

Incidentally, the IZO thin film 416, a protective film, need not necessarily be formed on the foregoing Al thin film 414, but is preferably formed.

Subsequently, in a nitrate-phosphate-acetate aqueous solution, the IZO thin film/Al thin film were etched to form IZO/Al thin wires 418 of 20 μm in width. This is shown in FIG. 12(5).

Thereafter, the thin film layer of the metal oxide formed from the target 4-1 on this substrate was etched in an oxalic aqueous solution to form such a pattern that one IZO/Al thin wire 418 falls on the side of a thin film electrode made from the target 4-1. The electrode fabricated through such patterning will be referred to as a patterning electrode. This is shown in FIG. 12(6).

Incidentally, the thin film layer of the metal oxide formed from the target 4-1 preferably has a width of 90 μm. Moreover, the Al thin wires 414 obtained through the foregoing etching correspond to an example of the metal thin wire. Besides, the IZO/Al thin wire 418 corresponds to an example where a protective film is arranged on a metal thin wire.

This substrate was subjected to ultrasonic cleaning in isopropyl alcohol, and then dried in a $N_2$ (nitrogen gas) atmosphere before 10-minute cleaning by using UV (ultraviolet rays) and ozone.

(3) Measurements

The patterning electrode (electrode width: 90 μm, electrode length: 100 mm) described above was measured for resistance by the two probe method, and found to be 2.5 kΩ.

The metal-oxide thin film layer 412 formed from the target 4-1 alone was 3×10E-3 Ωcm in specific resistance. Moreover, the patterning electrode was measured for light transmittance (wavelength of 550 nm) and found to be 89%. After the UV cleaning of the substrate, the anode layer 412 was measured for the value of its work function by using AC-1 (from Riken Keiki Co., Ltd.), and found to be 6.06 eV.

Incidentally, the measurements are shown in Table 4-1.

(4) Formation of the Organic EL Device

Figure 14:
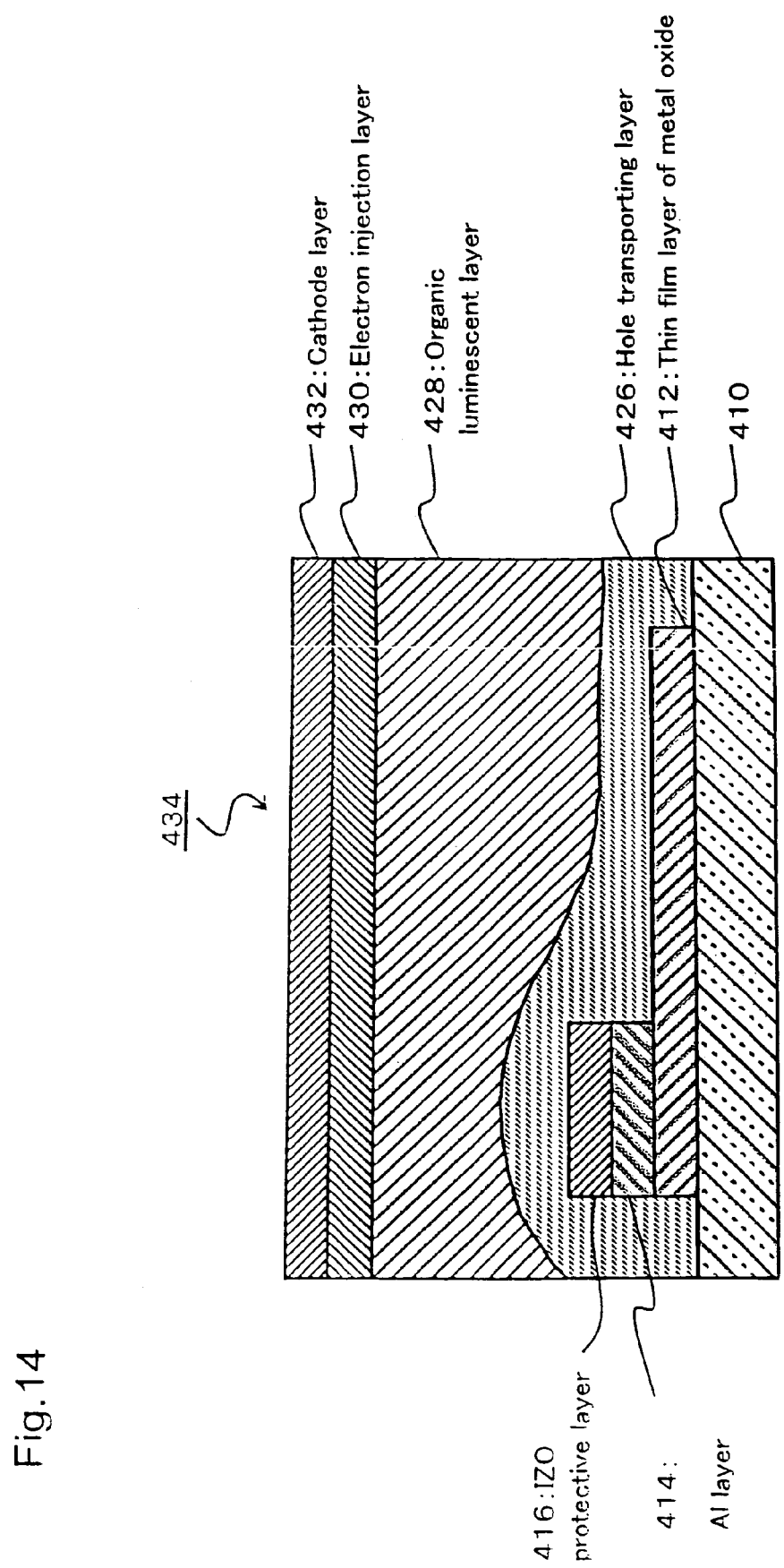
FIG. 14 is a sectional view of an organic EL device in the present embodiment.
Figure 16:
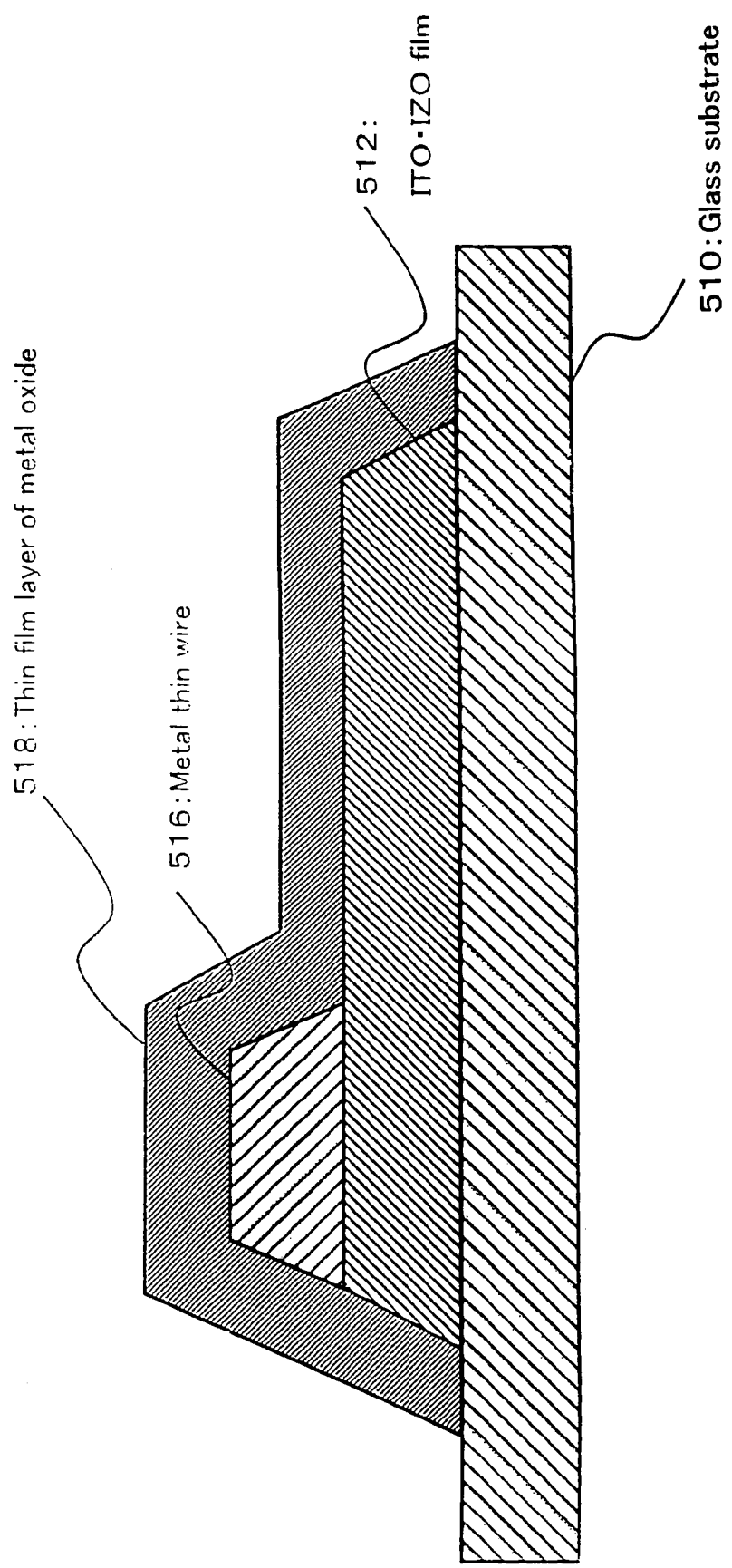
FIG. 16 is a sectional view of an electrode substrate in the present embodiment.

The foregoing "substrate" was loaded on the substrate holder in the vacuum chamber of the vacuum evaporator. Then, the vacuum chamber was depressurized inside to a vacuum of $1\times10^{-6}$ Torr or lower before a hole transporting layer 426, an organic luminescent layer 428, an electron injection layer 430, and a cathode layer 432 were laminated in succession on the anode layer 412 of the substrate to obtain an organic EL device 434. This is shown in FIG. 14.

Here, in the period from the formation of the organic luminescent layer 428 to the formation of the cathode layer 432, the vacuum was not broken even once so that the same vacuum condition was maintained.

Here, the organic EL device 434 corresponds to the organic electroluminescence device in claims.

Initially, as the hole transporting material, TBDB was vacuum-evaporated to 60 nm. Next, as the organic luminescent layer 428, DPVDPAN and D1 were co-evaporated to 40 nm in the vacuum. Here, the deposition rate of the DPVDPAN was 40 nm/s and the deposition rate of D1 was 1 nm/s.

Then, as the electron injection layer 430, Alq was vacuum-evaporated to 20 nm. Finally, Al and Li were vacuum-evaporated to form the cathode layer 430 on the electron injection layer 432, thereby fabricating the organic EL device 434.

Here, the deposition rate of Al was 1 nm/s, and the deposition rate of Li was 0.01 nm/s. The thickness of the Al/Li film was 200 nm.

Incidentally, these are shown in Table 4-1. Moreover, the chemical formulae of TBDB, DPVDPAN, D1, and Alq are shown in FIG. 19.

(5) Evaluation on the Organic EL Device Fabricated

A direct-current voltage of 4.4 V was applied to across electrodes with the cathode layer 432 of the obtained organic EL device 434 as the negative (−) electrode and the anode layer 412 as the positive (+) electrode.

Here, the current density was 2.0 mA/cm² and the luminescence intensity was 161 nit (cd/m²). The luminescent color was confirmed to be blue.

Furthermore, for the sake of durability evaluation, constant-current driving was conducted at 10 mA/cm². No particular leak current was found even after a lapse of 1000 hours or more.

Incidentally, the results of the practical example 4-1 are shown in Table 4-1.

"Table 4-1"

TABLE 4-1

|  | Practical embodiment 4-1 | Practical embodiment 4-2 | Practical embodiment 4-3 | Practical embodiment 4-4 |
|---|---|---|---|---|
| Material of anode layer | In oxide/ Sn oxide/ Ce oxide | In oxide/ Sn oxide/ Ce oxide | In oxide/ Sn oxide/ Ce oxide | In oxide/ Zn oxide/ Sm oxide |
| (Auxiliary wiring) | Al | Al | Al | Ag |
| Protective layer of metal oxide | IZO | IZO | — | — |
| IP(eV) (after cleaning) | 6.05 | 5.85 | 5.85 | 5.90 |

TABLE 4-1-continued

|  | Practical embodiment 4-1 | Practical embodiment 4-2 | Practical embodiment 4-3 | Practical embodiment 4-4 |
|---|---|---|---|---|
| Light transmittance(%*) | 89 | 89 | 89 | 89 |
| Electrode resistance(kΩ) | 2.5 | 2.4 | 2.4 | 2.4 |
| Specific resistance of anode layer (Ωcm) | 3 × 10E−3 | 8 × 10E−4 | 8 × 10E−4 | 7 × 10E−4 |
| Hole transporting material | TBDB | TBDB | TBDB | TBDB |
| Thickness(nm) | 60 | 60 | 60 | 60 |
| Material of luminescent layer | DPVDPAN | DPVDPAN | DPVDPAN | DPVDPAN |
| Thickness(nm) | 40 | 40 | 40 | 40 |
| Material electron injection layer | Alq | Alq | Alq | Alq |
| Thickness(nm) | 20 | 20 | 20 | 20 |
| Material of cathode layer | Al/Li | Al/Li | Al/Li | Al/Li |
| Thickness(nm) | 200 | 200 | 200 | 200 |
| Voltage(V) | 4.4 | 4.3 | 4.4 | 4.4 |
| Luminescence intensity(cd/m$^2$) | 161 | 164 | 163 | 156 |
| Half life | 1000 hours or more | 1000 hours or more | 1000 hours or more | 1000 hours or more |

*Glass reference

Practical Example 4-2

A target 4-2 shown below was used instead of the target 4-1 of the practical example 4-1. The organic EL device 434 was fabricated in the same manner as in the practical example 4-1 except that the target 4-2 was used.

The target 4-2 is composed of indium oxide, tin oxide, and cerium oxide. The mole ratio of indium (In/(In+Sn)) is 0.9, the mole ratio of tin (Sn/(In+Sn)) is 0.1, and the mole ratio of cerium to the total metal (Ce/(In+Sn+Ce)) is 0.03.

Incidentally, the work function of the anode layer was 5.85 eV in value. The electrode resistance was 2.4 kΩ.

A direct-current voltage of 4.3 V was applied to across the electrodes of the organic EL device 434 obtained by the foregoing means as in the practical example 4-1, with the result that the current density was 2.0 mA/cm$^2$ in value and the luminescence intensity was 164 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 4-2 are also shown in Table 4-1.

Practical Example 4-3

The organic EL device 434 was fabricated in the same manner as in the practical example 4-2 except that the protective film made of the IZO target in the practical example 4-2 was not used.

Incidentally, the work function of the anode layer was 5.85 eV in value. The electrode resistance was 2.4 kΩ.

A direct-current voltage of 4.4 V was applied to across the electrodes, with the result that the current density was 2.0 mA/cm$^2$ in value and the luminescence intensity was 163 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 4-3 are also shown in Table 4-1.

Practical Example 4-4

A target 4-4 shown below was used instead of the target 4-1 of the practical example 4-1. As for the metal target, an Ag target was used instead of the Al target. Incidentally, the IZO protective film 416 is not used. The organic EL device 434 was fabricated otherwise in the same manner as in the practical example 4-1.

The target 4-4 is composed of indium oxide, tin oxide, and samarium oxide. The mole ratio of indium (In/(In+Zn)) is 0.9, the mole ratio of tin (Sn/(In+Sn)) is 0.1, and the mole ratio of samarium to the total metal (Sm/(In+Zn+Sm)) is 0.03.

Incidentally, the work function of the anode layer 412 was 5.90 eV in value. The electrode resistance was 2.4 kΩ.

A direct-current voltage of 4.4 V was applied to across the electrodes of the organic EL device 434 obtained by the foregoing means as in the practical example 4-1, with the result that the current density was 2.0 mA/cm$^2$ in value and the luminescence intensity was 156 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 4-4 are also shown in Table 4-1.

Practical Example 4-5

A target 4-5 was used instead of the target 4-1 of the practical example 4-1. As for the metal target, an Ag target was use instead of the Al target. The organic EL device 434 was fabricated otherwise under the same condition as in the practical example 4-1.

The target 4-5 is composed of indium oxide, zinc oxide, and praseodymium oxide. The mole ratio of indium (In/(In+Zn)) is 0.9, the mole ratio of tin (Sn/(In+Zn)) is 0.1, and the mole ratio of praseodymium to the total metal (Pr/(In+Sn+Pr)) is 0.04.

Incidentally, the work function of the anode layer 412 was 5.81 eV in value. The electrode resistance was 2.5 kΩ.

A direct-current voltage of 4.5 V was applied to across the electrodes of the obtained organic EL device 434 as in the practical example 4-1, with the result that the current density was 2.0 mA/cm² in value and the luminescence intensity was 161 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 4-5 are shown in Table 4-2.

"Table 4-2"

Practical Example 4-7

A target 4-7 was used instead of the target 4-1 of the practical example 4-1. As for the metal target, an Ag target was used instead of the Al target. In other respects, the organic EL device 434 was fabricated as in the practical example 4-1.

The target 4-7 is composed of indium oxide, tin oxide, and terbium oxide. The mole ratio of indium (In/(In+Sn)) is 0.9, the mole ratio of tin (Sn/(In+Sn)) is 0.1, and the mole ratio of terbium to the total metal (Tb/(In+Sn+Tb)) is 0.06.

TABLE 4-2

|  | Practical embodiment 4-5 | Practical embodiment 4-6 | Practical embodiment 4-7 | Comparative example 4-1 |
|---|---|---|---|---|
| Material of anode layer | In oxide/ Sn oxide/ Pr oxdie | In oxide/ Sn oxide/ Nd oxide/ | In oxide/ Sn oxide/ Tb oxide | In oxide/ Sn oxide/ |
| (Auxiliary wiring) | Ag | Cu | Ag | Ag |
| Protective layer of metal oxide |  | IZO | IZO | IZO |
| IP(eV) (after cleaning) | 5.81 | 5.80 | 5.90 | 5.25 |
| Light transmittance(%)* | 89 | 87 | 87 | 90 |
| Electrode resistance(kΩ) | 2.5 | 2.6 | 2.5 | 2.4 |
| Specific resistance of anode layer (Ωcm) | 2 × 10E−3 | 7 × 10E−3 | 4 × 10E−2 | 4 × 10E−4 |
| Hole transporting material | TBDB | TBDB | TBDB | TBDB |
| Thickness(nm) | 60 | 60 | 60 | 60 |
| Material of luminescent layer | DPVDPAN | DPVDPAN/ D1 | DPVDPAN/ D1 | DPVDPAN/ D1 |
| Thickness(nm) | 40 | 40 | 40 | 40 |
| Material electron injection layer | Alq | Alq | Alq | Alq |
| Thickness(nm) | 20 | 20 | 20 | 20 |
| Material of cathode layer | Al/Li | Al/Li | Al/Li | Al/Li |
| Thickness(nm) | 200 | 200 | 200 | 200 |
| Voltage(V) | 4.5 | 4.5 | 4.6 | 5.3 |
| Luminescence intensity(cd/m²) | 161 | 158 | 166 | 162 |
| Half life | 1000 hours or more | 1000 hours or more | 1000 hours or more |  |

*Transmittance:Glass reference

Practical Example 4-6

A target 4-6 was used instead of the target 4-1 of the practical example 4-1. As for the metal target, a Cu target was used instead of the Al target. In other respects, the organic EL device 434 was fabricated as in the practical example 4-1.

The target 4-6 is composed of indium oxide, tin oxide, and neodymium oxide. The mole ratio of indium (In/(In+Sn)) is 0.9, the mole ratio of tin (Sn/(In+Sn)) is 0.1, and the mole ratio of neodymium to the total metal (Nd/(In+Sn+Nd)) is 0.06.

Incidentally, the work function of the anode layer 412 was 5.80 eV in value. The electrode resistance was 2.6 kΩ.

A direct-current voltage of 4.5 V was applied to across the electrodes of the obtained organic EL device 434 as in the practical example 4-1, with the result that the current density was 2.0 mA/cm² in value and the luminescence intensity was 158 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 4-6 are also shown in Table 4-2.

Incidentally, the work function of the anode layer 412 was 5.90 eV in value. The electrode resistance was 2.5 kΩ.

A direct-current voltage of 4.6 V was applied to across the electrodes of the obtained organic EL device 434 as in the practical example 4-1, with the result that the current density was 2.0 mA/cm² in value and the luminescence intensity was 166 nit. The luminescent color was confirmed to be blue. Furthermore, for the sake of durability evaluation, constant-current driving was conducted at 10 mA/cm². No particular leak current was found even after a lapse of 1000 hours or more.

Incidentally, the results of the practical example 4-7 are also shown in Table 4-2.

Comparative Example 4-1

An organic EL device was fabricated as in the practical example 4-1 except that an ITO target was used instead of the target 4-1 of the practical example 4-1 and an Ag target was used as the metal target.

Incidentally, the work function of the anode layer 412 was 5.25 eV in value. A direct-current voltage of 5.3 V was applied to across the electrodes of the obtained organic EL device as in the practical example 4-1, with the result that the current density was 2.0 mA/cm² in value and the luminescence intensity was 162 nit. The luminescent color was confirmed to be blue.

Incidentally, the results of the comparative example 4-1 are also shown in Table 4-2.

Summary of the Group of Embodiments 4

As has been detailed above, according to the organic EL device which is characterized in that an electrode for driving the organic electroluminescence layer of the present invention comprises an anode thin film layer of a metal oxide having a work function above 5.6 eV and a laminate of metal thin wires, or an electrode substrate for an organic luminescent device, it becomes possible to provide an organic EL device which has excellent transparency and durability and exhibits high luminescent intensity even under a low driving voltage, comprising the anode layer and the like made of certain inorganic compounds.

It was also confirmed that the anode layer and the like made of certain inorganic compounds had excellent etching properties.

Moreover, according to the electrode substrate of the present invention, it is possible to fabricate an organic electroluminescence apparatus which provides the foregoing effects.

Moreover, according to the fabrication method of the present invention, it is possible to fabricate an organic electroluminescence apparatus which provides the foregoing effects.

GROUP OF EMBODIMENTS 5

Hereinafter, a group of preferred embodiments 5 of the present invention will be described with reference to the drawings.

Practical Example 5-1

(1) Preparation for the Fabrication of a Substrate for an Organic EL Device (Fabrication of Targets)

Powders of indium oxide and tin oxide (no greater than 1 μm in average particle diameter) were accommodated in a wet ball mill container so that the mole ratio Sn/(In+Sn) was 0.1, followed by mixing and grinding for 72 hours. Then, the ground article obtained by the foregoing means was granulated, and press molded to dimensions of 4 inches in diameter and 5 mm in thickness. The resultant was accommodated in a baking furnace, and then heated and baked at a temperature of 1500° C. for 36 hours to fabricate a target for the anode layer. This target will be referred to as an ITO target.

Powders of indium oxide and zinc oxide (no greater than 1 μm in average particle diameter) were accommodated in a wet ball mill container so that the mole ratio Zn/(In+Zn) was 0.15, followed by mixing and grinding for 72 hours. Then, the ground article obtained by the foregoing means was granulated, and press molded to dimensions of 4 inches in diameter and 5 mm in thickness. The resultant was accommodated in a baking furnace, and then heated and baked at a temperature of 1400° C. for 36 hours to fabricate a target for the anode layer. This target will be referred to as an IZO target.

Powders of indium oxide and cerium oxide (no greater than 1 μm in average particle diameter) were accommodated in a wet ball mill container so that the mole ratio Ce/(In+Ce) was 0.18, followed by mixing and grinding for 72 hours. Then, the ground article obtained by the foregoing means was granulated, and press molded to dimensions of 4 inches in diameter and 0.5 mm in thickness. The resultant was accommodated in a baking furnace, and then heated and baked at a temperature of 1400° C. for 36 hours to fabricate a target for the anode layer. This target will be referred to as target 5-1.

Next, a metal target of Ag with additional Cu of 0.7 wt % and Au of 0.8 wt % was fabricated. This target will be referred to as an ACA target.

Besides, a metal target of Ag with additional Pd of 0.5 wt % and Cu of 1.0 wt % was fabricated. This target will be referred to as an APC target.

Besides, a metal target of Al with additional Pt of 0.5 wt % was fabricated. This target will be referred to as an Al target.

(2) Fabrication of the Substrate for an Organic EL Device

Next, description will be given of the formation of the substrate for an organic EL device. This is shown in FIG. 15.

A transparent glass substrate of 1.1 mm in thickness, 25 mm in width, and 75 mm in length, as well as the obtained ITO target for the anode layer, target 5-1 for the anode layer, and Al target, which is a metal target, are placed in the vacuum chamber of the high frequency sputtering system. The high frequency sputtering system is operated to depressurize down to an ultimate vacuum of $5 \times 10^{-4}$ Pa, in which state a mixed gas of argon gas and 4% oxygen gas is filled. FIG. 15(1) shows the glass substrate, which corresponds to an example of the "base member" in claims. Incidentally, the base member on which an electrode(s) is/are arranged will be referred to as "electrode substrate."

In that atmosphere, sputtering was performed by using the ITO target under the condition of: a vacuum of $3 \times 10^{-1}$ Pa; a substrate temperature at room temperatures; an input voltage of 100 W; and a film forming time of 14 minutes. This forms a 110-nm-thick ITO film in the argon gas. This is shown in FIG. 15(2).

Then, the Al target was used to form a 120-nm-thick Al thin film in the argon gas. Incidentally, the substrate temperature is 100° C. This is shown in FIG. 15(3).

Subsequently, in a nitrate-phosphate-acetate aqueous solution, the Al thin film was etched to form Al thin wires of 20 μm in width. This is shown in FIG. 15(4). These Al thin wires correspond to an example of the "thin wire of metal as auxiliary wire" in claims.

Thereafter, the ITO film of this substrate formed from the ITO target was etched in an oxalic aqueous solution so that at least one Al thin wire falls on the side of an ITO electrode made from the ITO target. This is shown in FIG. 15(5). The electrode fabricated through such patterning will be referred to as a patterning electrode.

Incidentally, the ITO film formed from the ITO target preferably has a width of 90 μm.

Next, this substrate and a substrate having no film were put back into the vacuum chamber, and a 20-nm thin film of a metal oxide was formed by using the target 5-1 at a substrate temperature of 200° C. over the entire surface excluding an electrode outlet. This is shown in FIG. 15(6). This substrate for an organic EL device corresponds to an example of the electrode substrate for an organic electroluminescence device in claims.

Next, this substrate was subjected to ultrasonic cleaning in isopropyl alcohol, and then dried in a $N_2$ (nitrogen gas) atmosphere before 10-minute cleaning by using UV (ultraviolet rays) and ozone.

(3) Measurements

After the UV cleaning of the substrate, the anode layer was measured for the value of its work function by using AC-1 (from Riken Keiki Co., Ltd.), and found to be 6.18 eV (after cleaning). Moreover, the substrate provided with the anode layer was measured for light transmittance (wavelength of 550 nm) and found to be 88%. The patterning electrode (electrode width: 90 μm, electrode length: 100 mm) described above was measured for resistance by the two probe method, and found to be 2.5 kΩ. The thin film layer of the metal oxide formed from the target 5-1 alone was 5×10E+5 Ωcm in specific resistance.

Incidentally, the measurements are shown in Table 5-1.

(4) Formation of the Organic EL Device

Figure 18:
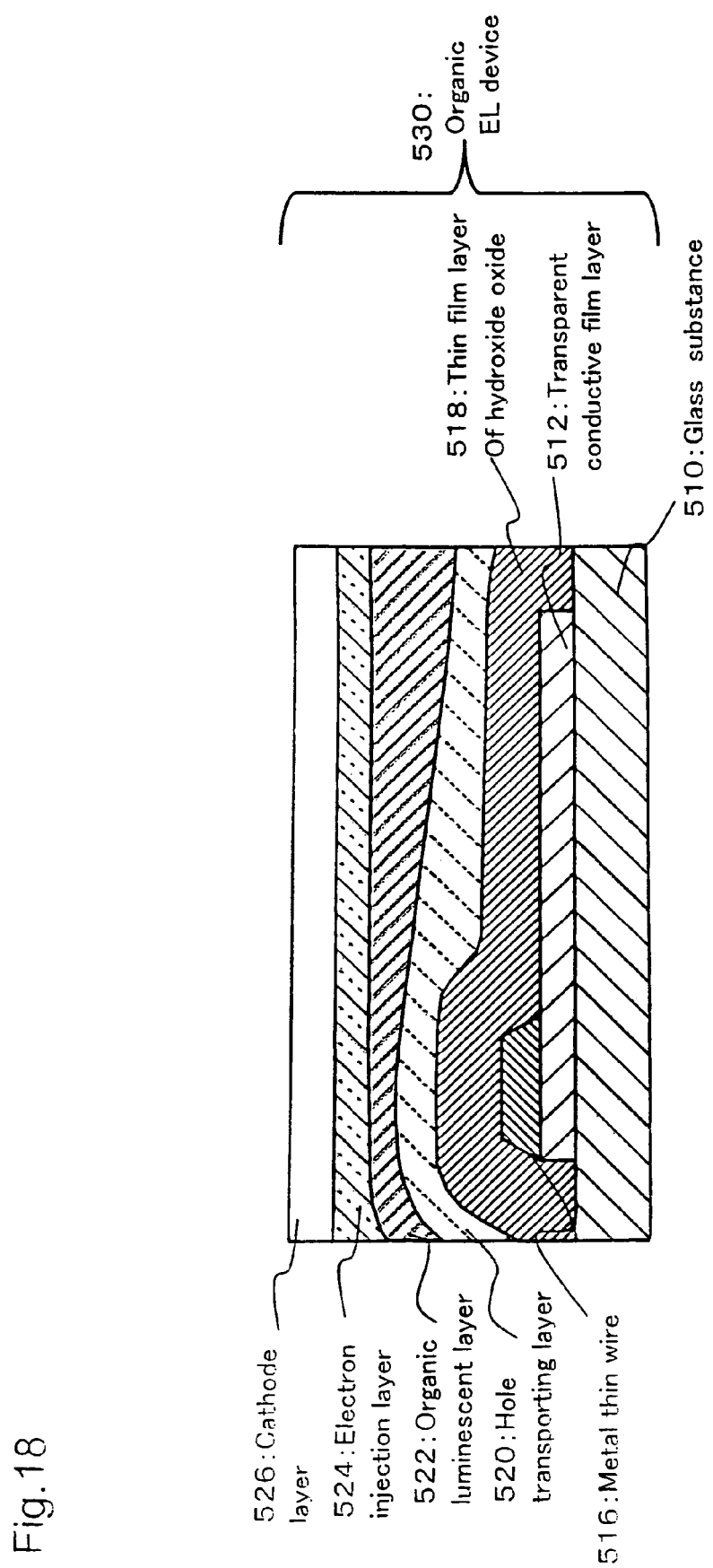
FIG. 18 is a sectional view of an organic EL device in the present embodiment.

The foregoing "substrate" was loaded on the substrate holder in the vacuum chamber of the vacuum evaporator. Then, the vacuum chamber was depressurized inside to a vacuum of $1\times10^{-6}$ Torr or lower before a hole transporting layer 520, an organic luminescent layer 522, an electron injection layer 524, and a cathode layer 526 were laminated in succession on the anode layer of the substrate to obtain an organic EL device 530. This is shown in FIG. 18.

Here, in the period from the formation of the organic luminescent layer to the formation of the cathode layer, the vacuum was not broken even once so that the same vacuum condition was maintained.

Here, the organic EL device corresponds to the organic EL light emitting apparatus in claims.

Initially, as the hole transporting material, TBDB was vacuum-evaporated to 60 nm. Next, as the luminescent layer, DPVDPAN and D1 were co-evaporated to 40 nm in the vacuum. Here, the deposition rate of the DPVDPAN was 40 nm/s and the deposition rate of D1 was 1 nm/s.

Then, as the electron injection layer, Alq was vacuum-evaporated to 20 nm. Finally, Al and Li were vacuum-evaporated to form the cathode layer on the electron injection layer, fabricating the organic EL device.

Here, the deposition rate of Al was 1 nm/s, and the deposition rate of Li was 0.01 nm/s. The thickness of the Al/Li film was 200 nm.

Incidentally, these are shown in Table 5-1. Moreover, the chemical formulae of TBDB, DPVDPAN, D1, and Alq are shown in FIG. 19.

(5) Evaluation on the Organic EL Device

A direct-current voltage of 4.3 V was applied to across electrodes with the cathode layer of the obtained organic EL device as the negative (−) electrode and the anode layer as the positive (+) electrode.

Here, the current density was 2.0 mA/cm$^2$ and the luminescence intensity was 163 nit (cd/m$^2$). The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-1 are shown in Table 5-1.

"Table 5-1"

TABLE 5-1

|  | Practical embodiment 5-1 | Practical embodiment 5-2 | Practical embodiment 5-3 | Practical embodiment 5-4 |
|---|---|---|---|---|
| Material of anode layer (Auxiliary wiring) | ITO + Al | ITO + Al | IZO + Al | ITO + APC |
| Protective layer of metal oxide | In oxide/ Ce oxide | In oxide/ Sn oxide/ Ce oxide | In oxide/ Zn oxide/ Ce oxide | In oxide/ Zn oxide/ Sm oxide |
| Work function(eV)(after cleaning) | 6.18 | 6.05 | 5.95 | 5.90 |
| Light transmittance(%)* | 88 | 88 | 89 | 88 |
| Electrode resistance(kΩ) | 2.5 | 2.4 | 2.6 | 2.3 |
| Specific resistance of metal oxide thin film layer(Ωcm) | 10E+5 | 10E+5 | 10E+7 | 10E+6 |
| Hole transporting material | TBDB | TBDB | TBDB | TBDB |
| Thickness(nm) | 60 | 60 | 60 | 60 |
| Material of luminescent layer | DPVDPAN | DPVDPAN | DPVDPAN | DPVDPAN |
| Thickness(nm) | 40 | 40 | 40 | 40 |
| Material electron injection layer | Alq | Alq | Alq | Alq |
| Thickness(nm) | 20 | 20 | 20 | 20 |
| Material of cathode layer | Al/Li | Al/Li | Al/Li | Al/Li |
| Thickness(nm) | 200 | 200 | 200 | 200 |
| Voltage(V) | 4.3 | 4.2 | 4.6 | 4.4 |
| Luminescence intensity(cd/m$^2$) | 163 | 158 | 163 | 158 |
| Half life | 1000 hours or more | 1000 hours or more | 1000 hours or more | 1000 hours or more |

*Glass reference

While the glass substrate was used in the present practical example 5-1, the "base member" may also be a glass substrate, a plastic substrate, a silicon wafer, a color-filtered color conversion substrate, or the like.

Practical Example 5-1 #2"

Figure 17:
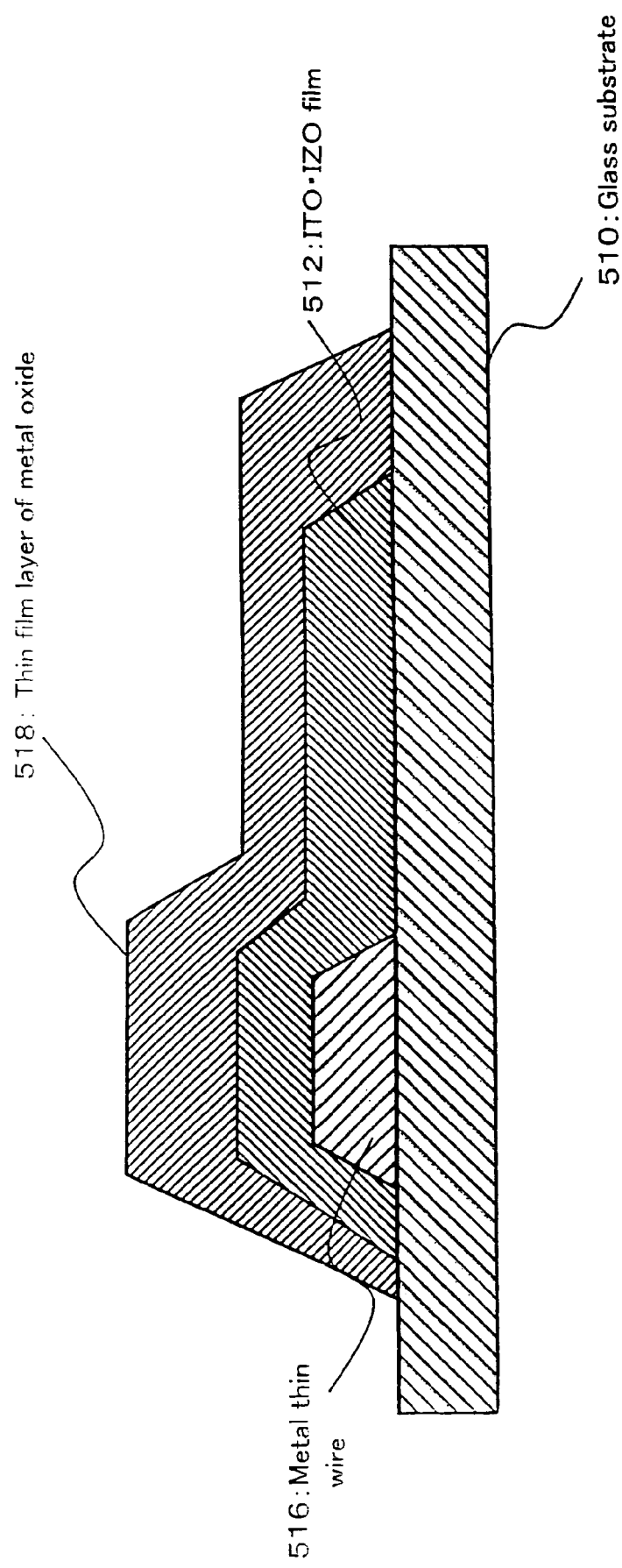
FIG. 17 is a sectional view of another type of electrode substrate in the present embodiment.

For a modified example of the practical example 5-1, the order of lamination may be inverted of the transparent conductive thin film composed mainly of indium oxide and the metal thin film as an auxiliary wire. Even in such configuration, the functions and effects of the invention are the same as in the foregoing practical example 5-1. Incidentally, FIG. 17 shows a sectional view of the configuration where the order of lamination is inverted.

Practical Example 5-2

A target 5-2 shown below was used instead of the target 5-1 of the practical example 5-1. The organic EL device was fabricated in the same manner as in the practical example 5-1 except that the target 5-2 was used.

The target 5-2 is composed of indium oxide, tin oxide, and cerium oxide. The mole ratio of indium (In/(In+Sn)) is 0.9, the mole ratio of tin (Sn/(In+Sn)) is 0.1, and the mole ratio of cerium to the total metal (Ce/(In+Sn+Ce)) is 0.16.

Incidentally, the work function of the anode layer was 6.05 eV in value. The electrode resistance was 2.4 kΩ. A direct-current voltage of 4.2 V was applied to across the electrodes of the obtained organic EL device as in the practical example 5-1, with the result that the current density was 2.0 mA/cm$^2$ in value and the luminescence intensity was 158 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-2 are also shown in Table 5-1.

Practical Example 5-3

A target 5-3 shown below was used instead of the target 5-1 of the practical example 5-1. The organic EL device was fabricated in the same manner as in the practical example 5-1 except that the target 5-3 was used.

The target 5-3 is composed of indium oxide, zinc oxide, and cerium oxide. The mole ratio of indium (In/(In+Zn)) is 0.9, the mole ratio of zinc (Zn/(In+Zn)) is 0.1, and the mole ratio of cerium to the total metal (Ce/(In+Zn+Ce)) is 0.15.

Incidentally, the work function of the anode layer was 5.95 eV in value. The electrode resistance was 2.6 kΩ. A direct-current voltage of 4.6 V was applied to across the electrodes of the obtained organic EL device as in the practical example 5-1, with the result that the current density was 2.0 mA/cm$^2$ in value and the luminescence intensity was 163 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-3 are also shown in Table 5-1.

Practical Example 5-4

A target 5-4 shown below was used instead of the target 5-1 of the practical example 5-1. As for the metal target, the APC target was used instead of the Al target. In other respects, the organic EL device was fabricated in the same manner as in the practical example 5-1.

The target 5-4 is composed of indium oxide, tin oxide, and samarium oxide. The mole ratio of indium (In/(In+Zn)) is 0.9, the mole ratio of tin (Sn/(In+Sn)) is 0.1, and the mole ratio of samarium to the total metal (Sm/(In+Zn+Sm)) is 0.18.

Incidentally, the work function of the anode layer was 5.90 eV in value. The electrode resistance was 2.3 kΩ. A direct-current voltage of 4.4 V was applied to across the electrodes of the obtained organic EL device as in the practical example 5-1, with the result that the current density was 2.0 mA/cm$^2$ in value and the luminescence intensity was 158 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-4 are also shown in Table 5-1.

"Table 5-2"

TABLE 5-2

|  | Practical embodiment 5-5 | Practical embodiment 5-6 | Practical embodiment 5-7 | Comparative example 5-1 |
|---|---|---|---|---|
| Material of anode layer (Auxiliary wiring) | IZO+ ACA | IZO+ APC | ITO+ ACA | IZO+ Al |
| Protective layer of metal oxide | In oxide/ Sn oxide/ Pr oxide | In oxide/ Sn oxide/ Nd oxide | In oxide/ Sn oxide/ Tb oxide | In oxide/ Sn oxide/ |
| Work function (eV) (after cleaning) | 5.84 | 5.82 | 5.95 | 5.25 |
| Light transmittance (%)* | 88 | 88 | 87 | 89 |
| Electrode resistance (kΩ) | 2.6 | 2.7 | 2.6 | 2.8 |
| Specific resistance of metal oxide thin film layer (Ωcm) | 10E + 6 | 10E + 6 | 10E + 7 | 10E − 4 |
| Hole transporting material | TBDB | TBDB | TBDB | TBDB |
| Thickness (nm) | 60 | 60 | 60 | 60 |
| Material of luminescent layer | DPVDPAN/ D1 | DPVDPAN/ D1 | DPVDPAN/ D1 | DPVDPAN/ D1 |
| Thickness (nm) | 40 | 40 | 40 | 40 |
| Material electron injection layer | Alq | Alq | Alq | Alq |
| Thickness (nm) | 20 | 20 | 20 | 20 |
| Material of cathode layer | Al/Li | Al/Li | Al/Li | Al/Li |
| Thickness (nm) | 200 | 200 | 200 | 200 |
| Voltage (V) | 4.5 | 4.5 | 4.6 | 5.2 |
| Luminescence intensity (cd/m$^2$) | 166 | 165 | 161 |  |
| Half life | 1000 hours or more | 1000 hours or more | 1000 hours or more |  |

*Transmittance: Glass reference

Practical Example 5-5

A target 5-5 shown below was used instead of the target 5-1 of the practical example 5-1. As for the metal target, the ACA target was used instead of the Al target. In other respects, the organic EL device was fabricated in the same manner as in the practical example 5-1.

The target 5-5 is composed of indium oxide, tin oxide, and praseodymium oxide. The mole ratio of indium (In/(In+Sn)) is 0.9, the mole ratio of tin (Sn/(In+Sn)) is 0.1, and the mole ratio of praseodymium to the total metal (Pr/(In+Sn+Pr)) is 0.20.

Incidentally, the work function of the anode layer was 5.84 eV in value. The electrode resistance was 2.6 kΩ. A direct-current voltage of 4.5 V was applied to across the electrodes of the obtained organic EL device as in the practical example 5-1, with the result that the current density was 2.0 mA/cm$^2$ in value and the luminescence intensity was 166 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-5 are shown in Table 5-2.

Practical Example 5-6

A target 5-6 shown below was used instead of the target 5-1 of the practical example 5-1. As for the metal target, the APC target was used instead of the Al target. In other respects, the organic EL device was fabricated in the same manner as in the practical example 5-1.

The target 5-6 is composed of indium oxide, tin oxide, and neodymium oxide. The mole ratio of indium (In/(In+Sn)) is 0.9, the mole ratio of tin (Sn/(In+Sn)) is 0.1, and the mole ratio of neodymium to the total metal (Nd/(In+Sn+Nd)) is 0.15.

Incidentally, the work function of the anode layer was 5.82 eV in value. The electrode resistance was 2.7 kΩ. A direct-current voltage of 4.5 V was applied to across the electrodes of the obtained organic EL device as in the practical example 5-1, with the result that the current density was 2.0 mA/cm$^2$ in value and the luminescence intensity was 1.65 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-6 are also shown in Table 5-2.

Practical Example 5-7

A target 7 shown below was used instead of the target 5-1 of the practical example 5-1. As for the metal target, the ACA target was used instead of the Al target. In other respects, the organic EL device was fabricated in the same manner as in the practical example 5-1.

The target 7 is composed of indium oxide, tin oxide, and terbium oxide. The mole ratio of indium (In/(In+Sn)) is 0.9, the mole ratio of tin (Sn/(In+Sn)) is 0.1, and the mole ratio of terbium to the total metal (Tb/(In+Sn+Tb)) is 0.16.

Incidentally, the work function of the anode layer was 5.95 eV in value. The electrode resistance was 2.6 kΩ. A direct-current voltage of 4.6 V was applied to across the electrodes of the obtained organic EL device as in the practical example 5-1, with the result that the current density was 2.0 mA/cm$^2$ in value and the luminescence intensity was 161 nit. The luminescent color was confirmed to be blue. Furthermore, for the sake of durability evaluation, constant-current driving was conducted at 10 mA/cm$^2$. No particular leak current was found even after a lapse of 1000 hours or more.

Incidentally, the results of the practical example 5-7 are also shown in Table 5-2.

Comparative Example 5-1

An organic EL device was fabricated as in the practical example 5-1 except that an IZO target was used instead of the target 5-1 of the practical example 5-1 and an Al target was used as the metal target.

Incidentally, the work function of the anode layer was 5.25 eV in value. A direct-current voltage of 5.2 V was applied to across the electrodes of the obtained organic EL device as in the practical example 5-1, with the result that the current density was 2.0 mA/cm$^2$ in value. The luminescent color was confirmed to be blue. Nevertheless, due to a current flowing between anode electrodes, single-pixel luminescence was impossible which precluded simple matrix driving.

Incidentally, the results of the comparative example 5-1 are also shown in Table 5-2.

Summary of the Group of Embodiments 5

As has been detailed above, by using the electrode substrate for an organic electroluminescence device of the present invention to constitute an organic EL light emitting apparatus, it has become possible to provide an organic EL light emitting apparatus which has excellent transparency and durability and exhibits high luminescence intensity even under a low driving voltage, comprising the anode layer and the like made of certain inorganic compounds. It was also confirmed that the anode layer and the like made of certain inorganic compounds had excellent etching properties.

Besides, according to the organic EL device of the present invention, it has become possible to provide an organic EL device effectively which has excellent transparency and durability and exhibits high luminescence intensity even under a low driving voltage.

The invention claimed is:

1. A metal oxide thin film comprising indium oxide; and at least one lanthanide metal oxide, wherein
   the at least one lanthanide metal oxide is 5% to 50% by atom in composition ratio with respect to the total amount of the metal atom of the thin film;
   the metal oxide thin film has a specific resistance in a range of from $10^4$ Ωcm to $10^8$ Ωcm; and
   the metal oxide thin film has a work function of 5.6 eV or higher.

2. The metal oxide thin film according to claim 1, wherein the metal oxide thin film further comprises at least one metal oxide selected from the group consisting of zinc oxides and tin oxides.

3. The metal oxide thin film according to claim 1, wherein the at least one lanthanide metal oxide is selected from the group consisting of cerium oxide, praseodymium oxide, neodymium oxide, samarium oxide and terbium oxide.

4. A method of making a metal oxide thin film, the method comprising sputter depositing the metal oxide thin film of claim 1.

5. A metal oxide thin film comprising indium oxide;
   at least one metal oxide selected from the group consisting of zinc oxides and tin oxides; and
   at least one lanthanide metal oxide, wherein
   the at least one lanthanide metal oxide is 5% to 50% by atom in composition ratio with respect to the total amount of the metal atom of the thin film;

the metal oxide thin film has a specific resistance in a range of from $10^4$ Ωcm to $10^8$ Ωcm; and the metal oxide thin film has a work function of 5.6 eV or higher.

6. The metal oxide thin film according to claim 5, wherein the at least one lanthanide metal oxide is selected from the group consisting of cerium oxide, praseodymium oxide, neodymium oxide, samarium oxide and terbium oxide.

7. A method of making a metal oxide thin film, the method comprising sputter depositing the metal oxide thin film of claim 5.

* * * * *